(12) United States Patent
Kato

(10) Patent No.: US 7,863,669 B2
(45) Date of Patent: Jan. 4, 2011

(54) NONVOLATILE SEMICONDUCTOR MEMORY DEVICE

(75) Inventor: Juri Kato, Chino (JP)

(73) Assignee: Seiko Epson Corporation, Tokyo (JP)

( * ) Notice: Subject to any disclaimer, the term of this patent is extended or adjusted under 35 U.S.C. 154(b) by 685 days.

(21) Appl. No.: 11/535,693

(22) Filed: Sep. 27, 2006

(65) Prior Publication Data
US 2007/0076482 A1 Apr. 5, 2007

(30) Foreign Application Priority Data

Oct. 3, 2005 (JP) ............................. 2005-289670
Oct. 7, 2005 (JP) ............................. 2005-295387
Jul. 6, 2006 (JP) ............................. 2006-186870

(51) Int. Cl.
H01L 29/788 (2006.01)

(52) U.S. Cl. .................... 257/315; 257/324; 257/E29.3

(58) Field of Classification Search ......... 257/314–316, 257/324, E29.3, E29.309
See application file for complete search history.

(56) References Cited

U.S. PATENT DOCUMENTS

| 6,248,626 | B1 | 6/2001 | Kumar et al. | |
| 6,445,032 | B1 | 9/2002 | Kumar et al. | |
| 6,794,250 | B2 | 9/2004 | Chang et al. | |
| 6,800,895 | B2 | 10/2004 | Chang et al. | |
| 7,057,234 | B2* | 6/2006 | Tiwari | 257/324 |
| 7,402,850 | B2* | 7/2008 | Bhattacharyya | 257/239 |
| 2004/0041208 | A1* | 3/2004 | Bhattacharyya | 257/347 |
| 2007/0064464 | A1* | 3/2007 | Kuo et al. | 365/100 |

FOREIGN PATENT DOCUMENTS

| JP | A-61-78169 | 4/1986 |
| JP | A-06-244384 | 9/1994 |
| JP | A-2000-003971 | 1/2000 |
| JP | A-2002-353342 | 12/2002 |
| JP | A-2003-324163 | 11/2003 |

OTHER PUBLICATIONS

T, Sakai et al., "Separation of Bonding Si Islands (SBSI) for LSI Applications," Meeting Abstract of Second International GiGe Technology and Device Meeting, May 2004, pp. 230-231.

* cited by examiner

Primary Examiner—Tuan N. Quach
(74) Attorney, Agent, or Firm—Oliff & Berridge PLC

(57) ABSTRACT

A nonvolatile semiconductor memory device includes a gate electrode provided on a channel region of a semiconductor layer and a floating gate provided on a back side of the semiconductor layer with a first insulating layer interposed therebetween.

9 Claims, 47 Drawing Sheets

NONVOLATILE SEMICONDUCTOR MEMORY DEVICE

BACKGROUND OF THE INVENTION

1. Technical Field

The present invention relates to a nonvolatile semiconductor memory device and a manufacturing method thereof. The present invention preferably applied to a nonvolatile semiconductor memory having a silicon-on-insulator (SOI) transistor and a floating gate that is formed on the back side of the SOI transistor.

2. Related Art

Some nonvolatile semiconductor memory devices have a control gate formed on the channel region through a floating gate for the purpose of electrical data writing/erasing. When writing of data is performed in the nonvolatile semiconductor memory device, a high voltage is applied to the control gate and electrons are injected into the floating gate through a tunnel effect. When data erasing is performed in the nonvolatile semiconductor memory device, a high voltage is applied to a substrate side and the electrons that are accumulated in the floating gate are drawn out to the substrate side through the tunnel effect.

*Separation by Bonding Si Islands (SBSI) for LSI Application* (T. Sakai et al.; Meeting Abstract of Second International GiGe Technology and Device Meeting; p. 230-231; May, 2004) is an example of related art. The example disclosed a method of forming a SOI transistor at a reduced cost by forming a SOI layer on a bulk substrate. According to the method described in the example, first, a Si/SiGe layer is formed on a Si substrate, and a cavity is formed between a Si substrate and the Si layer by exclusively removing the SiGe layer by utilizing a difference in the selectivity of Si and SiGe. Second, a $SiO_2$ layer is formed so as to be buried between the Si substrate and the Si layer by performing a thermal oxidation of the Si layer exposed in the cavity. In this way, a buried oxide (BOX) layer is formed between the Si substrate and the Si layer.

However, it is difficult to make the gate insulating film between the control gate electrode and the channel region thinner in such nonvolatile semiconductor memory device because the floating gate that is surrounded by an insulating film is formed on the channel region. Accordingly, a threshold value at the time of data reading in the nonvolatile semiconductor memory device increases and this decreases an operation capacity. This causes a problem that device cannot accept a high-speed data reading at a low voltage level. Furthermore, the driving voltage of a sense amplifier also increases and this hampers an effort to lower the driving voltage of an integrated circuit in which the nonvolatile semiconductor memory device is included.

Meanwhile, as studies to lower the driving voltage of a logic circuit adopting a fully depleted SOI transistor advances, the circuit that can be driven at the driving voltage smaller than 0.5 V has been developed and a low-power LSI has been already realized.

SUMMARY

An advantage of the invention is to provide a nonvolatile semiconductor memory device whose driving voltage and threshold value at the time of data reading can be lowered and in which electrical writing/erasing is possible at the lowered voltage, and a manufacturing method thereof.

A nonvolatile semiconductor memory device according to a first aspect of the invention includes a gate electrode provided on a channel region of a semiconductor layer and a floating gate provided on a back side of the semiconductor layer with a first insulating layer interposed therebetween.

According to the first aspect of the invention, it is possible to change a threshold value from the back side of the channel region by moving the electric charge accumulated in the floating gate and information can be read out according to a variation in the electric potential of the gate electrode at the time of on/off of the channel region. Thereby, there is no need to place the floating gate above the channel region where the gate electrode is formed and it is possible to make the thinner gate insulating film which is formed on the channel region and under the gate electrode. Accordingly, it is possible to lower the threshold value of the reading out in the nonvolatile semiconductor memory device. Consequently, the operation capacity of the nonvolatile semiconductor memory device can be improved and the nonvolatile semiconductor memory device can perform a high-speed data reading at a low voltage. Furthermore, it is also possible to lower the driving voltage of a sense amplifier. This means that it is possible to lower the driving voltage of the integrated circuit in which the nonvolatile semiconductor memory device is embedded.

In this case, the semiconductor layer may be made of a single crystal semiconductor and the floating gate may be made of a single crystal semiconductor or a polycrystalline semiconductor.

By depositing the semiconductor layer, it is possible to provide the floating gate under the channel region. In this way, the floating gate can be securely formed.

In this case, a control gate may be provided under the floating gate with a second insulating layer interposed therebetween.

In this way, electric charge can be injected into or drawn out from the floating gate through a tunnel effect or hot carriers by controlling the voltage applied to the control gate. Furthermore, it is possible to prevent that a high voltage is applied to the gate insulating film when the data writing or erasing is performed because there is no need to place the control gate on the channel region. Therefore, the gate insulating film can be made thinner. This makes it possible to lower the threshold voltage value of reading out and to perform the electric writing and erasing at the lowered voltage level.

In this case, the control gate may be made of a single crystal semiconductor.

By depositing the semiconductor layer, it is possible to provide the control gate under the channel region with the floating gate interposed therebetween. In this way, the control gate can be securely formed.

In this case, the control gate may include an electron injection layer that is made of an N-type impurity diffusion layer formed on the semiconductor substrate.

In this way, the manufacturing process will not become further complicated. In addition, it is possible to provide the control gate under the channel region and electric charge can be injected into the floating gate through hot carriers. Accordingly, the threshold voltage value and the driving voltage of reading out can be lowered and electric writing at the lowered voltage level is possible at the same time.

In this case, a word line coupled to the gate electrode may be provided so as to extend in parallel with the control gate through more than one memory cell.

In this way, even in the case where memory cells are arrayed in matrix, the memory cells provided in the same line can be selected by selecting the word line and the control gates. Thereby, it is possible to perform reading out, writing and erasing of the selected memory cell.

In this case, the nonvolatile semiconductor memory device may further include source/drain layers formed in the semiconductor layer so as to sandwich the channel and a bit line coupled to the source/drain layers and provided so as to orthogonally cross a word line that is coupled to the gate electrode.

In this way, even in the case where memory cells are arrayed in matrix, a desired row can be selected by the word line and the control gate, and a desired column can be selected by the bit line. Accordingly, a desired memory cell can be selected and it is possible to perform reading out, writing and erasing of the desired selected memory cell.

In this case, a driving voltage at the time when information stored in the floating gate is read out may be equal to or smaller than 1.5 V.

By providing the floating gate under the channel region of a fully depleted SOI transistor, the threshold value at the time of the reading out can be saturated around 0.5 V or smaller than 0.5 even when the amount of the electric charge injected into the floating gate is increased. Consequently, it is possible to realize a nonvolatile semiconductor memory device that can operate at a low driving voltage of 1.5 V or smaller than 1.5 V at the time of reading out.

According to a second aspect of the invention, a method of manufacturing a nonvolatile semiconductor memory device includes forming an N-type impurity introduction layer on a semiconductor substrate, forming a P-type impurity introduction layer on the N-type impurity introduction layer, forming a first semiconductor layer on the P-type impurity introduction layer, forming a second semiconductor layer on the first semiconductor layer, the second semiconductor layer having a smaller etching rate than an etching rate of the first semiconductor layer, forming a first exposing part that penetrates the first semiconductor layer, the second semiconductor layer, the P-type impurity introduction layer and the N-type impurity introduction layer and exposes the semiconductor substrate, forming a support member that supports the second semiconductor layer on the semiconductor substrate through the first exposing part, forming a second exposing part that exposes a part of the first semiconductor layer from the second semiconductor layer, forming a cavity under the second semiconductor layer by removing the first semiconductor layer by selectively etching the first semiconductor layer through the second exposing part, forming surface insulating films on top and bottom inner faces of the cavity, forming a buried conductive layer that fills the cavity and is sandwiched between the surface insulating films, forming a gate electrode on the second semiconductor layer, and forming source/drain layers that are respectively provided on the sides of the gate electrode in the second semiconductor layer.

According to the second aspect of the invention, even when the second semiconductor layer is deposited on the first semiconductor layer, an etching gas or an etching solution can contact with the first semiconductor layer through the second exposing part. Thereby, it is possible to remove the first semiconductor layer by utilizing a difference in the selectivity ratio between the first semiconductor layer and the second semiconductor layer while leaving the second semiconductor layer as it is. Moreover, by providing the support member that supports the second semiconductor layer on the semiconductor substrate, it is possible to prevent the second semiconductor layer from being dropped on the semiconductor substrate even though the cavity is formed under the second semiconductor layer. Accordingly, a chance of defect occurrences in the second semiconductor layer can be reduced and the second semiconductor layer can be placed on the buried insulating layer. Therefore, it is possible to insolate the second semiconductor layer from the semiconductor substrate without impairing the quality of the second semiconductor layer.

Furthermore, by providing the buried conductive layer that is formed in the cavity under the second semiconductor layer so as to be sandwiched between the surface insulating films, it is possible to place the floating gate under the channel region formed in the second semiconductor layer. In addition, by providing the N-type impurity introduction layer, the control gate can be placed under the floating gate.

As a result, it is possible to form a SOI transistor on the second semiconductor layer without using a SOI substrate. Furthermore, it is possible to control the amount of the electric charge accumulated in the floating gate without placing the floating gate on the channel region on which the gate electrode is formed. This makes it possible to change the voltage of the gate electrode at the time when the channel region is turned on/off. Consequently, it is possible to realize the nonvolatile semiconductor memory device that can perform the electric writing and erasing and in which the threshold voltage of the reading is lowered.

According to a third aspect of the invention, a method of manufacturing a nonvolatile semiconductor memory device includes forming an N-type impurity introduction layer on a semiconductor substrate, forming a P-type impurity introduction layer on the N-type impurity introduction layer, forming more than one layered structure on the P-type impurity introduction layer, the layered structure including a first semiconductor layer and a second semiconductor layer whose etching rate is smaller than an etching rate of the first semiconductor layer, the second semiconductor layer being provided over the first semiconductor layer, forming a first exposing part that penetrates the first semiconductor layer, the second semiconductor layer, the P-type impurity introduction layer and the N-type impurity introduction layer and exposes the semiconductor substrate, forming a support member that supports the second semiconductor layer on the semiconductor substrate, the support member that fills in the first exposing part, forming a second exposing part that exposes a part of the first semiconductor layer from the second semiconductor layer, forming a cavity by removing the first semiconductor layer by selectively etching the first semiconductor layer through the second exposing part, forming a buried insulating layer that fills the cavity, introducing a impurity into the second semiconductor layer that is a second layer of the second semiconductor layer from the top by performing ion implantation of the second layer of the second semiconductor layer, forming a gate electrode that is provided on a top layer of the second semiconductor layer, and forming source and drain layers on the top layer of the second semiconductor layer, and the source and drain layers respectively being provided on sides of the gate electrode.

According to the third aspect of the invention, it is possible to make the second semiconductor layer which is the second one from the top as the floating gate. At the same time, it is possible to form a SOI transistor in the second semiconductor layer which is the top one in the layered structure. Thereby, the floating gate can be provided on the back side of the second semiconductor layer in which the SOI transistor is formed. In addition, by forming the N-type impurity introduction layer on the semiconductor substrate, the control gate can be placed under the floating gate. Consequently, it is possible to control the amount of the electric charge accumulated in the floating gate without placing the floating gate on the channel region on which the gate electrode is formed. This makes it possible to change the voltage of the gate electrode at the time when the channel region is turned on/off. Consequently, it is possible to realize the nonvolatile semiconductor memory device that can perform the electric writing and erasing and in which the threshold voltage of the reading is lowered.

According to a fourth aspect of the invention, a method of manufacturing a nonvolatile semiconductor memory device includes forming a first semiconductor layer on a semiconductor substrate, forming a second semiconductor layer on the first semiconductor layer, the second semiconductor layer having a smaller etching rate than an etching rate of the first semiconductor layer, forming a third semiconductor layer on the second semiconductor layer, the third semiconductor layer having the same composition as a composition of the first semiconductor layer, forming a fourth semiconductor layer on the third semiconductor layer, the fourth semiconductor layer having the same composition as a composition of the second semiconductor layer, forming a fifth semiconductor layer on the fourth semiconductor layer, the fifth semiconductor layer having the same composition as the composition of the first semiconductor layer and the composition of the third semiconductor layer, forming a sixth semiconductor layer on the fifth semiconductor layer, the sixth semiconductor layer having the same composition as the composition of the second semiconductor layer and the composition of the fourth semiconductor layer, forming a first exposing part that penetrates the first through sixth semiconductor layers and exposes the semiconductor substrate, forming a support member in the first exposing part, the support member supporting the second, fourth and sixth semiconductor layers on the semiconductor substrate, forming a second exposing part that exposes at least a part of the first, third and fifth semiconductor layers in which the support member is formed from the second, fourth and sixth semiconductor layers, forming first, second and third cavities by respectively removing the first, third and fifth semiconductor layers by selectively etching the first, third and fifth semiconductor layers through the second exposing part, forming buried insulating layers that respectively fill the first, second and third cavities, forming a gate electrode that is provided on the sixth semiconductor layer, and forming source/drain layers in the sixth semiconductor layer, the source/drain layers respectively being provided on sides of the gate electrode.

According to the fourth aspect of the invention, it is possible to form the control gate, the floating gate and the SOI transistor respectively in the second, fourth and sixth semiconductor layers without using a SOI substrate. Furthermore, it is possible to control the amount of the electric charge accumulated in the floating gate without placing the floating gate on the channel region on which the gate electrode is formed. This makes it possible to change the voltage of the gate electrode at the time when the channel region is turned on/off. Consequently, it is possible to realize the nonvolatile semiconductor memory device that can perform the electric writing and erasing and in which the threshold voltage of the reading is lowered.

A nonvolatile semiconductor memory device according to a fifth aspect of the invention includes a gate electrode provided on a channel region of a semiconductor layer and a trap film provided on a back side of the semiconductor layer with a first insulating layer interposed therebetween.

According to the fifth aspect of the invention, it is possible to change a threshold value from the back side of the channel region by moving the electric charge accumulated in the trap film and information can be read out according to a variation in the electric potential of the gate electrode at the time of on/off of the channel region. Thereby, there is no need to place the trap film above the channel region where the gate electrode is formed and it is possible to make the thinner gate insulating film which is formed on the channel region and under the gate electrode. Accordingly, it is possible to lower the threshold value of the reading out in the nonvolatile semiconductor memory device. Consequently, the operation capacity of the nonvolatile semiconductor memory device can be improved and the nonvolatile semiconductor memory device can perform a high-speed data reading at a low voltage. Furthermore, it is also possible to lower the driving voltage of a sense amplifier. This means that it is possible to lower the driving voltage of the integrated circuit in which the nonvolatile semiconductor memory device is embedded.

In this case, a control gate may be further provided under the trap film with a second insulating layer interposed therebetween.

In this way, electric charge can be injected into or drawn out from the trap film through a tunnel effect or hot carriers by controlling the voltage applied to the control gate. Furthermore, it is possible to prevent that a high voltage is applied to the gate insulating film when the data writing or erasing is performed because there is no need to place the control gate on the channel region. Therefore, the gate insulating film can be made thinner. This makes it possible to lower the threshold voltage value of reading out and to perform the electric writing and erasing at the lowered voltage level.

In this case, the control gate may be made of a single crystal semiconductor,

By depositing the semiconductor layer, it is possible to provide the control gate under the channel region with the trap film interposed therebetween. In this way, the control gate can be securely formed.

In this case, the control gate may include an electron injection layer that is made of an N-type impurity diffusion layer formed on the semiconductor substrate.

In this way, the manufacturing process will not become further complicated. In addition, it is possible to provide the control gate under the channel region and electric charge can be injected into the trap film through hot carriers. Accordingly, the threshold voltage value and the driving voltage of reading out can be lowered and electric writing at the lowered voltage level is possible at the same time.

In this case, a word line coupled to the gate electrode may be provided so as to extend in parallel with the control gate through more than one memory cell.

In this way, even in the case where memory cells are arrayed in matrix, the memory cells provided in the same line can be selected by selecting the word line and the control gates. Thereby, it is possible to perform reading out, writing and erasing of the selected memory cell.

In this case, the nonvolatile semiconductor memory device may further include source/drain layers formed in the semiconductor layer so as to sandwich the channel and a bit line coupled to the source/drain layers and provided so as to orthogonally cross a word line that is coupled to the gate electrode.

In this way, even in the case where memory cells are arrayed in matrix, a desired row can be selected by the word line and the control gate, and a desired column can be selected by the bit line. Accordingly, a desired memory cell can be selected and it is possible to perform reading out, writing and erasing of the desired selected memory cell.

In this case, a driving voltage at the time when information stored in the trap film is read out may be equal to or smaller than 1.5 V.

By providing the trap film under the channel region of a fully depleted SOI transistor, the threshold value at the time of the reading out can be saturated around 0.5 V or smaller than 0.5 even when the amount of the electric charge injected into the trap film is increased. Consequently, it is possible to realize a nonvolatile semiconductor memory device that can operate at a low driving voltage of 1.5 V or smaller than 1.5 V at the time of reading out.

According to a sixth aspect of the invention, a method of manufacturing a nonvolatile semiconductor memory device includes forming an N-type impurity introduction layer on a semiconductor substrate, forming a P-type impurity introduction layer on the N-type impurity introduction layer, forming a first semiconductor layer on the P-type impurity introduction layer, forming a second semiconductor layer on the first semiconductor layer, the second semiconductor layer having a smaller etching rate than an etching rate of the first semiconductor layer, forming a first exposing part that penetrates the first semiconductor layer, the second semiconductor layer, the P-type impurity introduction layer and the N-type impurity introduction layer and exposes the semiconductor substrate, forming a support member that supports the second semiconductor layer on the semiconductor substrate through the first exposing part, forming a second exposing part that exposes a part of the first semiconductor layer from the second semiconductor layer, forming a cavity under the second semiconductor layer by removing the first semiconductor layer by selectively etching the first semiconductor layer through the second exposing part, forming surface insulating films on top and bottom inner faces of the cavity, forming a trap film that fills the cavity and is sandwiched between the surface insulating films, forming a gate electrode on the second semiconductor layer, and forming source/drain layers that are respectively provided on the sides of the gate electrode in the second semiconductor layer.

According to the sixth aspect of the invention, even when the second semiconductor layer is deposited on the first semiconductor layer, an etching gas or an etching solution can contact with the first semiconductor layer through the second exposing part. Thereby, it is possible to remove the first semiconductor layer by utilizing a difference in the selectivity ratio between the first semiconductor layer and the second semiconductor layer while leaving the second semiconductor layer as it is. Moreover, by providing the support member that supports the second semiconductor layer on the semiconductor substrate, it is possible to prevent the second semiconductor layer from being dropped on the semiconductor substrate even though the cavity is formed under the second semiconductor layer. Accordingly, a chance of defect occurrences in the second semiconductor layer can be reduced and the second semiconductor layer can be placed on the buried insulating layer. Therefore, it is possible to insolate the second semiconductor layer from the semiconductor substrate without impairing the quality of the second semiconductor layer.

Furthermore, by providing the trap film that is formed in the cavity under the second semiconductor layer so as to be sandwiched between the surface insulating films, it is possible to place the trap film under the channel region formed in the second semiconductor layer. In addition, by providing the N-type impurity introduction layer, the control gate can be placed under the trap film.

As a result, it is possible to form the SOI transistor on the second semiconductor layer without using a SOI substrate. Furthermore, it is possible to control the amount of the electric charge accumulated in the trap film without placing the trap film on the channel region on which the gate electrode is formed. This makes it possible to change the voltage of the gate electrode at the time when the channel region is turned on/off. Consequently, it is possible to realize the nonvolatile semiconductor memory device that can perform the electric writing and erasing and in which the threshold voltage of the reading is lowered.

According to a seventh aspect of the invention, a method of manufacturing a nonvolatile semiconductor memory device includes forming a first semiconductor layer on a semiconductor substrate, forming a second semiconductor layer on the first semiconductor layer, the second semiconductor layer having a smaller etching rate than an etching rate of the first semiconductor layer, forming a third semiconductor layer on the second semiconductor layer, the third semiconductor layer having the same composition as a composition of the first semiconductor layer, forming a fourth semiconductor layer on the third semiconductor layer, the fourth semiconductor layer having the same composition as a composition of the second semiconductor layer, forming a first exposing part that penetrates the first through fourth semiconductor layers and exposes the semiconductor substrate, forming a support member in the first exposing part, the support member supporting the second and fourth semiconductor layers on the semiconductor substrate, forming a second exposing part that exposes at least a part of the first and third semiconductor layers in which the support member is formed from the second and fourth semiconductor layers, forming first and second cavities by respectively removing the first and third semiconductor layers by selectively etching the first and third semiconductor layers through the second exposing part, forming surface insulating films respectively on top and bottom inner faces of the first and second cavities, forming trap films that respectively fill the first and second cavities through the surface insulating films, forming a gate electrode that is provided on the fourth semiconductor layer, and forming source/drain layers in the fourth semiconductor layer, the source/drain layers respectively being provided on sides of the gate electrode.

In this way, it is possible to form the control gate and the SOI transistor in the second and fourth semiconductor layers without using a SOI substrate. Accordingly, it is possible to control the amount of the electric charge accumulated in the trap film without placing the trap film on the channel region on which the gate electrode is formed. This makes it possible to change the voltage of the gate electrode at the time when the channel region is turned on/off. Consequently, it is possible to realize the nonvolatile semiconductor memory device that can perform the electric writing and erasing and in which the threshold voltage of the reading is lowered.

BRIEF DESCRIPTION OF THE DRAWINGS

The invention will be described with reference to the accompanying drawings, wherein like numbers reference like elements.

DESCRIPTION OF EXEMPLARY EMBODIMENTS

A nonvolatile semiconductor memory device and a manufacturing method thereof according to embodiments of the invention will be described with reference to the accompanying drawings.

First Embodiment

Figure 1A:
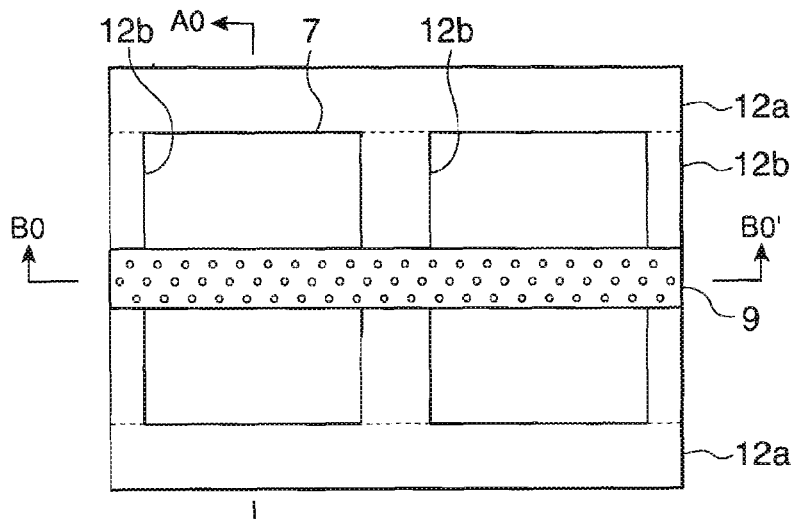
FIGS. 1A through 1C show a schematic structure of a nonvolatile semiconductor memory device according to a first embodiment of the invention.
Figure 1B:
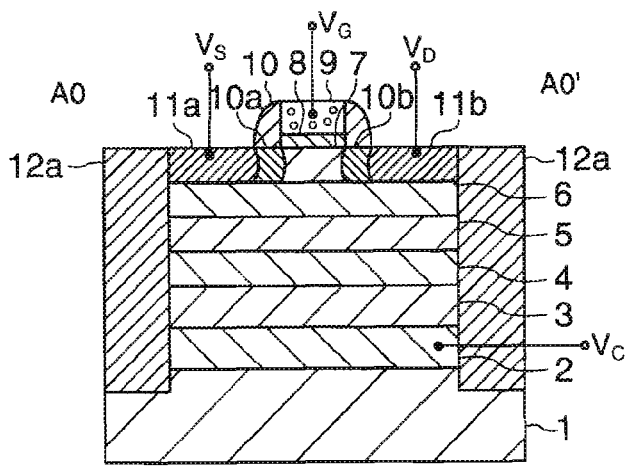
Figure 1C:
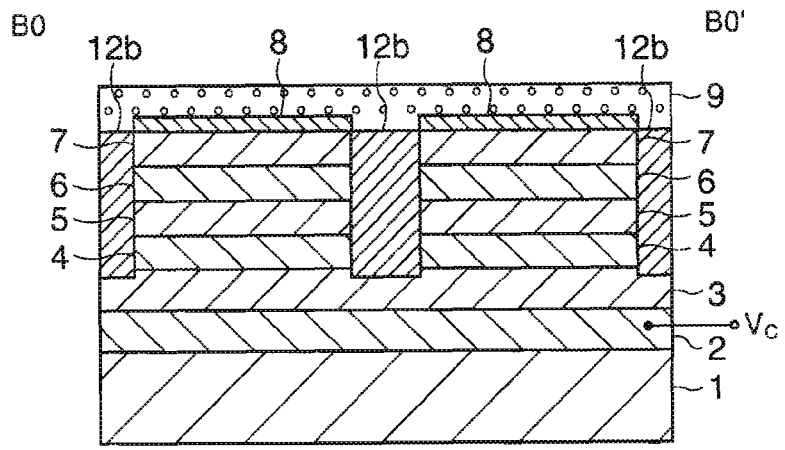

FIG. 1A is a plan view showing a schematic structure of a nonvolatile semiconductor memory device according to a first embodiment of the invention. FIG. 1B is a sectional view along the line A0-A0' in FIG. 1A. FIG. 1C is a sectional view along the line B0-B0' in FIG. 1A.

An electron injection layer 2 and an electron acceleration layer 3 are formed on a semiconductor substrate 1 in this order as shown in FIG. 1. A floating gate 5 is formed above the electron acceleration layer 3 with an insulating layer 4 interposed therebetween. A semiconductor layer 7 is formed above the floating gate 5 with an insulating layer 6 interposed therebetween. A gate electrode 9 is formed above the semiconductor layer 7 with a gate insulating film 8 interposed therebetween. A side wall 10 is formed on the side face of the gate electrode 9. In the semiconductor layer 7, a source layer 11a and a drain layer 11b which are arranged so as to sandwich the gate electrode 9 are formed so as to interpose LDD layers 10a, 10b therebetween.

The electron injection layer 2, the electron acceleration layer 3, the floating gate 5 and the semiconductor layer 7 are isolated by an isolation insulating film 12a in the direction in which the gate electrode 9 extends. The floating gate 5 and the semiconductor layer 7 are also isolated by an isolation insulating film 12b in the direction orthogonal to the direction in which the gate electrode 9 extends. Here, the electron injection layer 2, the electron acceleration layer 3 and the gate electrode may be arranged in parallel through more than one memory cell.

Single crystal semiconductor can be used for the semiconductor substrate 1, the electron injection layer 2, the electron acceleration layer 3 and the semiconductor layer 7. The floating gate 5 can be made of either the single crystal semiconductor or polycrystalline semiconductor. The semiconductor substrate 1, the electron injection layer 2, the electron acceleration layer 3 and the semiconductor layer 7 can be made of, for example, Si, Ge, SiGe, GaAs, InP, GaP, GaN, SiC and the like. The floating gate 5 can be made of a semiconductor such as Si, Ge, SiGe, GaAs, InP, GaP, GaN and SiC, a metal such as Al, Cu, W, Ti, TiN, Ta and TaN, and an alloy such as silicide and others. The electron injection layer 2 can be a high-concentration N-type impurity diffusion layer and the electron acceleration layer 3 can be a low-concentration P-type impurity diffusion layer.

When data writing is performed, a voltage $V_G$ that is applied to the gate electrode 9, a voltage $V_S$ that is applied to the source layer 11a and a voltage $V_D$ that is applied to the drain layer 11b are all set to a high voltage $V_P$. At the same time, a voltage $V_C$ that is applied to the electron injection layer 2 is set to 0 V. Such high voltage $V_P$ of the data writing can be set to any voltage value within a range of 5-20 V.

Consequently, a high electric field is formed between the electron injection layer 2 and the floating gate 5 in the direction toward the floating gate 5 from the electron injection layer 2. Accordingly, electrons released from the electron injection layer 2 are accelerated in the electron acceleration layer 3 and then injected into the floating gate 5 through the insulating layer 4. After the electrons are injected into the floating gate 5, the electrons are retained by the floating gate 5 because the peripheral of the floating gate 5 is covered with the insulating layer. As a result, a threshold value of the channel region which is formed in the semiconductor layer 7 under the gate electrode 9 changes toward a positive value direction.

When data erasing is performed, the voltage $V_G$ that is applied to the gate electrode 9, the voltage $V_S$ that is applied to the source layer 11a and the voltage $V_D$ that is applied to the drain layer 11b are all set to 0 V. At the same time, the voltage $V_C$ that is applied to the electron injection layer 2 is set to a high voltage $V_E$. Such high voltage $V_E$ of the data erasing can be, for example, set to any value within a range of 5-20 V.

Consequently, a high electric field is formed between the electron injection layer 2 and the floating gate 5 in the direction toward the electron injection layer 2 from the floating gate 5. Accordingly, the electrons accumulated in the floating gate 5 are drawn into the electron injection layer 2 through the electron acceleration layer 3. As a result of the drawing out of the electrons from the floating gate 5, the threshold value of the channel region which is formed in the semiconductor layer 7 under the gate electrode 9 changes toward a negative value direction.

When some information is stored in the nonvolatile semiconductor memory device shown in FIG. 1, for example, the threshold value which is equal to or larger than 0.2 V at the time of reading out can correspond to a logical value "0", and the threshold value which is equal to or smaller than −1.2 V at the time of the reading out can correspond to a logical value "1".

When the data reading is performed, the voltage $V_G$ that is applied to the gate electrode 9 is set to 0 V. And the voltage $V_S$ that is applied to the source layer 11a and the voltage $V_D$ that is applied to the drain layer 11b are set to 1 V or smaller than 1 V. At the same time, the voltage $V_C$ that is applied to the electron injection layer 2 is set to 0 V.

In case where the logical value "0" is stored in the nonvolatile semiconductor memory device at that point, the channel region under the gate electrode 9 is turned off since the threshold value of the reading out is equal to or larger than 0.2 V. Consequently, the source layer 11a becomes unconductive with the drain layer 11b. On the other hand, in case where the logical value "1" is stored in the nonvolatile semiconductor memory device at that point, the channel region under the gate electrode 9 is turned on since the threshold value of the data reading is equal to or smaller than −1.2 V. Consequently, the source layer 11a becomes conductive with the drain layer 11b.

In the above-described way, it is possible to change the threshold value from the back side of the channel region by moving the electric charge accumulated in the floating gate 5 and the information can be read out according to a variation in the electric potential (threshold value) of the gate electrode 9 at the time of on/off of the channel region. Therefore, there is no need to place the floating gate 5 above the channel region where the gate electrode 9 is formed and it is possible to make the thinner gate insulating film 8 which is formed on the channel region and under the gate electrode 9. Accordingly, it is possible to lower the threshold value of the reading out in the nonvolatile semiconductor memory device. Consequently, the operation capacity of the nonvolatile semiconductor memory device can be improved and the nonvolatile semiconductor memory device can perform a high-speed data reading at a low voltage. Furthermore, it is also possible to lower the driving voltage of a sense amplifier. This means that it is possible to lower the driving voltage of the integrated circuit in which the nonvolatile semiconductor memory device is embedded.

Moreover, electric charge can be injected into or drawn out from the floating gate 5 through the tunnel effect or hot carriers by controlling the voltage applied to the electron injection layer 2. Furthermore, according to the embodiment, it is possible to prevent that a high voltage is applied to the gate insulating film 8 when the data writing or erasing is performed because there is no need to place the electron injection layer 2 on the channel region. Therefore, the gate insulating film 8 can be made thinner. This makes it possible to lower the threshold voltage value of the data reading and to perform the electric writing and erasing at the lowered voltage level.

According to the embodiment, the floating gate 5 is placed under the channel region that is formed in the semiconductor layer 7 under the gate electrode 9. Therefore, even when the amount of the electric charge that is injected into the floating gate 5 is increased, the threshold value at the time of the reading is saturated so that it hardly changes. For example, if the gate electrode 9 is formed of a N-type polycrystalline silicon, the gate length is 0.2 μm, the film thickness of the gate insulating film 8 is 6 nm in $SiO_2$ equivalent, the film thickness of the semiconductor layer 7 is 30 nm, the impurity concentration is $1 \times 10^{17}$ cm$^{-3}$ and the film thickness of the insulating layer 6 is 20 nm in $SiO_2$ equivalent, the threshold value at the time of the reading out can be saturated around 0.5 V or smaller than 0.5 even when the amount of the electric charge injected into the floating gate 5 is increased. Consequently, it is possible to realize a nonvolatile semiconductor memory device that can operate at a low driving voltage of 1.5 V or smaller than 1.5 V at the time of read out., Meanwhile, even though the amount of the electric charge accumulated in the floating gate 5 is same, the variation in the threshold value at the gate electrode 9 changes depending on the gate length of the gate electrode 9, the film thickness of the gate insulating film 8, the film thickness of the semiconductor layer 7 and the film thickness of the insulating layer 6. In other words, the variation in the threshold value when the electric charge is accumulated in the floating gate 5 becomes larger as the gate length of the gate electrode 9 gets longer, the film thickness of the gate insulating film 8 gets thicker and the film thickness of the semiconductor layer 7 and the insulating layer 6 become thinner.

However, even in the device in which the gate electrode 9 is formed of the N-type polycrystalline silicon, the gate length is about 0.2 μm, the film thickness of the gate insulating film 8 is about 1 nm in $SiO_2$ equivalent, the film thickness of the semiconductor layer 7 is about 5 nm and the film thickness of the insulating layer 6 is about 10 nm in $SiO_2$ equivalent, a drain current Id will be about $1 \times 10^{-4}$ A/μm when no electric charge is accumulated in the floating gate 5 as long as the impurity concentration in a body area of the semiconductor layer 7 is $1 \times 10^{17}$ cm$^{-3}$, and as long as the voltage between the source and the drain is 1 V even though the voltage $V_G$ that is applied to the gate electrode 9 is 0 V. When electric charge is accumulated in the floating gate 5, the drain current Id will be about $1 \times 10^{-12}$ A/μm if the voltage $V_G$ that is applied to the gate electrode 9 is 0 V and the voltage between the source and the drain is 1 V. This means that a leak current at the time of OFF decreases by eight digits.

In this case, it is also possible to saturate the threshold value of the read out around 0.2-0.4 V even when the amount of the electric charge injected into the floating gate 5 is increased. Consequently, it is possible to realize the nonvolatile semiconductor memory device that can operate at the low driving voltage of 1.5 V or smaller than 1.5 V at the time of the read out. Though the gate length is 0.2 μm in the above-described embodiment, the gate length can be shorter than 0.2 μm and the device having such shorter gate length can obtain the same advantageous effect.

For example, in a case where the gate electrode 9 is formed of the N-type polycrystalline silicon and the gate length is as short as 30 nm, in the device in which the film thickness of the gate insulating film 8 is about 1 nm in $SiO_2$ equivalent, the film thickness of the semiconductor layer 7 is about 5 nm, the film thickness of the insulating layer 6 is about 10 nm in $SiO_2$ equivalent and the impurity concentration in the body area of the semiconductor layer 7 is $1 \times 10^{17}$ cm$^{-3}$, the drain current Id will be about $1 \times 10^{-4}$ A/μm when no electric charge is accumulated in the floating gate 5 as long as the voltage between the source and the drain is 1 V or above even though the voltage $V_G$ that is applied to the gate electrode 9 is 0 V. When electric charge is accumulated in the floating gate 5, the drain current Id will be about $1 \times 10^{-11}$ A/μm if the voltage $V_G$ that is applied to the gate electrode 9 is 0 V and the voltage between the source and the drain is 1 V. This means that the leak current at the time of OFF decreases by about seven digits.

Second Embodiment

Figure 2:
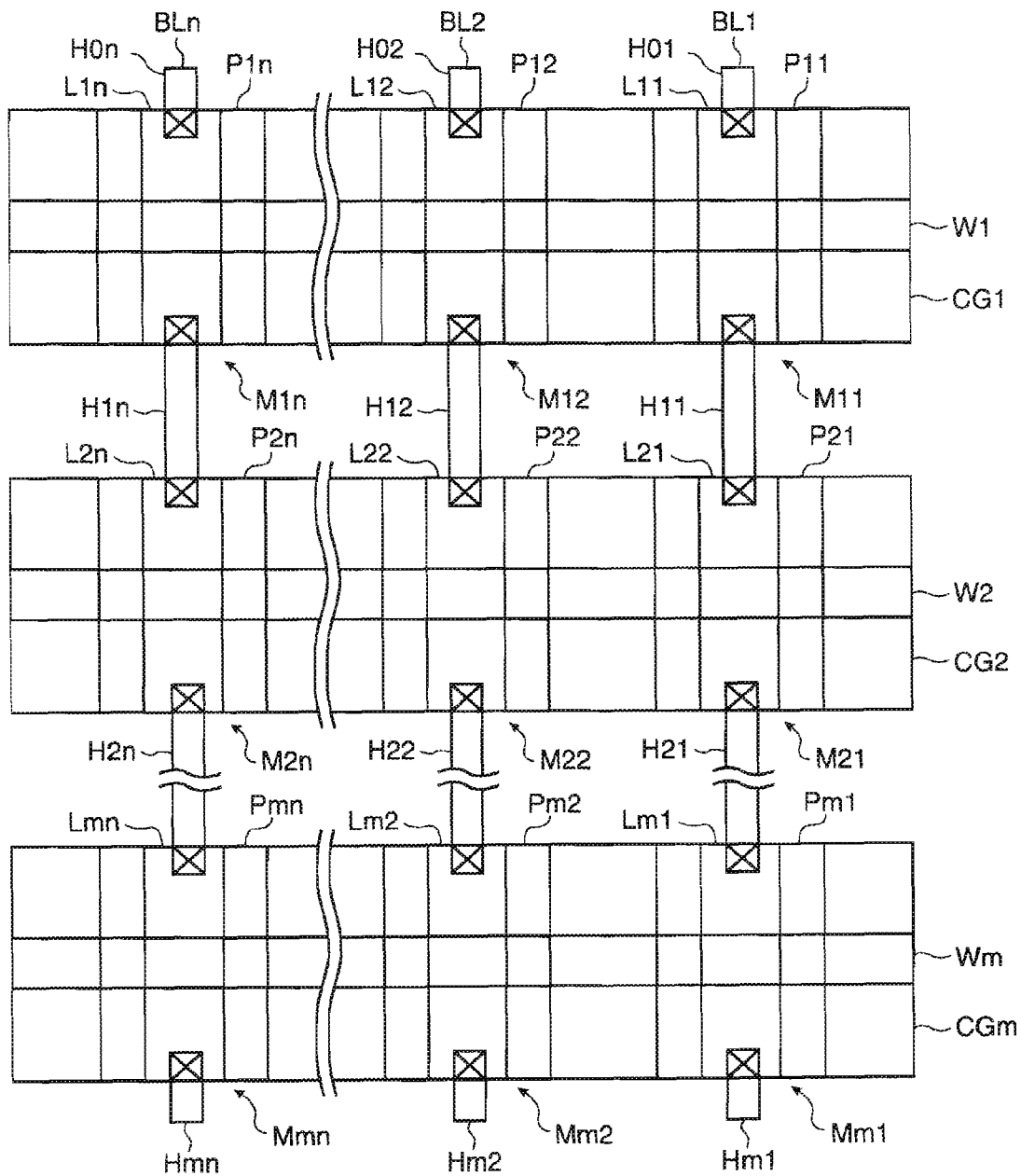
FIG. 2 is a plan view showing a layout of a nonvolatile semiconductor memory device according to a second embodiment of the invention.

FIG. 2 is a plan view showing a layout example of a nonvolatile semiconductor memory device according to a second embodiment of the invention.

Memory cells M11-M1n, . . . , Mm1-Mmn are arrayed in matrix as shown in FIG. 2. Each of the memory cells M11-M1n, . . . , Mm1-Mmn can have the structure shown in FIG. 1. The memory cells M11-M1n, . . . , Mm1-Mmn respectively have floating gates P11-P1n, . . . , Pm1-Pmn and semiconductor layers L11-L1n, . . . , Lm1-Lmn that are correspondingly placed on the floating gates P11-P1n, . . . , Pm1-Pmn. A word line W1 is formed so as to extend across the semiconductor layers L11, L12, . . . , L1n. A word line W2 is formed so as to extend across the semiconductor layers L21, L22, . . . , L12n and a word line Wm is formed so as to extend across the semiconductor layers Lm1, Lm2, . . . , Lmn.

A bit line BL1 is formed by coupling the semiconductor layers L11-Lm1 respectively through wiring layers H01-Hm1. A bit line BL2 is formed by coupling the semiconductor layers L12-Lm2 respectively through wiring layers H02-Hm2 and a bit line BLn is formed by coupling the semiconductor layers L1n-Lmn through wiring layers H0n-Hmn.

A control gate CG1 is formed by coupling the floating gates P11-Pm1 respectively through field plates D01-Dm1. A control gate CG2 is formed by coupling the floating gates P12-Pm2 respectively through field plates D02-Dm2 and a control gate CGn is formed by coupling the floating gates P1n-Pmn through field plates D0n-Dmn.

An electron injection layer CG1 (hereinafter called "control gate CG1") that serves as the control gate is formed so as to extend under the floating gates P11, P12, . . . , P1n. An electron injection layer CG2 (hereinafter called "control gate CG2") that serves as the control gate is formed so as to extend under the floating gates P21, P22, . . . , P2n and an electron injection layer CGm (hereinafter called "control gate CGm") that serves as the control gate is formed so as to extend under the floating gates Pm1, Pm2, . . . , Pmn.

Figure 3:
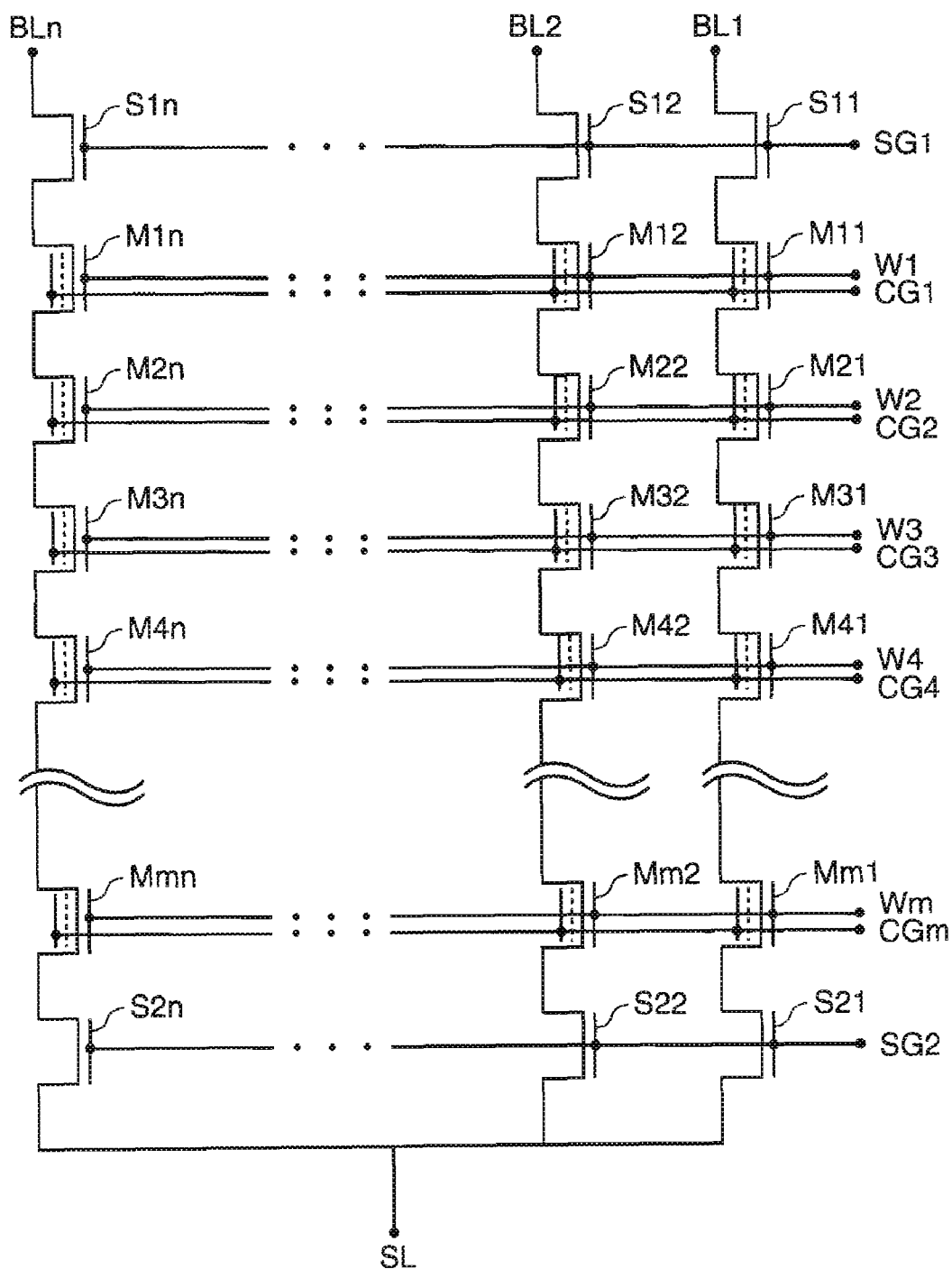
FIG. 3 shows a circuit configuration of the nonvolatile semiconductor memory device shown in FIG. 2.
Figure 4A:
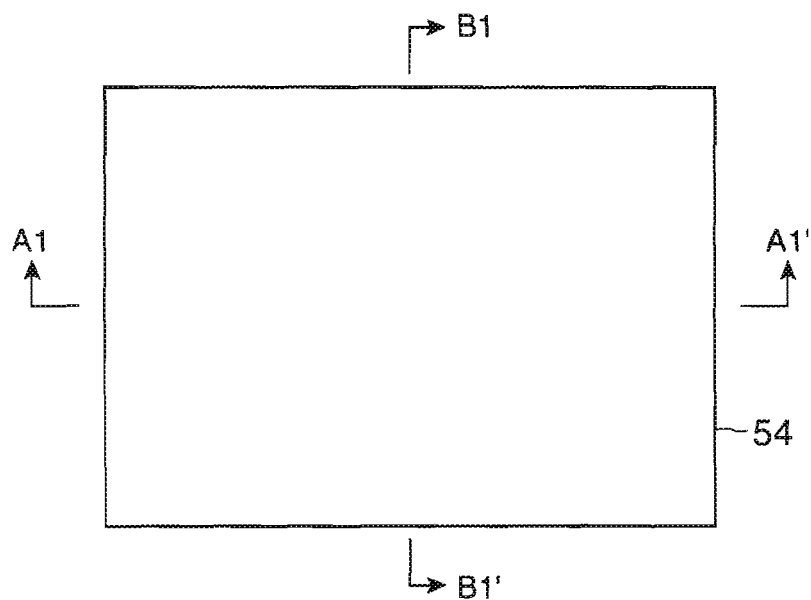
FIGS. 4A through 4C show a method of manufacturing a nonvolatile semiconductor memory device according to a third embodiment of the invention.
Figure 4B:
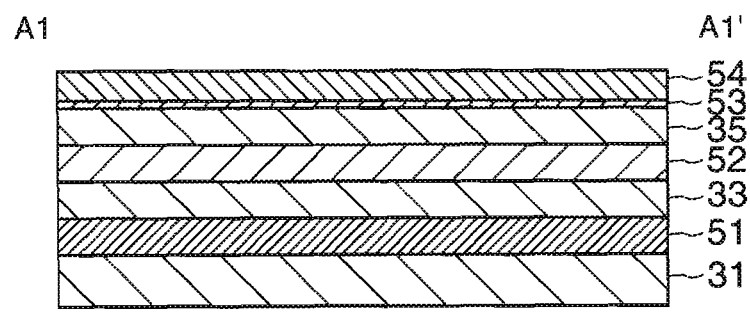
Figure 4C:
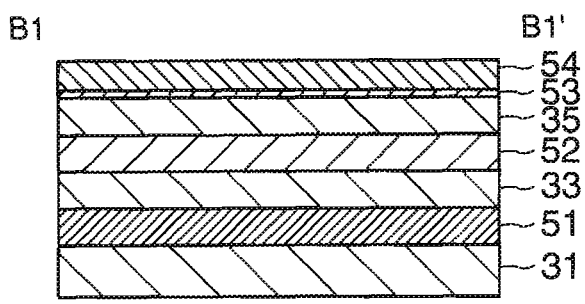

FIG. 3 shows a circuit configuration of the nonvolatile semiconductor memory device shown in FIG. 2.

As shown in FIG. 3, the memory cells M11-Mm1 are coupled each other on the bit line BL1, a selection transistor S11 is coupled in the front row and in the column of the memory cells M11-Mm1 and a selection transistor S21 is coupled in the last row and in the column of the memory cells M11-Mm1. The memory cells M12-Mm2 are coupled each other on the bit line BL2, a selection transistor S12 is coupled in the front row and in the column of the memory cells M12-Mm2 and a selection transistor S22 is coupled in the last row and in the column of the memory cells M12-Mm2. The memory cells M1n-Mmn are coupled each other on the bit line BLn, a selection transistor S1n is coupled in the front row and in the column of the memory cells M1n-Mmn and a selection transistor S2n is coupled in the last row and in the column of the memory cells M1n-Mmn. Sources of the selection transistors S21-S2n are commonly coupled to a source line SL. A selection gate SG1 is commonly provided on the selection transistors S11-S1n, and a selection gate SG2 is commonly provided on the selection transistors S21-S2n. The word line W1 and the control gate CG1 are commonly provided on the memory cells M11-M1n. The word line W2 and the control gate CG2 are commonly provided on the memory cells M21-M2n. The word line Wm and the control gate CGm are commonly provided on the memory cells Mm1-Mmn.

When data is written into selected memory cells M11-Mmn, for example, the high voltage $V_P$ is supplied to the word lines W1-Wm and the bit lines BL1-BLn that are coupled to the selected memory cells M11-Mmn, and 0 V is applied to the control gates CG1-CGm. At the same time, $½V_P$ is supplied to the word lines W1-Wm, the bit lines BL1-BLn and the control gates CG1-CGm that are coupled to the unselected memory cells M11-Mmn.

Consequently, a high electric field is formed between the control gates CG1-CGm of the selected memory cells M11-Mmn and the floating gates P1'-Pmn of the selected memory cells M11-Mmn in the direction toward the floating gates P11-Pmn from the control gates CG1-CGm. The electrons released from the control gates CG1-CGm of the selected memory cells M11-Mmn are then injected into the floating gates P11-Pmn through the insulating layer 4. When the electrons are injected into the floating gates P11-Pmn of the selected memory cells M11-Mmn, the electrons are retained by the floating gates P11-Pmn. This sets the threshold value of the channel region that are formed in the semiconductor layer 7 under the word lines W1-Wm to the saturated threshold value (for example, 0.2 V) and it is possible to store the logical value "0" in the selected memory cells M11-Mmn.

On the other hand, the high electric field is not formed between the control gates CG1-CGm of the unselected memory cells M11-Mmn and the floating gates P11-Pmn of the unselected memory cells M11-Mmn. Accordingly, electrons are not injected into the floating gates P11-Pmn of the unselected memory cells M11-Mmn and the amount of the electric charge accumulated in the floating gates P11-Pmn of the unselected memory cells M11-Mmn remains unchanged.

The voltage applied to the word lines W1-Wm coupled to the unselected memory cells M11-Mmn can be set according to the withstands voltage of the bit lines BL1-BLn coupled to the selected memory cells M11-Mmn with reference to the word lines W1-Wm. The value of such voltage can be adjusted within the range of, for example, $½V_p$-$⅘V_p$. The voltage applied to the word lines W1-Wm coupled to the selected memory cells M11-Mmn can be set according to the withstands voltage of the bit lines BL1-BLn coupled to the unselected memory cells M11-Mmn with reference to the word lines W1-Wm. The value of such voltage can be adjusted within the range of, for example, $½V_p$-$V_p$.

When erasing is performed, 0 V is applied to the all the word lines W1-Wm and the bit lines BL1-BLn of all the memory cells M11-Mmn, and the high voltage $V_E$ is applied to the control gates CG1-CGm.

Consequently, a high electric field is formed between all the control gates CG1-CGm of all the memory cells M11-Mmn and all the floating gates P11-Pmn of all the memory cells M11-Mmn in the direction toward the control gates CG1-CGm from the floating gates P11-Pmn. The electrons accumulated in the floating gates P11-Pmn are drawn into the control gates CG1-CGm. When the electrons have been drawn our from the floating gates P11-Pmn, the threshold value of the channel regions that are formed in the semiconductor layer 7 under all the word lines W1-Wmn of all the memory cells M11-Mmn is set to −1.2 V or smaller than −1.2 V. In this way, it is possible to store the logical value "1".

When data is read out from selected memory cells M11-Mmn, 0 V is applied to the word lines W1-Wm coupled to the selected memory cells M11-Mmn, 0 V is also applied to the control gates CG1-CGm, and 1 V is applied to the bit lines BL1-BLn coupled to the selected memory cells M11-Mmn. At the same time, a voltage of 1.5 V which is higher than the threshold value of the logical value "0" is applied to the word lines W1-Wm that are coupled to the unselected memory cells M11-Mmn, and 0 V is applied to the control gates CG1-CGm and the bit lines BL1-BLn coupled to the unselected memory cells M11-Mmn.

In case where the logical value "0" is stored in the selected memory cells M11-Mmn, the channel regions under the word lines W1-Wm are turned off because the threshold value of the read out is 0.2 V. Accordingly, the selected memory cells M11-Mmn become unconductive. On the other hand, the channel regions in the unselected memory cells M11-Mmn are ON-state irrespective of the values stored in the unselected memory cells M11-Mmn because 1.5 V is applied to the word lines W1-Wm coupled to the unselected memory cells M11-Mmn. Consequently, the unconductive states of the selected memory cells M11-Mmn can be read out through the bit lines BL1-BLn.

In case where the logical value "1" is stored in the nonvolatile semiconductor memory device, the channel region under the word lines W1-Wm are turned on because the threshold value of the read out is −1.2 V or smaller than −1.2 V. Accordingly, the selected memory cells M11-Mmn become conductive. On the other hand, the channel regions in the unselected memory cells M11-Mmn are ON-state irrespective of the values stored in the unselected memory cells M11-Mmn because 1.5 V is applied to the word lines W1-Wm coupled to the unselected memory cells M11-Mmn. Consequently, the conductive states of the selected memory cells M11-Mmn can be read out through the bit lines BL1-BLn.

In this way, it is possible to form a NAND type flash memory in which the floating gates P11-Pmn are placed respectively under channel regions. In such flash memory, data is read out by setting the voltage of the bit lines BL1-BLn of the selected memory cells M11-Mmn to 1.0 V, setting the voltage of the word lines W1-Wm of the selected memory cells to 0 V, setting the voltage of the bit lines BL1-BLn of the unselected memory cells M11-Mmn to 0 V and setting the voltage of the word lines W1-Wm of the unselected memory cells to 1.5 V. Therefore, it is possible to lower the driving voltage at the time of the read out in the nonvolatile semiconductor memory device.

Third Embodiment

FIGS. 4A through 14A are plan views showing a method of manufacturing a nonvolatile semiconductor memory device according to a third embodiment of the invention. FIGS. 4B through 14B are sectional views along the line A1-A1' through A11-A11' correspondingly shown in FIGS. 4A through 14A. FIGS. 4C through 14C are sectional views along the line B1-B1' through B11-B11' correspondingly shown in FIGS. 4A through 14A.

An electron injection layer 51 that is a high-concentration N-type impurity diffusion layer is formed in a semiconductor substrate 31 by performing ion implantation which implants an N-type impurity such as P and As into the semiconductor substrate 31 as shown in FIG. 4. An electron acceleration layer 33 that is a low-concentration P-type impurity diffusion layer is formed on the electron injection layer 51 by performing ion implantation which implants a P-type impurity such as B and $BF_2$ into the semiconductor substrate 31. Alternatively, the electron injection layer 51 may be formed by epitaxial growth of a semiconductor layer in which the N-type impurity is doped on the semiconductor substrate 31. The electron acceleration layer 33 may be formed by epitaxial growth of a semiconductor layer in which the P-type impurity is doped on the electron injection layer 51.

A semiconductor layer 52 and a semiconductor layer 35 are then sequentially grown on the electron acceleration layer 33 by epitaxy. The semiconductor layer 52 can be made of a material that has a larger etching rate than those of the semiconductor substrate 31 and the semiconductor layer 35. Particularly, in case where the semiconductor substrate 31 is made of Si, it is preferable that the semiconductor layer 52 be made of SiGe and the semiconductor layer 35 be made of Si. In this way, the lattice matching between the semiconductor layer 52 and the semiconductor layer 35 is possible and it is also possible to secure the selectivity between the semiconductor layer 52 and the semiconductor layer 35. Film thickness of the semiconductor layers 52, 35 can be, for example, about 1-100 nm.

Next, a base oxide film 53 is formed on the surface of the semiconductor layer 35 by oxidation of the semiconductor layer 35 or a chemical vapor deposition (CVD) method. Subsequently, an antioxidant film 54 is formed on the whole face of the base oxide film 53 by the CVD method and the like. For example, a silicon nitride film can be used as the antioxidant film 54.

Figure 5A:
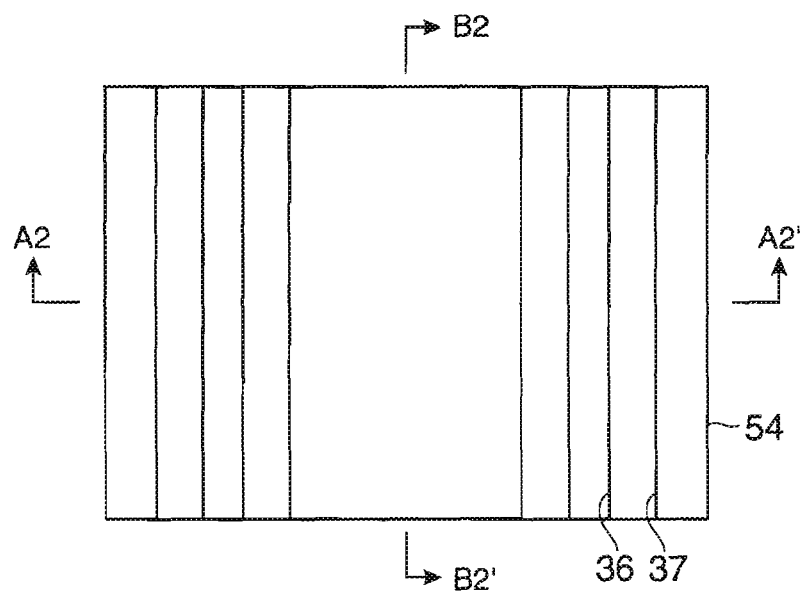
FIGS. 5A through 5C show the method of manufacturing a nonvolatile semiconductor memory device according to the third embodiment.
Figure 5B:
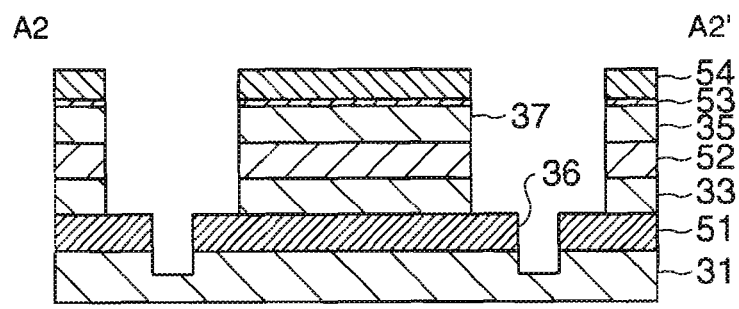
Figure 5C:
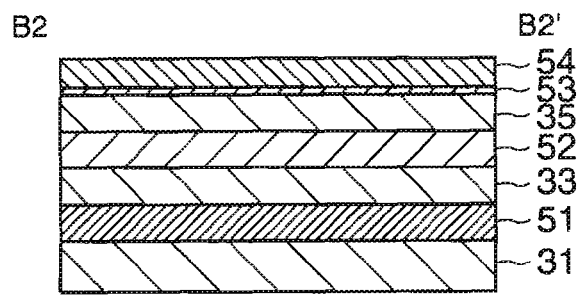

Next, as shown in FIG. 5, a groove 36 that exposes the semiconductor substrate 31 is formed in a predetermined direction by patterning the antioxidant film 54, the base oxide film 53, the semiconductor layers 35, 52, the electron acceleration layer 33, the electron injection layer 51 and the semiconductor substrate 31 with a photolithography technique or an etching technique. When the semiconductor substrate 31 is to be exposed, a concave portion is preferably formed in the semiconductor substrate 31 by over-etching the semiconductor substrate 31. The position of the groove 36 may correspond to a part of an isolation area of the semiconductor layer 35.

Furthermore, a groove 37 that exposes the electron injection layer 51 and has a larger width than that of the groove 36 is formed so as to overlap the groove 36 by patterning the antioxidant film 54, the base oxide film 53, the semiconductor layers 35, 52 and the electron acceleration layer 33 by a photolithography technique or an etching technique. The position of the groove 37 may correspond to a part of an isolation area of the semiconductor layer 35.

Figure 6A:
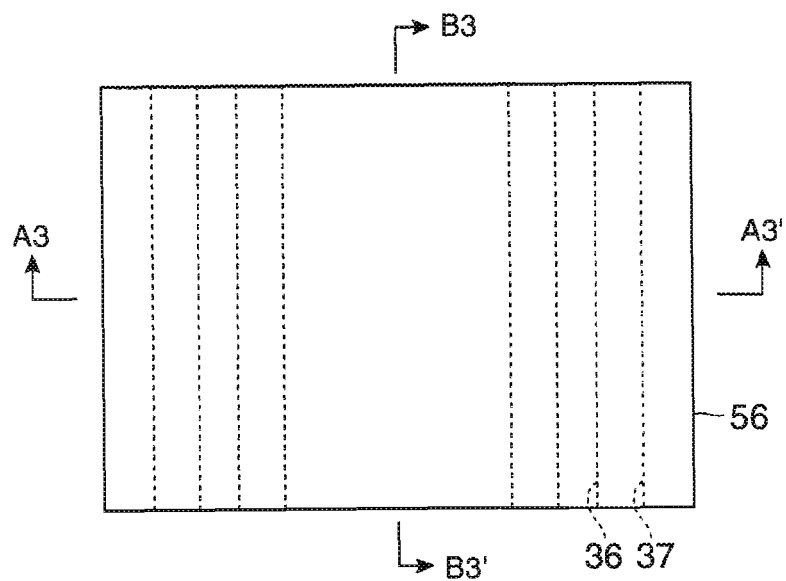
FIGS. 6A through 6C show the method of manufacturing a nonvolatile semiconductor memory device according to the third embodiment.
Figure 6B:
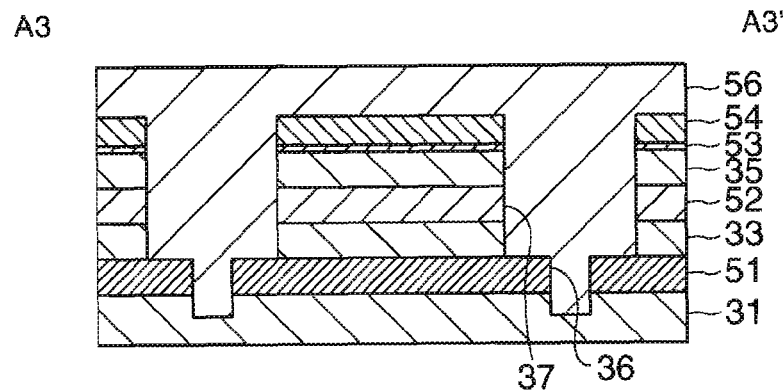
Figure 6C:
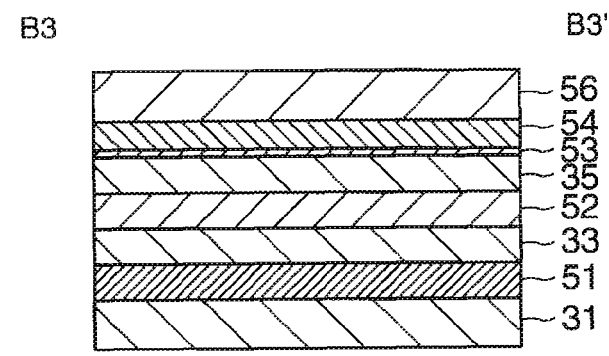

A support member 56 that is buried in the grooves 36, 37 and supports the semiconductor layer 35 on the semiconductor substrate 31 is formed on the whole surface of the semiconductor substrate 31 as shown in FIG. 6. A silicon oxide film can be used for the support member 56.

Figure 7A:
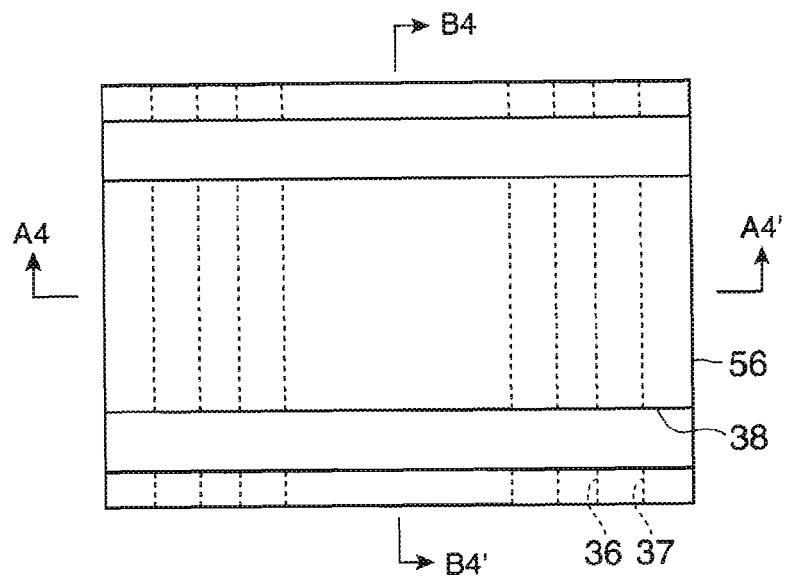
FIGS. 7A through 7C show the method of manufacturing a nonvolatile semiconductor memory device according to the third embodiment.
Figure 7B:
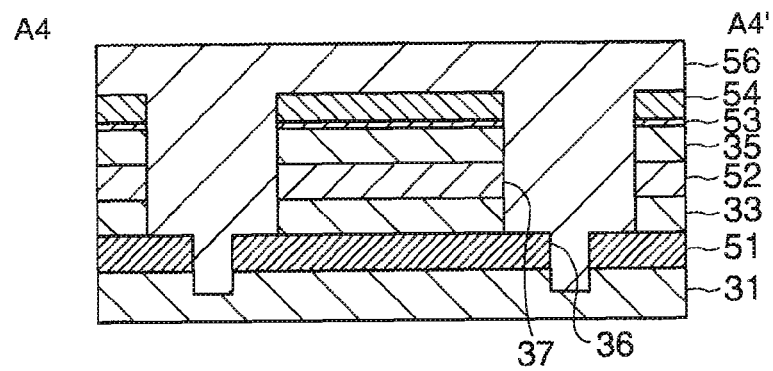
Figure 7C:
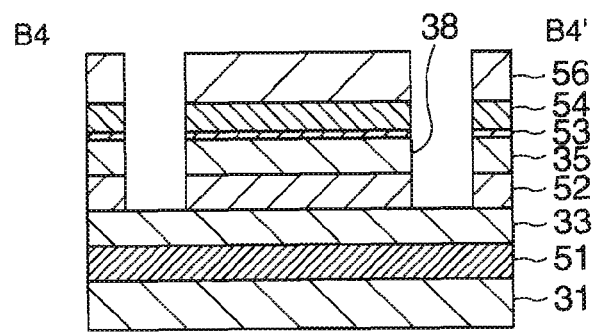

Subsequently, as shown in FIG. 7, a groove 38 that exposes the electron acceleration layer 33 is formed in the direction orthogonal to the groove 36 by patterning the antioxidant film 54, the base oxide film 53 and the semiconductor layers 35, 52 by a photolithography technique or an etching technique. The position of the groove 38 may correspond to a part of the isolation area of the semiconductor layer 35.

Figure 8A:
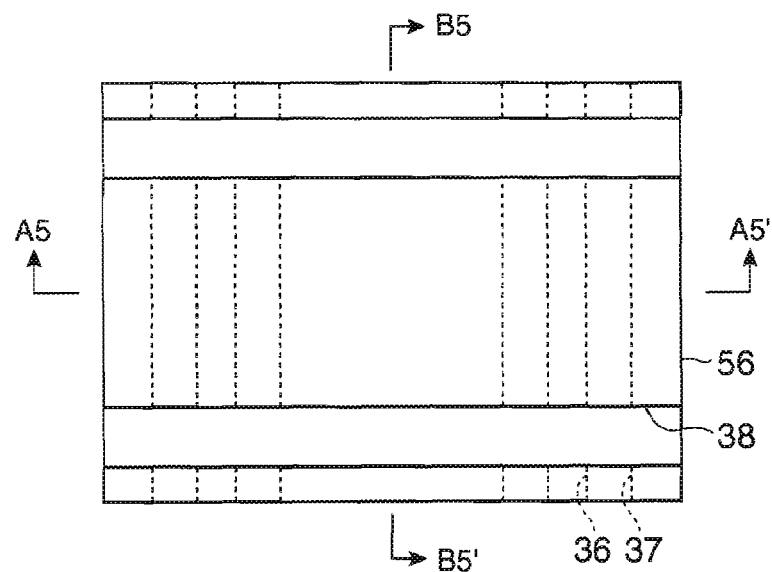
FIGS. 8A through 8C show the method of manufacturing a nonvolatile semiconductor memory device according to the third embodiment.
Figure 8B:
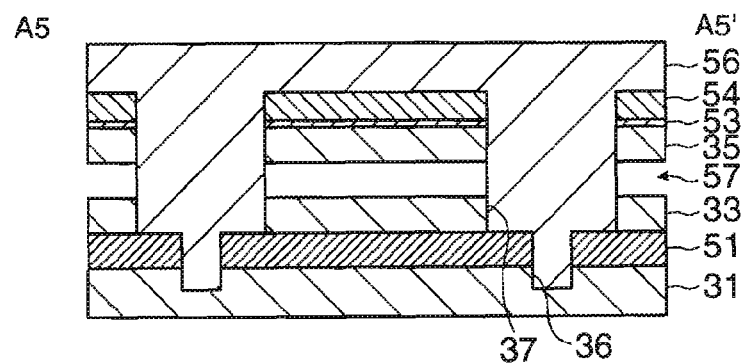
Figure 8C:
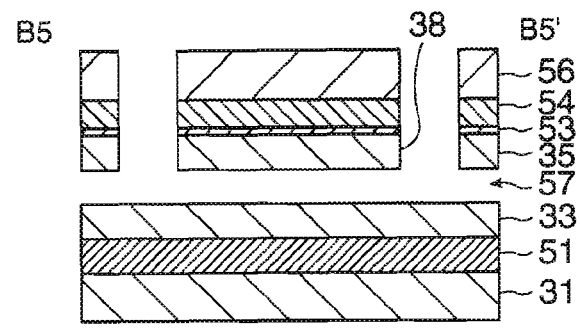

Next, as shown in FIG. 8, the semiconductor layer 52 is removed so as to form a cavity 57 between the electron acceleration layer 33 and the semiconductor layer 52 by making an etching solution or an etching gas contact with the semiconductor layer 52 through the groove 38.

By providing the support member 56 in the grooves 36, 37 as described above, it is possible to support the semiconductor layer 35 on the semiconductor substrate 31 even after the semiconductor layer 52 is removed. Furthermore, by providing the groove 38 in addition to the grooves 36, 37, it is possible to make the etching solution contact with the semiconductor layer 52 formed under the semiconductor layer 35. Therefore, the insulation between the semiconductor layer 35 and the electron acceleration layer 33 can be made without impairing the crystal quality of the semiconductor layer 35.

In case where the semiconductor substrate 31 and the semiconductor layer 35 are made of Si and the semiconductor layer 52 is made of SiGe, fluoro-nitric acid is preferably used as the etching solution to etch the semiconductor layer 52. In this way, a selectivity ratio Si to SiGe will be 1:100-1000 and it makes it possible to remove the semiconductor layer 52 as well as preventing the semiconductor substrate 31 and the semiconductor layer 35 from being over-etched.

Figure 9A:
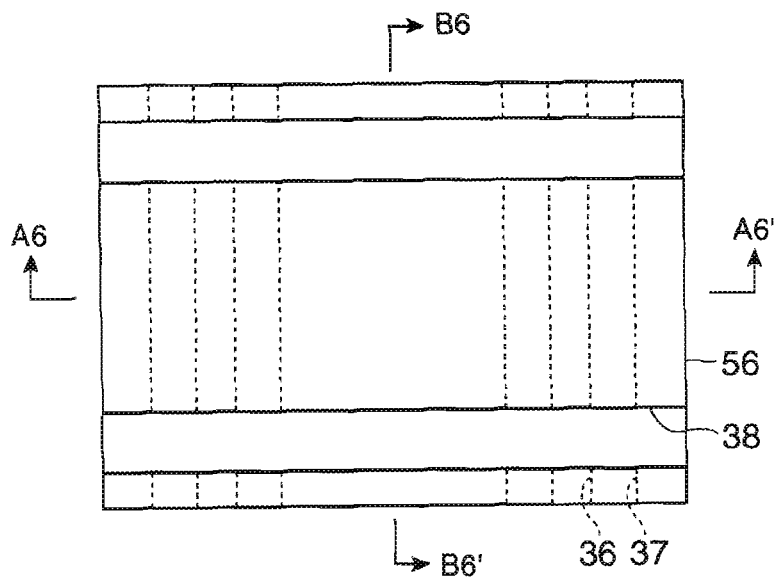
FIGS. 9A through 9C show the method of manufacturing a nonvolatile semiconductor memory device according to the third embodiment.
Figure 9B:
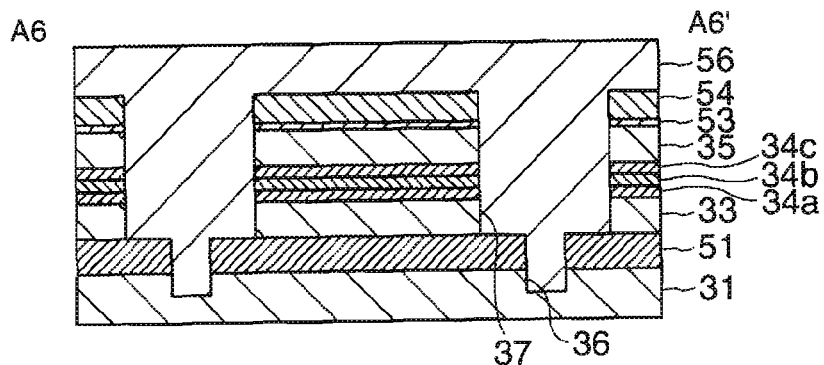
Figure 9C:
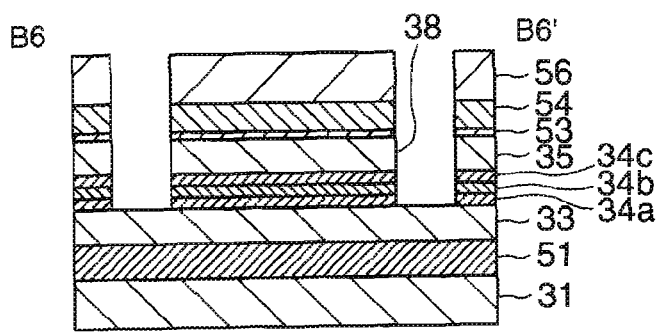

Next, as shown in FIG. 9, a surface oxide film 34c and a surface oxide film 34a are formed respectively on the top and bottom inner faces of the cavity 57 placed between the semiconductor substrate 31 and the semiconductor layer 35 by performing a thermal oxidation of the semiconductor layer 35 and the electron acceleration layer 33. When the surface oxide films 34c, 34a are formed by the thermal oxidation of the semiconductor layer 35 and the electron acceleration layer 33, the semiconductor layer 35 in the groove 38 is oxidized and an oxide film 39 is formed on the inner side wall of the groove 38.

Subsequently, a buried conductive layer 34b is formed in the cavity 57 by forming a conductive film in the cavity 57 in which the surface oxide films 34c, 34a are formed by an atomic layer deposition (ALD) method, a CVD method and the like. The buried conductive layer 34b can be made of, for example, a semiconductor such as Si, Ge, SiGe, GaAs, InP, GaP, GaN and SiC, a metal such as Al, Cu, W, Ti, TiN, Ta and TaN and an alloy such as silicide and others.

In this way, the buried conductive layer 34b can serve as the floating gate and the floating gate can be placed under the channel region formed in the semiconductor layer 35. Furthermore, by forming the electron injection layer 51 on the semiconductor substrate 31, it is possible to make the electron injection layer 51 serve as the control gate that injects electric charge into the floating gate and draws out electric charge from the floating gate. Accordingly, the control gate can be placed under the floating gate. Therefore, it is possible to control the amount of the electric charge accumulated in the floating gate even though the floating gate is not placed on the channel region formed in the semiconductor layer 35. Consequently, it is possible to realize the nonvolatile semiconductor memory device that can perform the electric writing and erasing and in which the threshold voltage of the reading is lowered.

In the above-described method with reference to FIG. 9, the surface oxide films 34c, 34a that are respectively placed on the top and bottom inner faces of the cavity 57 are formed by the thermal oxidation of the semiconductor layer 35 and the electron acceleration layer 33. However, they may be formed by forming insulating films on the top and bottom inner faces of the cavity 57 by the ALD method or the CVD method. In the forming step shown in FIG. 9, the surface oxide films 34c, 34a and the buried conductive layer 34b are also formed on the side wall and the bottom of the groove 38. These surface oxide films 34c, 34a and the buried conductive layer 34b formed in the groove 38 are removed by performing an isotropic etching and an anisotropic etching in which the support member 56 is used as a mask.

Figure 10A:
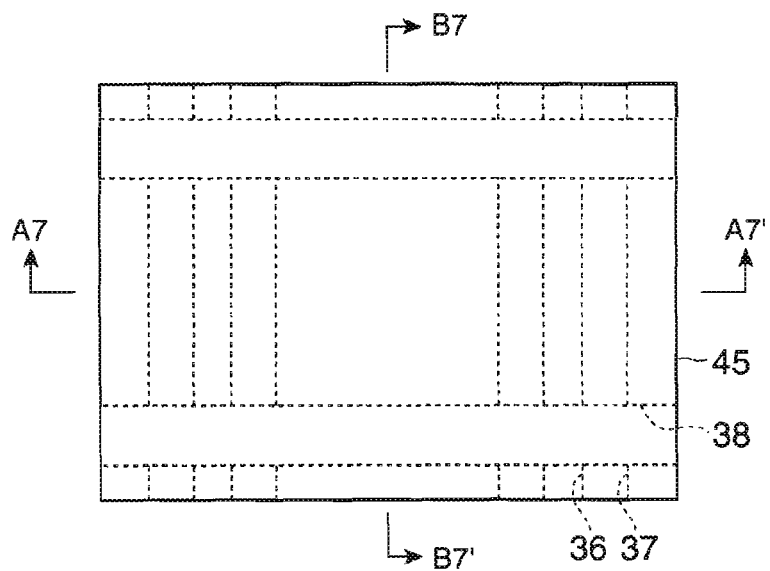
FIGS. 10A through 10C show the method of manufacturing a nonvolatile semiconductor memory device according to the third embodiment.
Figure 10B:
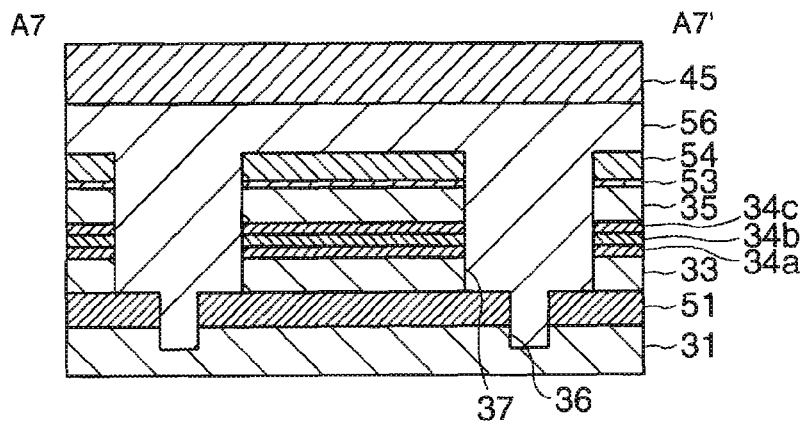
Figure 10C:
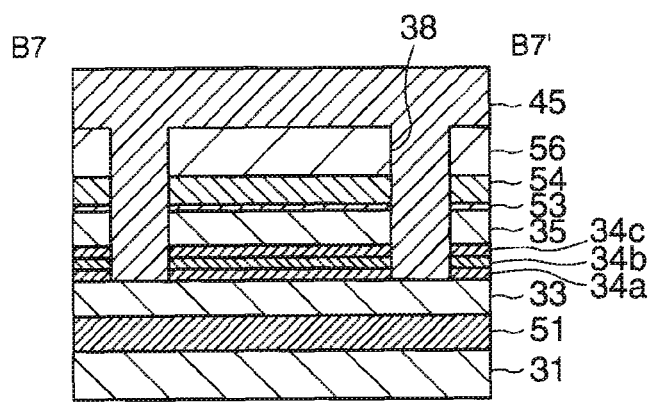

Next, a buried insulating member 45 is deposited on the support member 56 so as to fill in the groove 38 by the CVD method and the like as shown in FIG. 10. A silicon oxide film can be used as the buried insulating member 45.

Figure 11A:
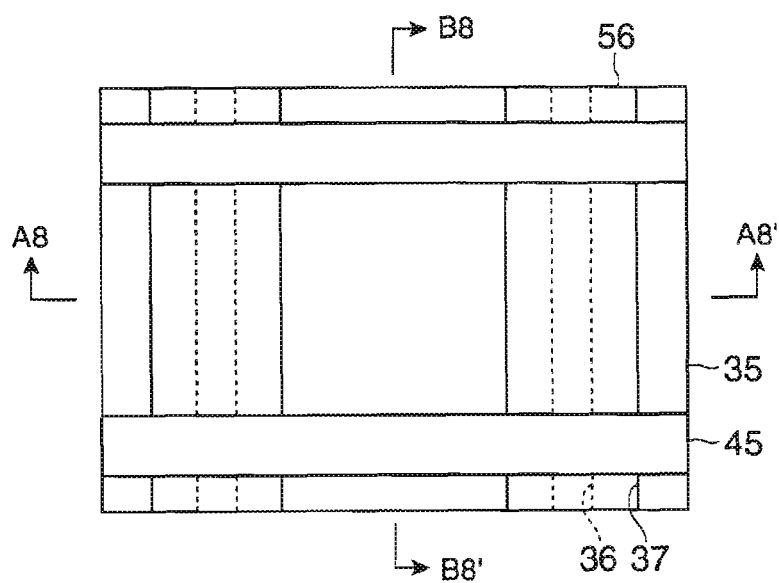
FIGS. 11A through 11C show the method of manufacturing a nonvolatile semiconductor memory device according to the third embodiment.
Figure 11B:
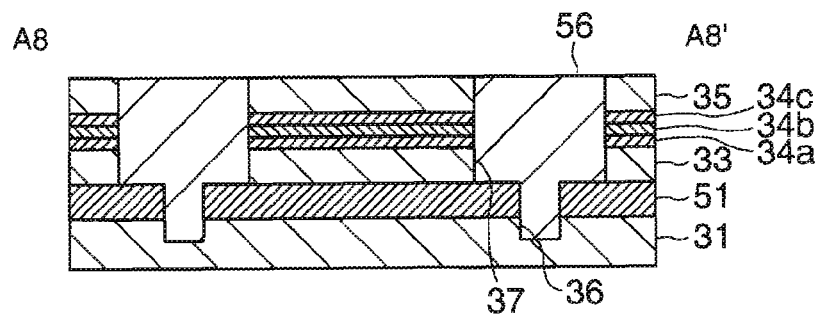
Figure 11C:
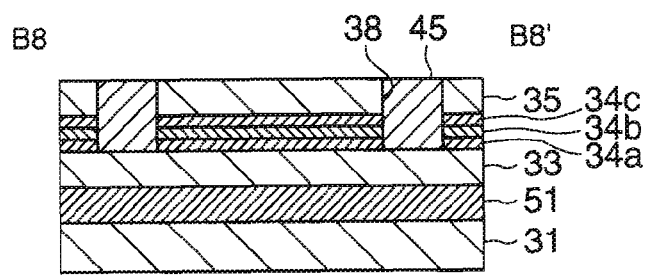

The buried insulating member 45 and the support member 56 are then made thinner by adopting chemical mechanical polishing (CMP) and the like, and the surface of the semiconductor layer 35 is exposed by removing the antioxidant film 54 and the base oxide film 53 as shown in FIG. 11.

Figure 12A:
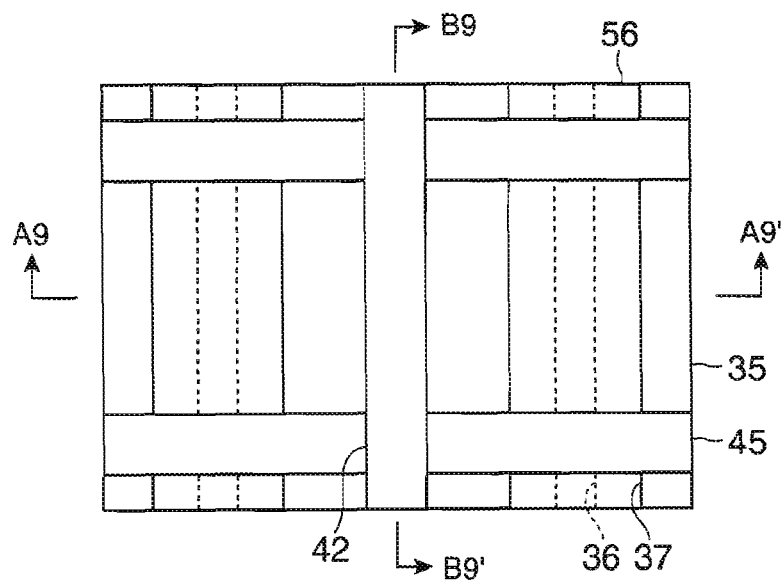
FIGS. 12A through 12C show the method of manufacturing a nonvolatile semiconductor memory device according to the third embodiment.
Figure 12B:
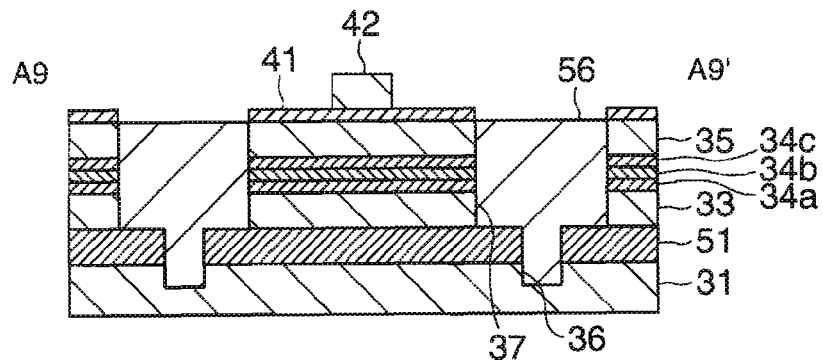
Figure 12C:
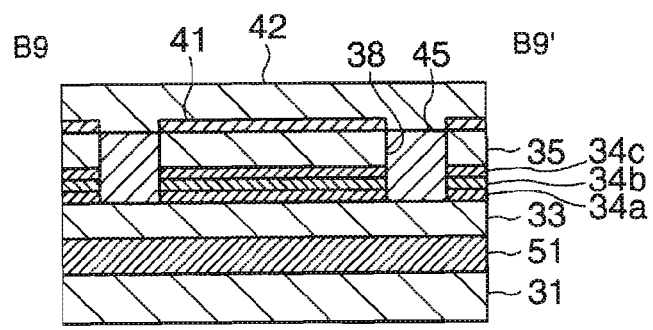

Next, a gate insulating film 41 is formed on the surface of the semiconductor layer 35 by thermally oxidizing the surface of the semiconductor layer 35 as shown in FIG. 12. Subsequently, a polycrystalline silicon layer, a silicide layer or a metal layer is formed on the semiconductor layer 35 on which the gate insulating film 41 is formed by a CVD method and the like. A gate electrode 42 is then formed on the semiconductor layer 35 by patterning the polycrystalline silicon layer, the silicide layer or the metal layer with a photolithography technique or an etching technique.

Figure 13A:
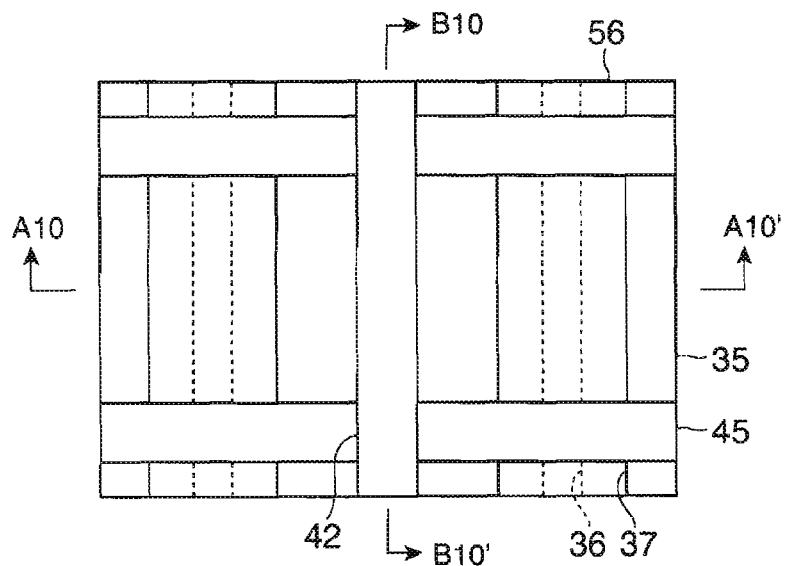
FIGS. 13A through 13C show the method of manufacturing a nonvolatile semiconductor memory device according to the third embodiment.
Figure 13B:
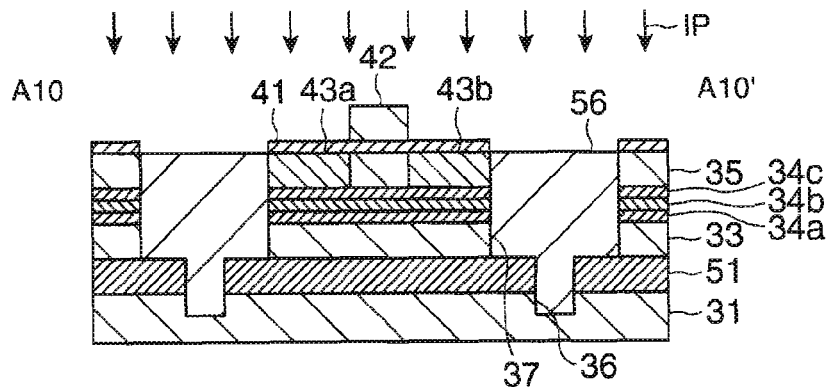
Figure 13C:
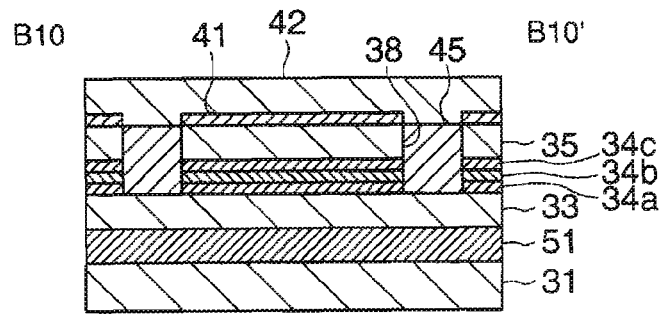
Figure 14A:
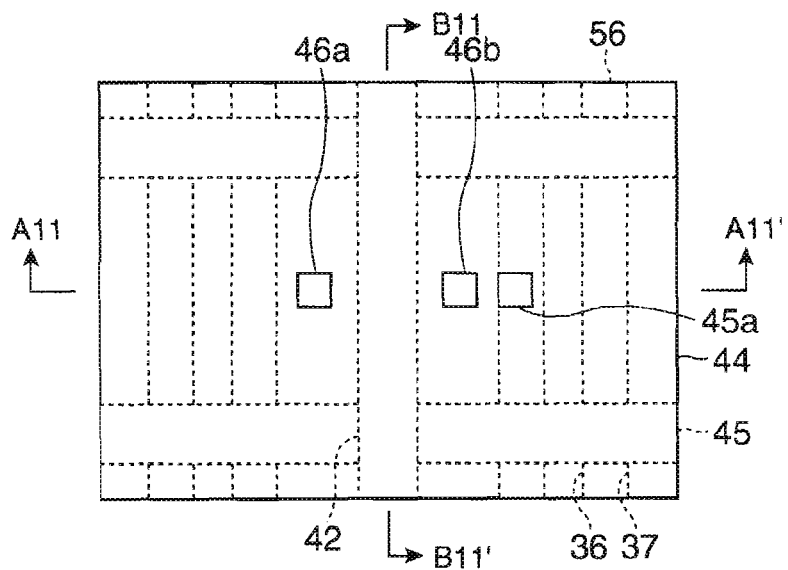
FIGS. 14A through 14C show the method of manufacturing a nonvolatile semiconductor memory device according to the third embodiment.
Figure 14B:
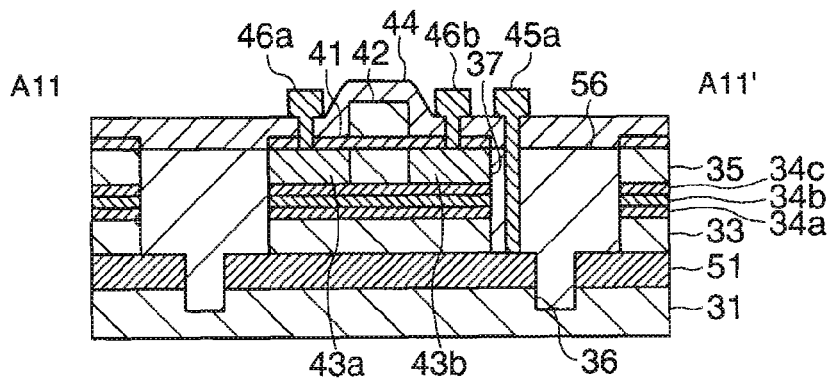
Figure 14C:
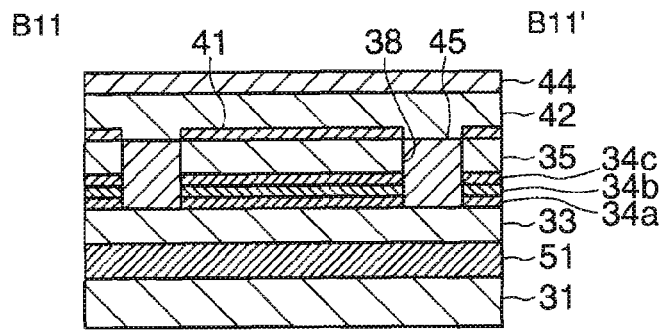
Figure 15A:
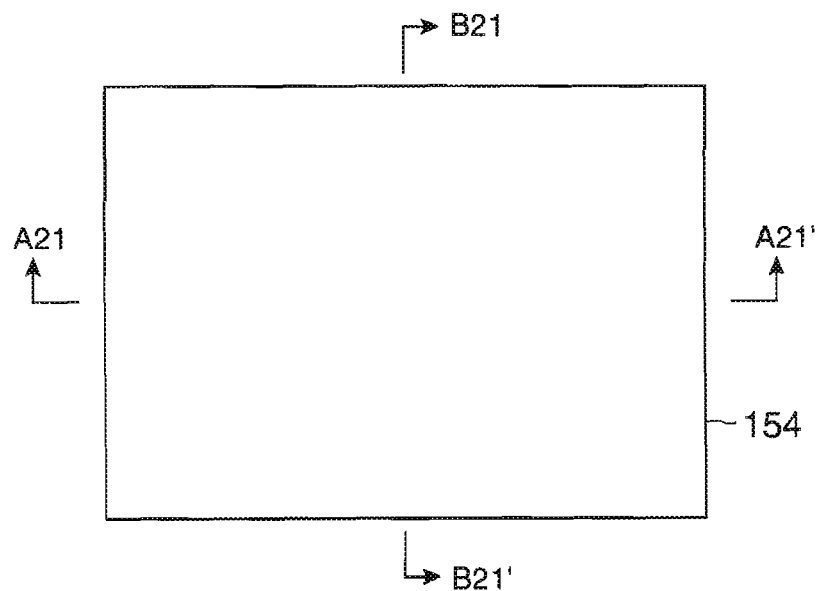
FIGS. 15A through 15C show a method of manufacturing a nonvolatile semiconductor memory device according to a fourth embodiment of the invention.
Figure 15B:
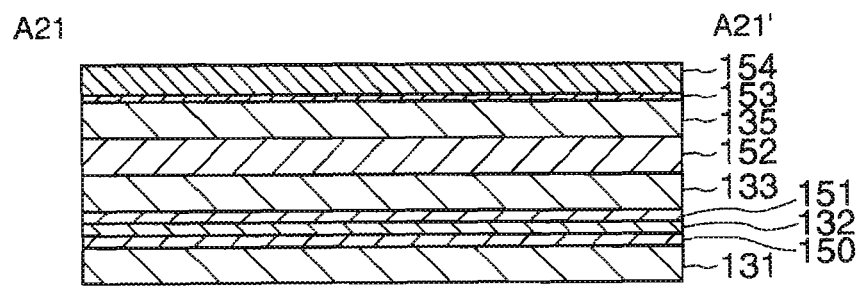
Figure 15C:
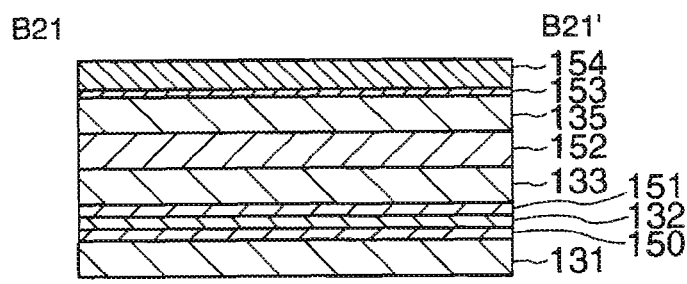

Next, ion injection IP which injects an impurity such as As, P, B and $BF_2$ into the semiconductor layer 35 is performed by using the gate electrode 42 as a mask, and a source layer 43a and a drain layer 43b that are placed so as to interpose the gate electrode 42 therebetween is formed in the semiconductor layer 35 as shown in FIG. 13.

An interlayer insulating layer 44 is then deposited on the gate electrode 42 by a CVD method and the like, as shown in FIG. 14. Subsequently, a control gate contact electrode 45a is formed on the interlayer insulating layer 44. The control gate contact electrode 45a is formed so as to be buried in the interlayer insulating layer 44 and the support member 56 and coupled to the electron injection layer 51. At the same time, a source contact electrode 46a and a drain contact electrode 46b are formed so as to be buried in the interlayer insulating layer 44 and on the interlayer insulating layer 44. The source contact electrode 46a is coupled to the source layer 43a and the drain contact electrode 46b is coupled to the drain layer 43b.

In this way, it is possible to form a SOI transistor on the semiconductor layer 35 without using a SOI substrate. Furthermore, it is possible to place the floating gate under the channel region formed in the semiconductor layer 35 and to control the amount of the electric charge accumulated in the floating gate by the electron injection layer 51. Accordingly, there is no need to place the floating gate on the channel region where the gate electrode 42 is formed. This makes it possible to form the thinner gate insulating film 41 on the channel region and under the gate electrode 42. As a result, it is possible to lower the threshold value of the reading out in the nonvolatile semiconductor memory device. Consequently, the operation capacity of the nonvolatile semiconductor memory device can be improved and the nonvolatile semiconductor memory device can perform a high-speed data reading at a low voltage. In the above-described embodiment, the floating gate is formed under the channel region formed in the semiconductor layer 35 by forming the buried conductive layer 34b between the surface oxide films 34c, 34a. However, another layered structure which includes the semiconductor layers 52, 35 having different etching rates may be further formed and the floating gate made of a single crystal semiconductor layer 35 can be provided under a channel region formed in a semiconductor layer 35' of the added layered structure including semiconductor layers 52', 35'.

Fourth Embodiment

FIGS. 15A through 27A are plan views showing a method of manufacturing a nonvolatile semiconductor memory device according to a fourth embodiment of the invention. FIGS. 15B through 27B are sectional views along the line A21-A21' through A33-A33' correspondingly shown in FIGS. 15A through 27A. FIGS. 15C through 27C are sectional views along the line B21-B21' through B33-B33' correspondingly shown in FIGS. 15A through 27A.

As shown in FIG. 15, semiconductor layers 150, 132, 151, 133, 152, 135 are sequentially formed on a semiconductor substrate 131 so as to stack in layers by epitaxial growth. The semiconductor layers 150, 151, 152 can be made of a material that has a larger etching rate than that of the material for the semiconductor substrate 131 and the semiconductor layers 132, 133, 135. Particularly when the semiconductor substrate 131 is made of Si, it is preferable that the semiconductor layers 150, 151, 152 be made of SiGe and the semiconductor layers 132, 133, 135 be made of Si. It is also preferable that the thickness of the semiconductor layer 132 be smaller than those of the semiconductor layers 133, 135 and the thicknesses of the semiconductor layers 150, 151 be smaller than that of the semiconductor layer 152.

Next, a base oxide film 153 is formed on the surface of the semiconductor layer 135 by oxidation of the semiconductor layer 135 or a CVD method. Subsequently, an antioxidant film 154 is formed on the whole face of the base oxide film 153 by a CVD method and the like.

Figure 16A:
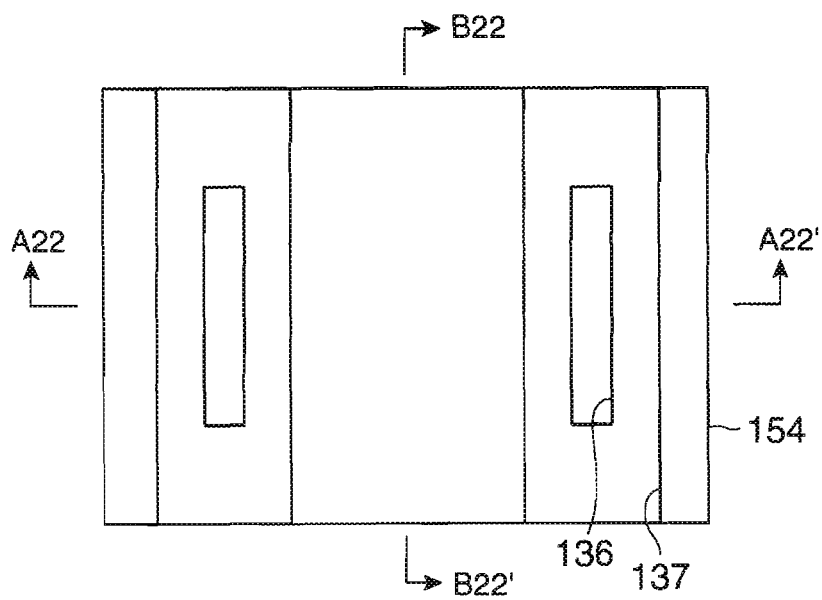
FIGS. 16A through 16C show the method of manufacturing a nonvolatile semiconductor memory device according to the fourth embodiment.
Figure 16B:
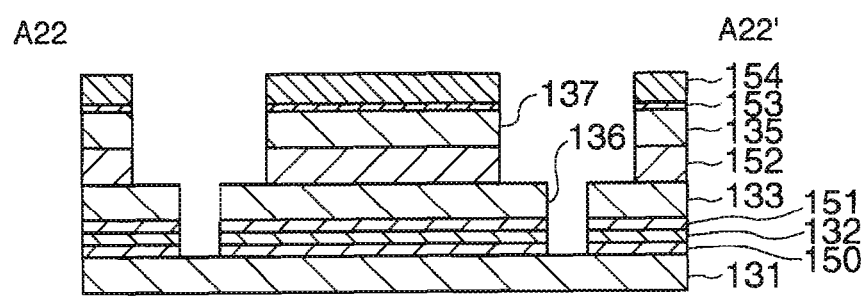
Figure 16C:
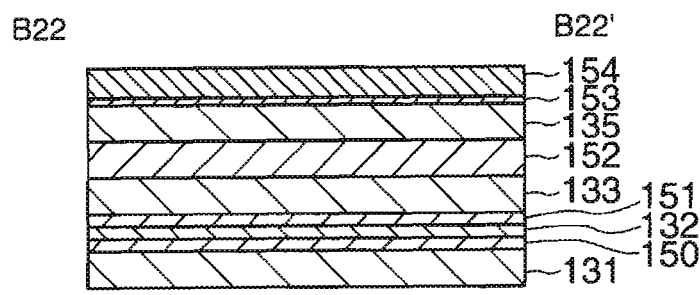

Next, as shown in FIG. 16, a groove 136 that exposes the semiconductor substrate 131 is formed so as to extend in a predetermined direction by patterning the antioxidant film 154, the base oxide film 153 and the semiconductor layers 135, 152, 133, 151, 132, 150 with a photolithography technique or an etching technique.

Furthermore, a groove 137 that has a larger width than that of the groove 136 is formed so as to overlap the groove 136 by patterning the antioxidant film 154, the base oxide film 153 and the semiconductor layers 135, 152 by a photolithography technique or an etching technique.

Figure 17A:
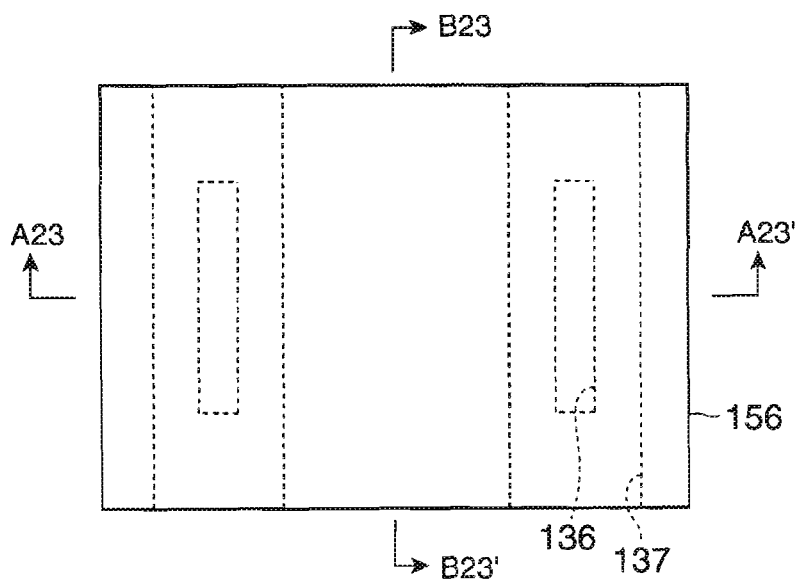
FIGS. 17A through 17C show the method of manufacturing a nonvolatile semiconductor memory device according to the fourth embodiment.
Figure 17B:
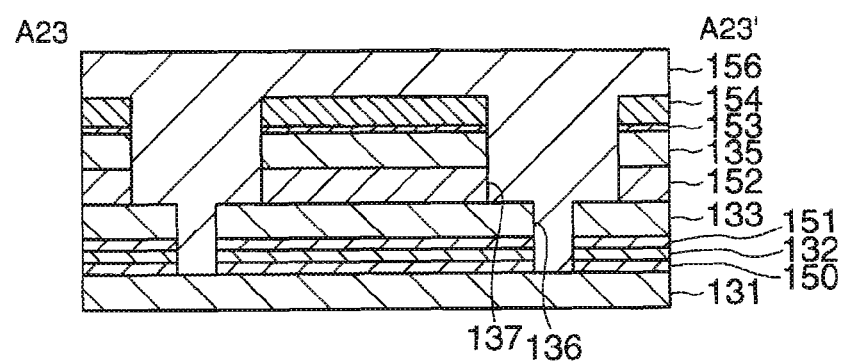
Figure 17C:
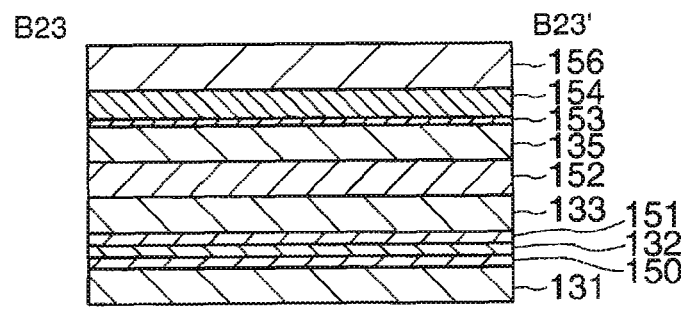

A support member 156 that is buried in the grooves 136, 137 and supports the semiconductor layers 132, 133, 135 on the semiconductor substrate 131 is then formed on the whole surface of the semiconductor substrate 131 as shown in FIG. 17.

Figure 18A:
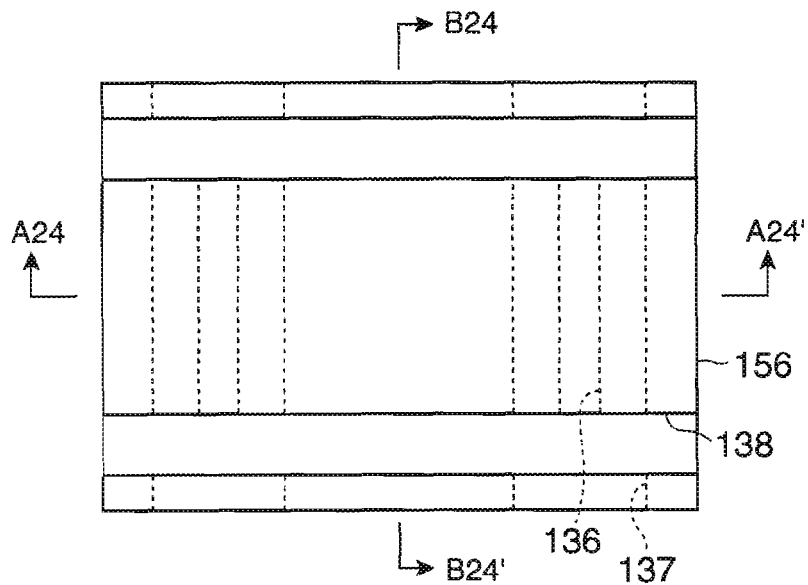
FIGS. 18A through 18C show the method of manufacturing a nonvolatile semiconductor memory device according to the fourth embodiment.
Figure 18B:
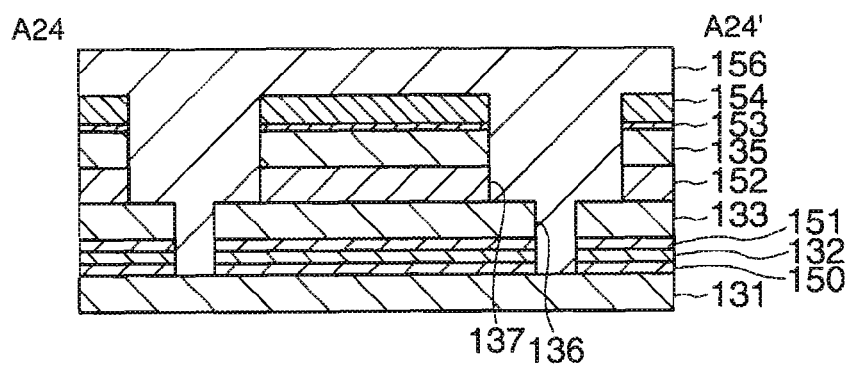
Figure 18C:
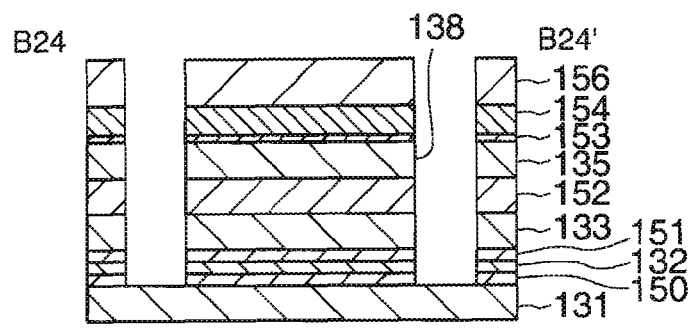

Subsequently, as shown in FIG. 18, a groove 138 that exposes the semiconductor substrate 131 is formed in the direction orthogonal to the groove 136 by patterning the antioxidant film 154, the base oxide film 153 and the semiconductor layers 135, 152, 133, 151, 132, 150 by a photolithography technique or an etching technique.

Figure 19A:
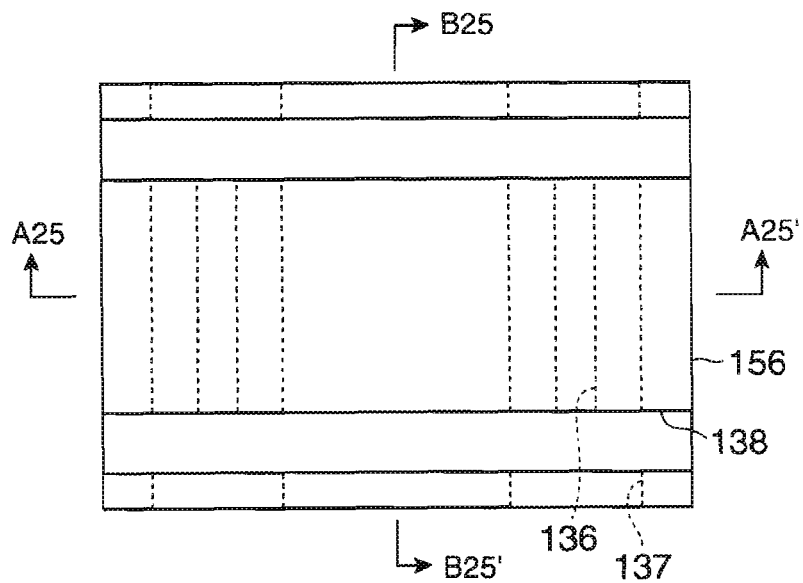
FIGS. 19A through 19C show the method of manufacturing a nonvolatile semiconductor memory device according to the fourth embodiment.
Figure 19B:
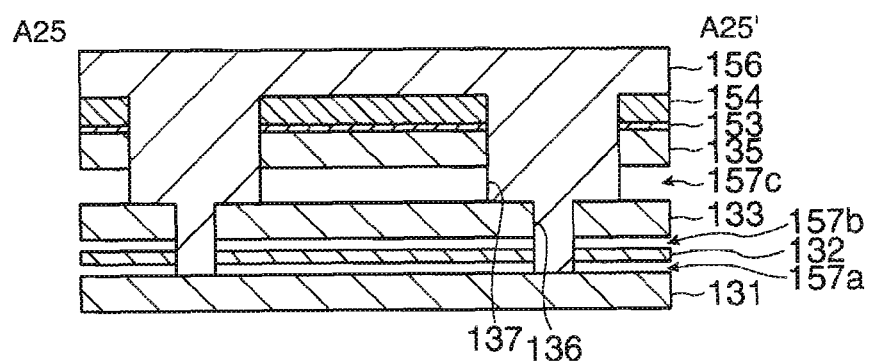
Figure 19C:
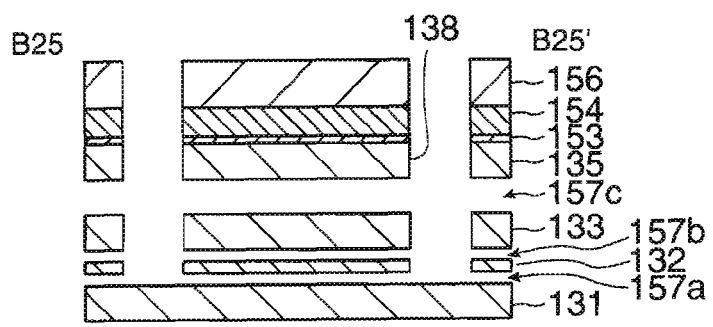

Next, as shown in FIG. 19, the semiconductor layers 150, 115, 152 are removed by an etching process in which an etching solution or an etching gas contacts with the semiconductor layers 150, 151, 152 through the groove 138. Consequently, a cavity 157a is formed between the semiconductor substrate 131 and the semiconductor layer 133, a cavity 157b is formed between the semiconductor layer 132 and the semiconductor layer 133, and a cavity 157c is formed between the semiconductor layer 133 and the semiconductor layer 135.

Figure 20A:
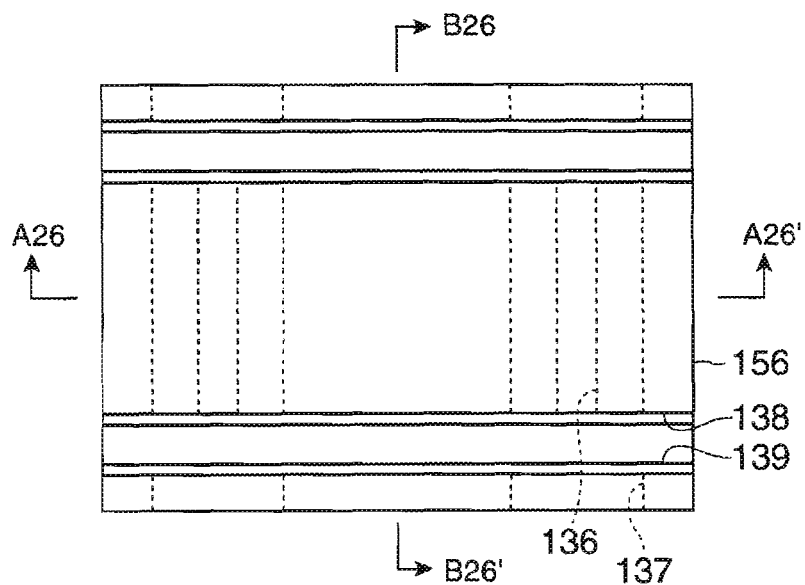
FIGS. 20A through 20C show the method of manufacturing a nonvolatile semiconductor memory device according to the fourth embodiment.
Figure 20B:
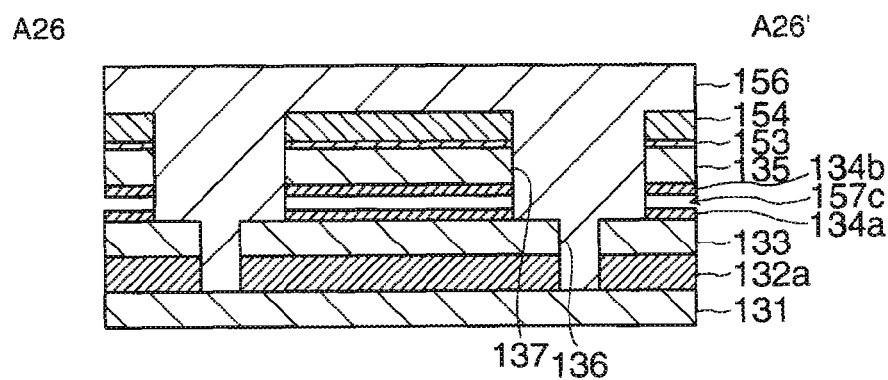
Figure 20C:
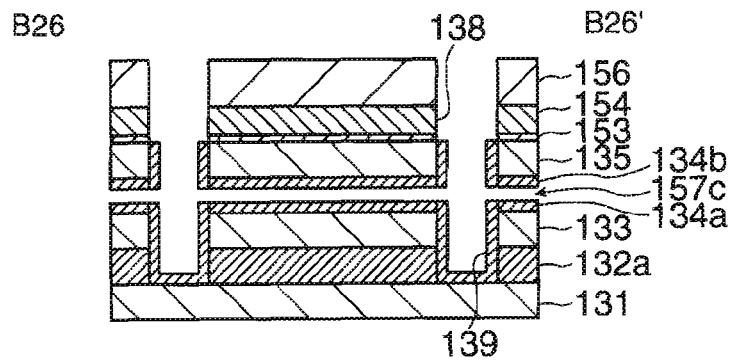

Next, as shown in FIG. 20, a buried insulating layer 132, a surface oxide film 134c and a surface oxide film 134a are formed by performing a thermal oxidation of the semiconductor substrate 131 and the semiconductor layers 132, 133, 135. The buried insulating layer 132 is formed between the semiconductor substrate 131 and the semiconductor layer 133. The surface oxide film 134c and the surface oxide film 134a are formed respectively on the top and bottom inner faces of the cavity 157c placed between the semiconductor layer 133 and the semiconductor layer 135. Here, when the thermal oxidation of the semiconductor substrate 131 and the semiconductor layers 132, 133, 135 is performed, the semiconductor layer 132 is thermally oxidized till the semiconductor layer 132 disappears while the cavity 157c remains between the semiconductor layer 133 and the semiconductor layer 135. In this way, it is possible to make the surface oxide films 134c, 134a formed on the top and bottom inner faces of the cavity 157c thinner. At the same time, it is also possible to make the buried insulating layer 132 formed between the semiconductor substrate 131 and the semiconductor layer 133 thicker. When the buried insulating layer 132 and the surface oxide films 134c, 134a are formed by performing the thermal oxidation of the semiconductor substrate 131 and the semiconductor layers 132, 133, 135, a low-temperature-wet oxidation which can control the reaction rate is preferably adopted in order to improve the embedment of the forming layers. Furthermore, when the buried insulating layer 132 and the surface oxide films 134c, 134a are formed by performing the thermal oxidation of the semiconductor substrate 131 and the semiconductor layers 132, 133, 135, the semiconductor substrate 131 and the semiconductor layers 133, 135 in the groove 138 are oxidized and an oxide film 139 is formed on the inner side wall of the groove 138.

Figure 21A:
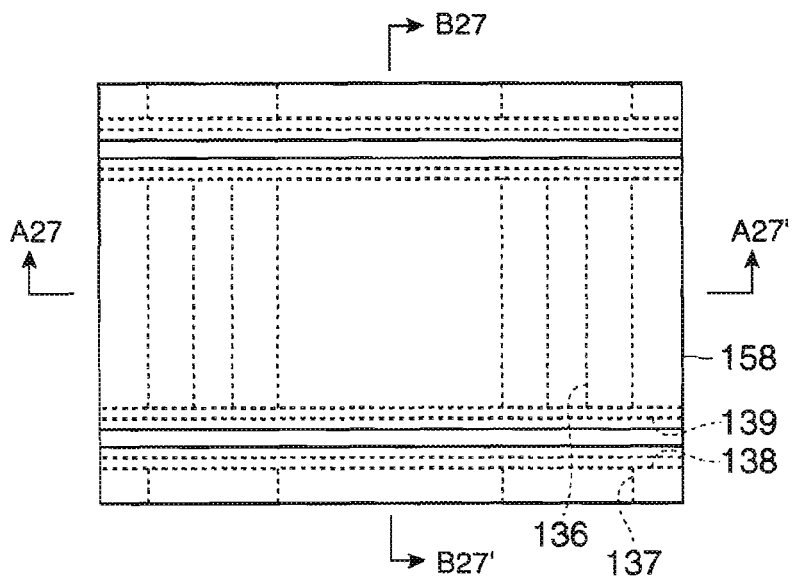
FIGS. 21A through 21C show the method of manufacturing a nonvolatile semiconductor memory device according to the fourth embodiment.
Figure 21B:
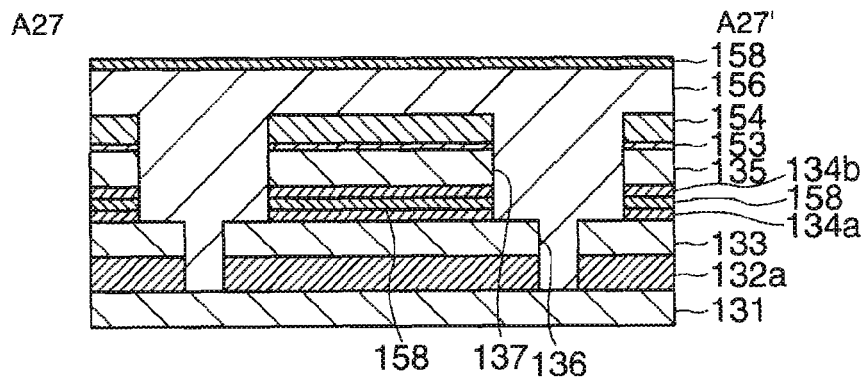
Figure 21C:
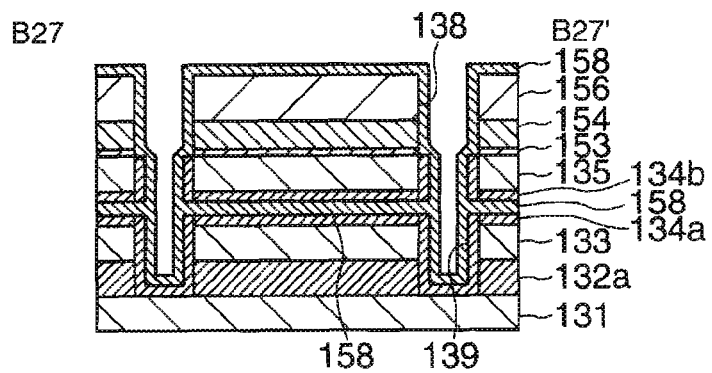

Subsequently, as shown in FIG. 21, a buried conductive layer 158 is formed in the cavity 157c by forming a conductive film in the cavity 157c in which the surface oxide films 134c, 134a are formed by an ALD method, a CVD method and the like.

In this way, the buried conductive layer 158 can serve as the floating gate and the floating gate can be placed under the channel region formed in the semiconductor layer 135. Furthermore, it is possible to make the semiconductor layer 133 serve as the control gate that injects electric charge into the floating gate and draws out electric charge from the floating gate. Accordingly, the control gate can be placed under the floating gate. Therefore, it is possible to control the amount of the electric charge accumulated in the floating gate even though the floating gate is not placed on the channel region formed in the semiconductor layer 135. Consequently, it is possible to realize the nonvolatile semiconductor memory device that can perform the electric writing and erasing and in which the threshold voltage at the time of the read out is lowered.

Figure 22A:
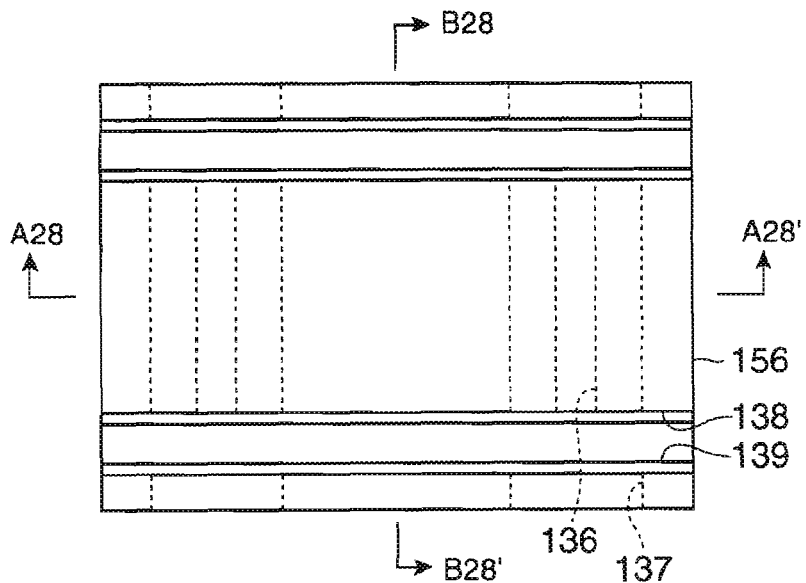
FIGS. 22A through 22C show the method of manufacturing a nonvolatile semiconductor memory device according to the fourth embodiment.
Figure 22B:
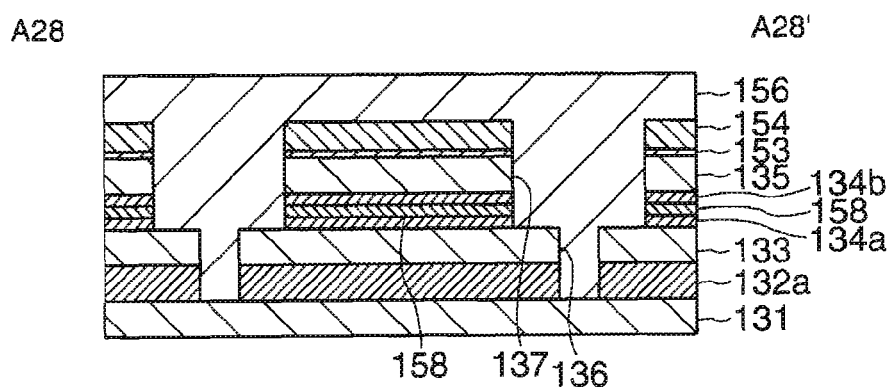
Figure 22C:
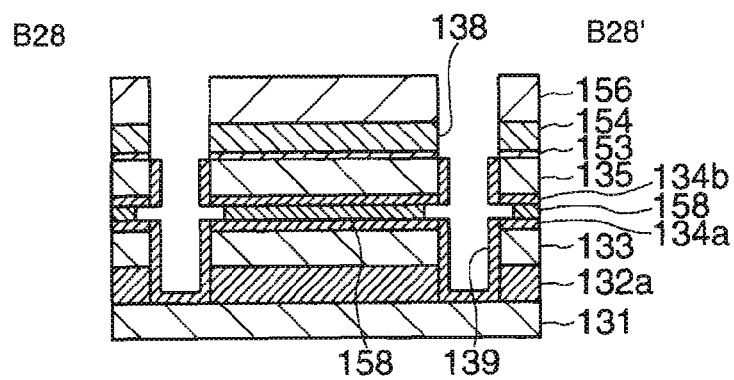

Next, the buried conductive layer 158 is etched by an isotropic etching method such as wet etching and plasma etching. The buried conductive layer 158 that exists on the surface of the support member 156 and on the side walls of the semiconductor layers 133, 135 is removed by the etching while leaving the buried conductive layer 158 that exists between the surface oxide film 134c and the surface oxide film 134a as it is as shown in FIG. 22. As a result of the etching, the support member 156 and the oxide film 139 are exposed. Alternatively, the buried conductive layer 158 may be oxidized in such a way that the conductive layer that exists in the groove area and on the surface area turns into an insulating oxide film. For example, in case where the conductive layer 158 is made of silicon, the silicon that exists in the groove area and on the surface area turns into a silicon oxide film by the oxidation treatment.

Figure 23A:
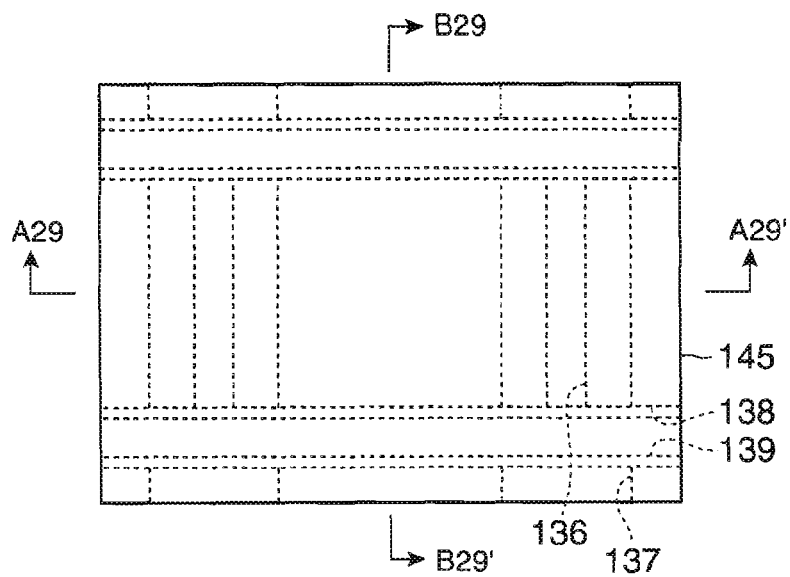
FIGS. 23A through 23C show the method of manufacturing a nonvolatile semiconductor memory device according to the fourth embodiment.
Figure 23B:
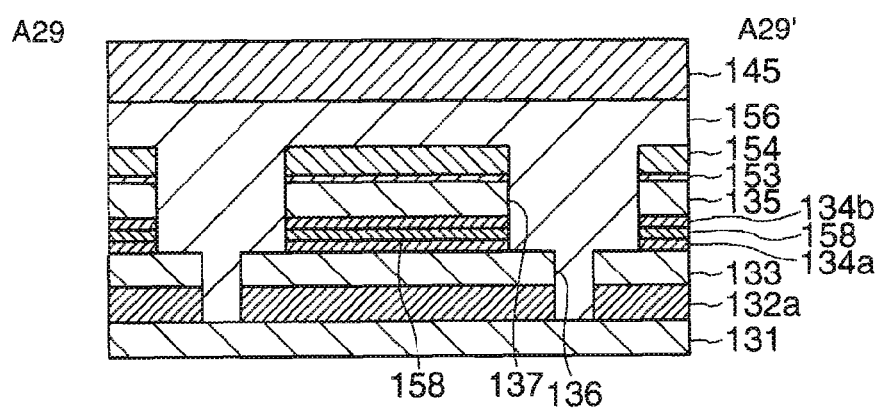
Figure 23C:
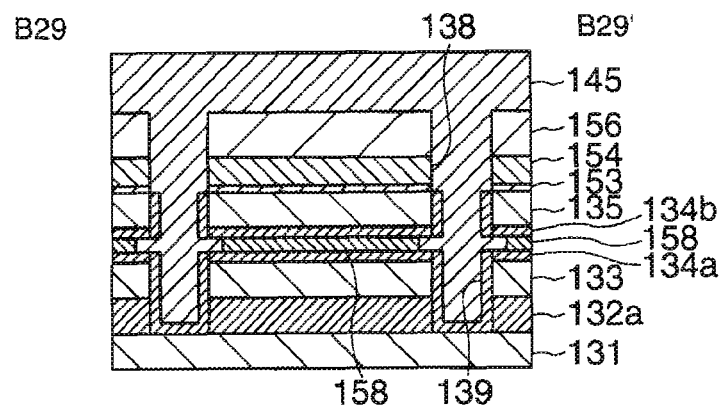

Next, a buried insulating member 145 is deposited on the support member 156 so as to fill the groove 138 by a CVD method and the like as shown in FIG. 23. A silicon oxide film can be used as the buried insulating member 145.

Figure 24A:
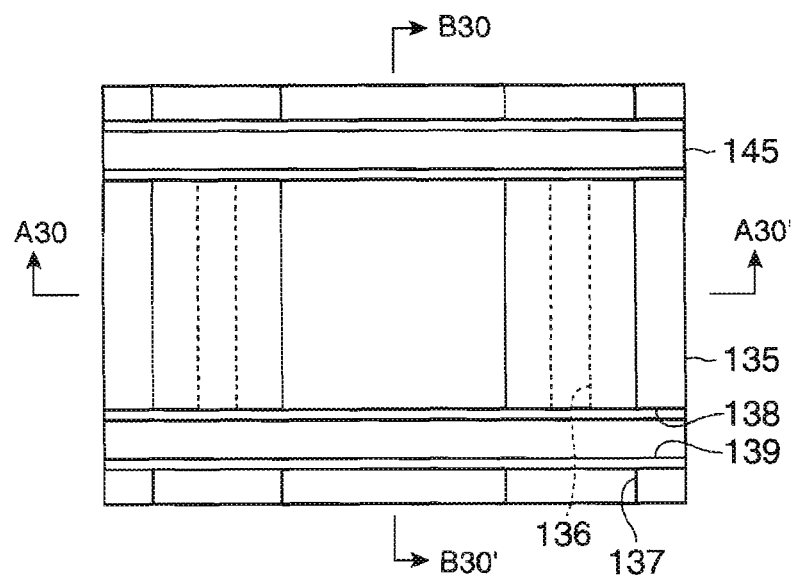
FIGS. 24A through 24C show the method of manufacturing a nonvolatile semiconductor memory device according to the fourth embodiment.
Figure 24B:
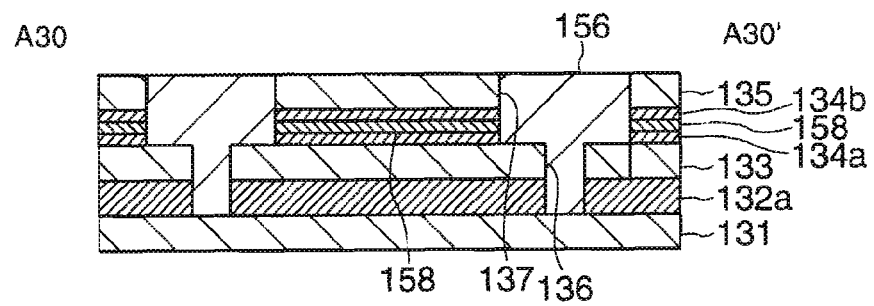
Figure 24C:
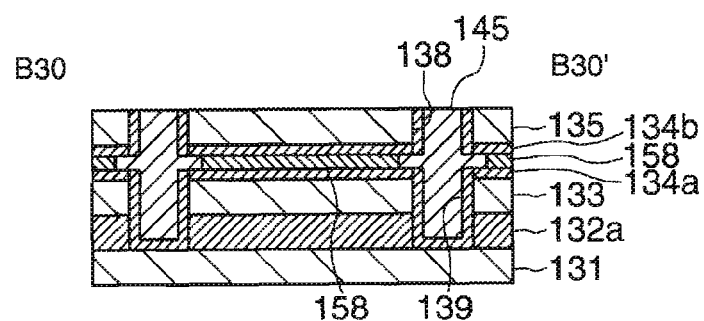

The buried insulating member 145 and the support member 156 are then made thinner by adopting chemical mechanical polishing (CMP) and the like, and the surface of the semiconductor layer 135 is exposed by removing the antioxidant film 154 and the base oxide film 153 as shown in FIG. 24. Subsequently, an impurity is introduced into the semiconductor layer 133 by performing ion-injection in which the impurity such as As, P, B and $BF_2$ is injected into the semiconductor layer 133.

Figure 25A:
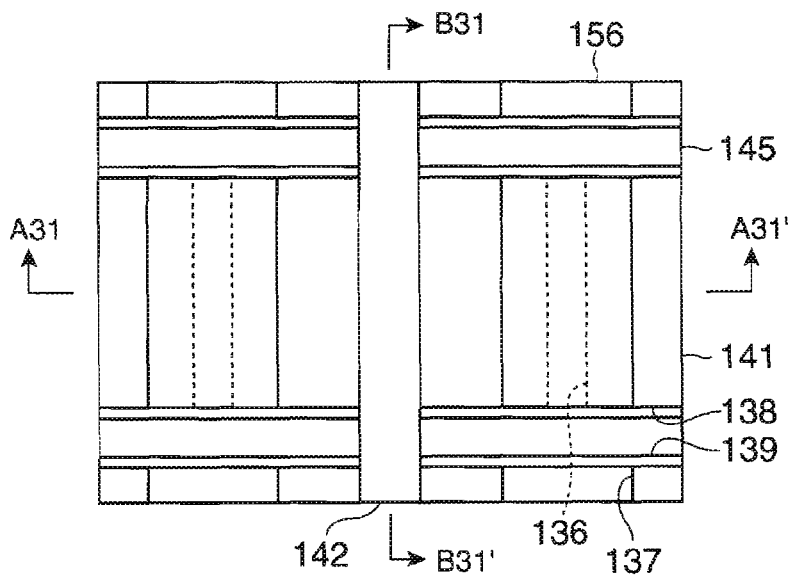
FIGS. 25A through 25C show the method of manufacturing a nonvolatile semiconductor memory device according to the fourth embodiment.
Figure 25B:
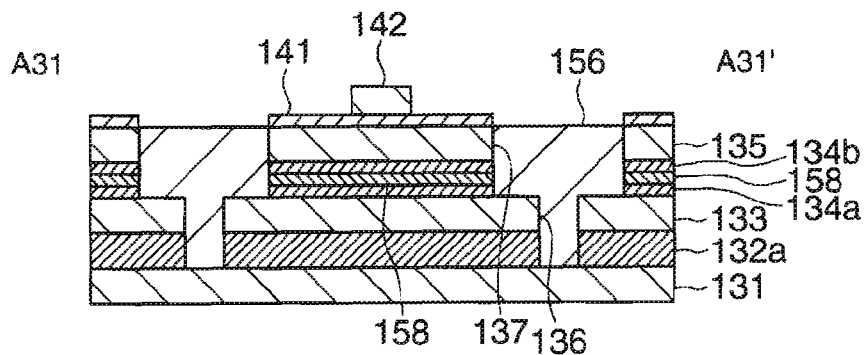
Figure 25C:
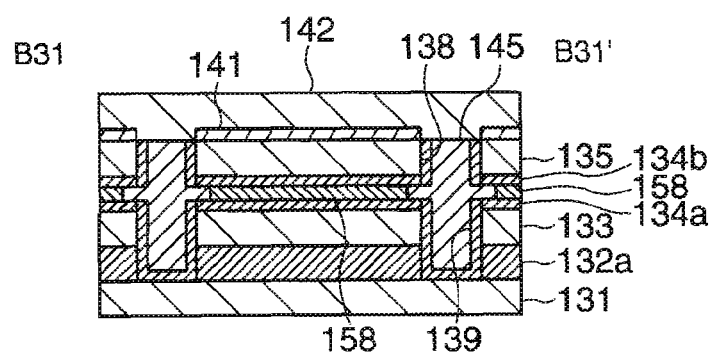

Next, a gate insulating film 141 is formed on the surface of the semiconductor layer 135 by thermally oxidizing the surface of the semiconductor layer 135 as shown in FIG. 25. Subsequently, a polycrystalline silicon layer is formed on the semiconductor layer 135 on which the gate insulating film 141 is formed by a CVD method and the like. A gate electrode 142 is then formed on the semiconductor layer 135 by patterning the polycrystalline silicon layer with a photolithography technique or an etching technique.

Figure 26A:
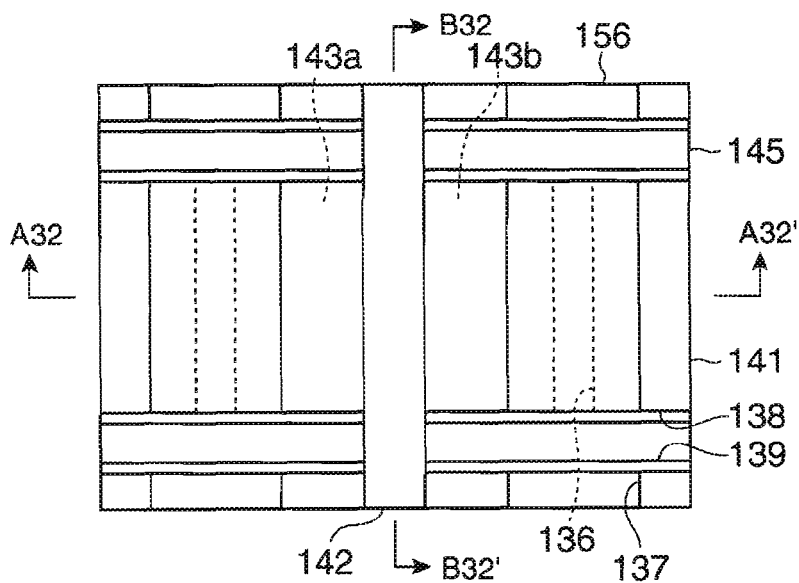
FIGS. 26A through 26C show the method of manufacturing a nonvolatile semiconductor memory device according to the fourth embodiment.
Figure 26B:
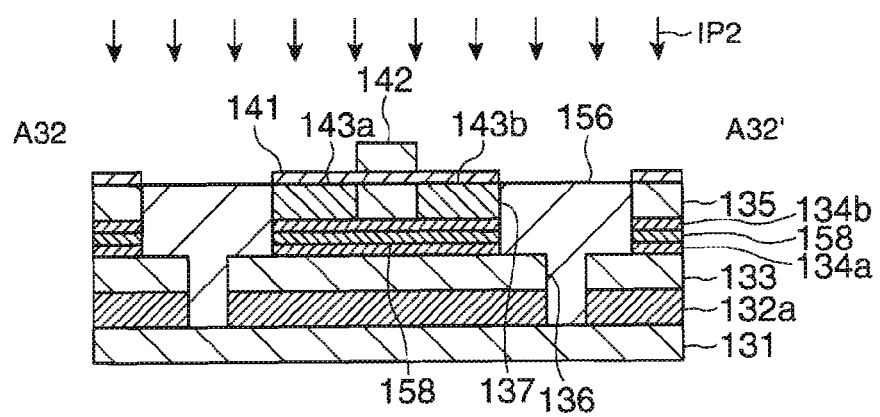
Figure 26C:
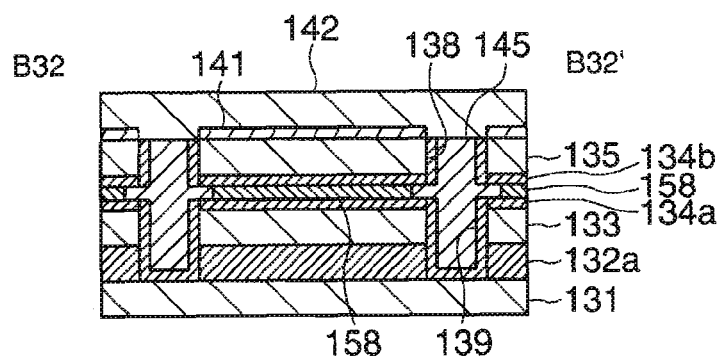
Figure 27A:
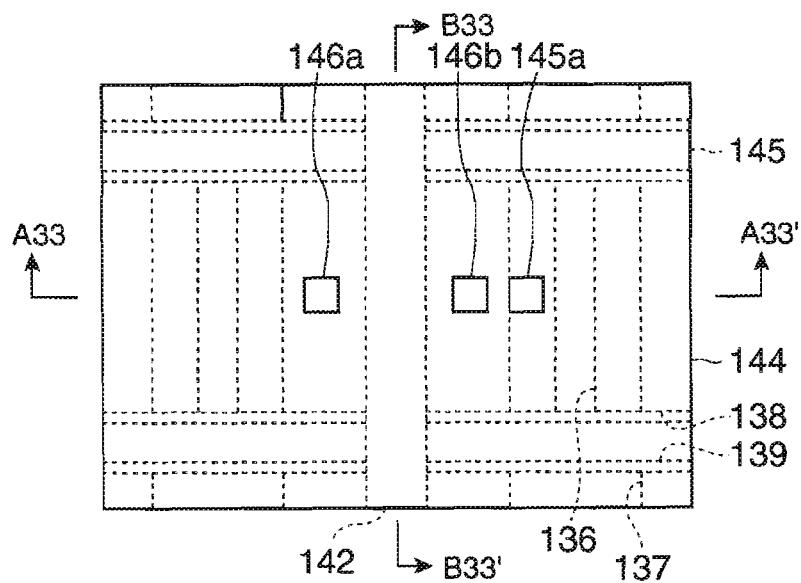
FIGS. 27A through 27C show the method of manufacturing a nonvolatile semiconductor memory device according to the fourth embodiment.
Figure 27B:
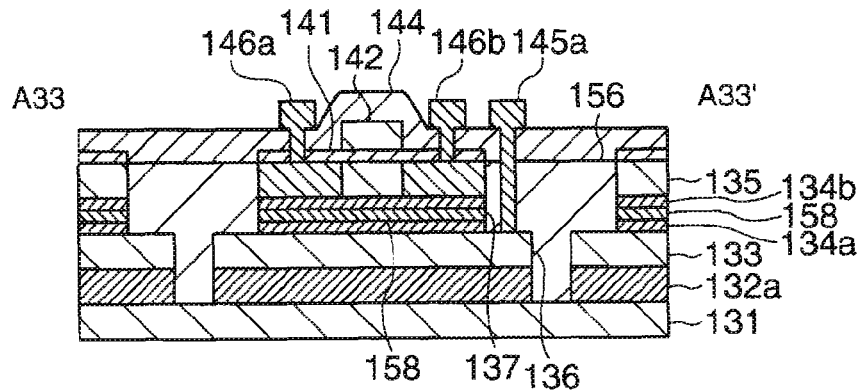
Figure 27C:
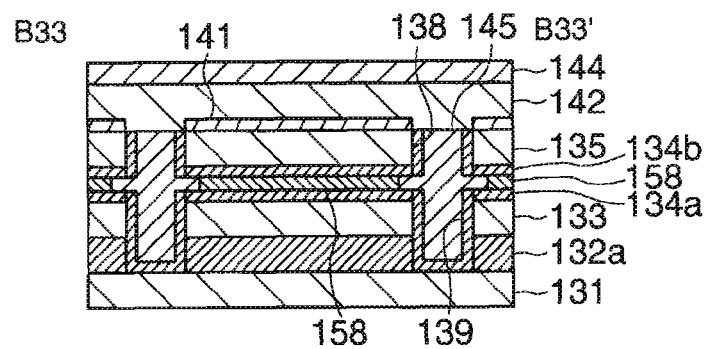

Next, ion injection IP2 which injects an impurity such as As, P, B and $BF_2$ into the semiconductor layer 135 is performed by using the gate electrode 142 as a mask, and a source layer 143a and a drain layer 143b that are placed so as to interpose the gate electrode 142 therebetween is formed in the semiconductor layer 135 as shown in FIG. 26.

An interlayer insulating layer 144 is then deposited on the gate electrode 142 by a CVD method and the like, as shown in FIG. 27. Subsequently, a control gate contact electrode 145a is formed on the interlayer insulating layer 144. The control gate contact electrode 145a is formed so as to be buried in the interlayer insulating layer 144 and the support member 156 and coupled to the semiconductor layer 133. At the same time, a source contact electrode 146a and a drain contact electrode 146b are formed so as to be buried in the interlayer insulating layer 144 and on the interlayer insulating layer 144. The source contact electrode 146a is coupled to the source layer 143a and the drain contact electrode 146b is coupled to the drain layer 143b.

In the above-described embodiment, the floating gate is formed under the channel region formed in the semiconductor layer 135 by forming the buried conductive layer 158 between the surface oxide films 134c, 134a. However, another layered structure which includes the semiconductor layers 150, 132, 151, 133, 152, 135 having different etching rates may be further formed and the floating gate can be made of a single crystal semiconductor layer.

Fourth Embodiment

Figure 28A:
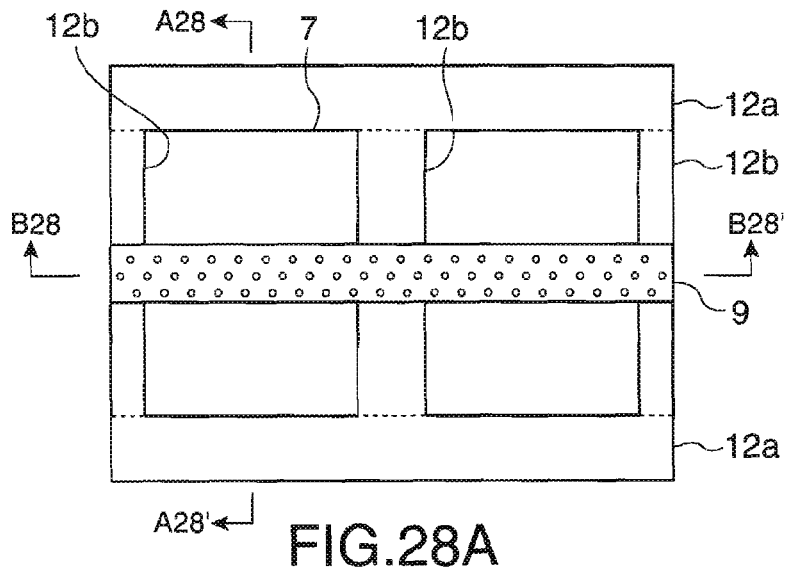
FIGS. 28A through 28C show a schematic structure of a nonvolatile semiconductor memory device according to a fifth embodiment of the invention.
Figure 28B:
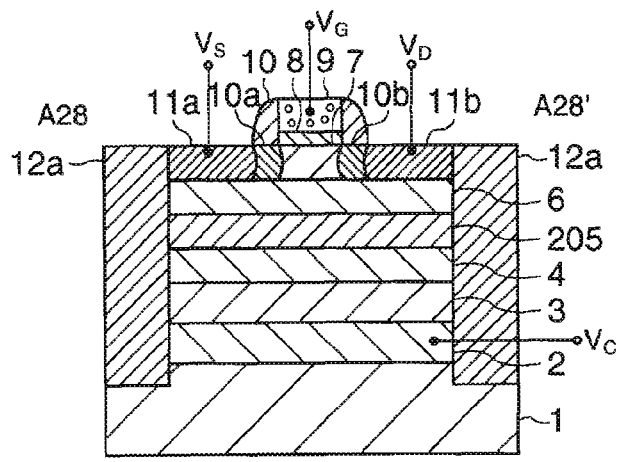
Figure 28C:
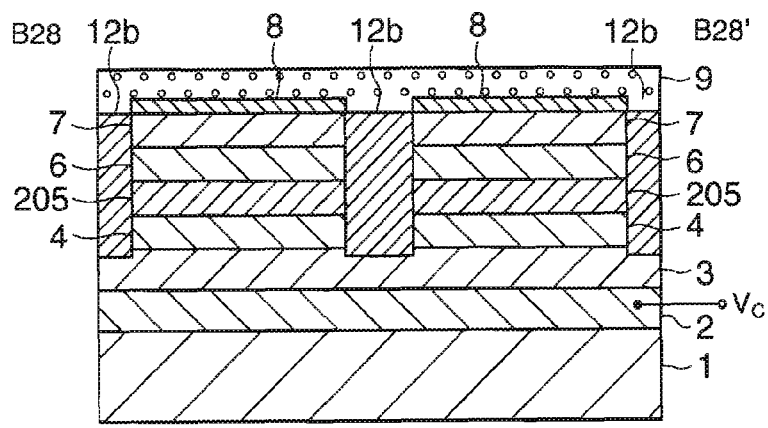

FIG. 28A is a plan view showing a schematic structure of a nonvolatile semiconductor memory device according to a fifth embodiment of the invention. FIG. 28B is a sectional view along the line A28-A28' in FIG. 28A. FIG. 28C is a sectional view along the line B28-B28' in FIG. 28A.

The electron injection layer 2 and the electron acceleration layer 3 are formed on the semiconductor substrate 1 in this order as shown in FIG. 28. A trap film 205 is formed above the electron acceleration layer 3 with the insulating layer 4 interposed therebetween. The semiconductor layer 7 is formed above the trap film 205 the insulating layer 6 interposed therebetween. The gate electrode 9 is formed above the semiconductor layer 7 with the gate insulating film 8 interposed therebetween. The side wall 10 is formed on the side face of the gate electrode 9. In the semiconductor layer 7, the source layer 11a and the drain layer 11b which are arranged so as to sandwich the gate electrode 9 are formed so as to interpose the LDD layers 10a, 10b therebetween.

The electron injection layer 2, the electron acceleration layer 3, the trap film 205 and the semiconductor layer 7 are isolated by the isolation insulating film 12a in the direction in which the gate electrode 9 extends. The trap film 205 and the semiconductor layer 7 are also isolated by the isolation insulating film 12b in the direction orthogonal to the direction in which the gate electrode 9 extends. Here, the electron injection layer 2, the electron acceleration layer 3 and the gate electrode may be arranged in parallel through more than one memory cell.

Single crystal semiconductor can be used for the semiconductor substrate 1, the electron injection layer 2, the electron acceleration layer 3 and the semiconductor layer 7. The trap film 205 can be made of either a silicon nitride film or a silicon oxide film. The semiconductor substrate 1, the electron injection layer 2, the electron acceleration layer 3 and the semiconductor layer 7 can be made of, for example, Si, Ge, SiGe, GaAs, InP, GaP, GaN, SiC and the like. The electron injection layer 2 can be the high-concentration N-type impurity diffusion layer and the electron acceleration layer 3 can be the low-concentration P-type impurity diffusion layer.

When data writing is performed, the voltage $V_G$ that is applied to the gate electrode 9, the voltage $V_S$ that is applied to the source layer 11a and the voltage $V_D$ that is applied to the drain layer 11b are all set to the high voltage $V_P$. At the same time, the voltage $V_C$ that is applied to the electron injection layer 2 is set to 0 V. Such high voltage $V_P$ of the writing can be set to any voltage value within a range of 5-20 V.

Consequently, a high electric filed is formed between the electron injection layer 2 and the trap film 205 in the direction toward the trap film 205 from the electron injection layer 2. Accordingly, electrons released from the electron injection layer 2 are accelerated in the electron acceleration layer 3 and then injected into the trap film 205 through the insulating layer 4. After the electrons are injected into the trap film 205, the electrons are retained by the trap film 205 because the peripheral of the trap film 205 is covered with the insulating layer. As a result, the threshold value of the channel region which is formed in the semiconductor layer 7 under the gate electrode 9 changes toward a positive value direction.

When data erasing is performed, the voltage $V_G$ that is applied to the gate electrode 9, the voltage $V_S$ that is applied to the source layer 11a and the voltage $V_D$ that is applied to the drain layer 11b are all set to 0 V. At the same time, the voltage $V_C$ that is applied to the electron injection layer 2 is set to the high voltage $V_E$. Such high voltage $T_E$ of the erasing can be, for example, set to any value within a range of 5-20 V.

Consequently, a high electric field is formed between the electron injection layer 2 and the trap film 205 in the direction toward the electron injection layer 2 from the trap film 205. Accordingly, the electrons accumulated in the trap film 205 are drawn into the electron injection layer 2 through the electron acceleration layer 3. As a result of the drawing out of the electrons from the trap film 205, the threshold value of the channel region which is formed in the semiconductor layer 7 under the gate electrode 9 changes toward a negative value direction.

When some information is stored in the nonvolatile semiconductor memory device shown in FIG. 28, for example, the threshold value which is equal to or larger than 0.2 V at the time of reading out can correspond to the logical value "0", and the threshold value which is equal to or smaller than −1.2 V at the time of the reading out can correspond to the logical value "1".

When the reading out is performed, the voltage $V_G$ that is applied to the gate electrode 9 is set to 0 V. And the voltage $V_S$ that is applied to the source layer 11a and the voltage $V_D$ that is applied to the drain layer 11b are set to 1 V or smaller than 1 V. At the same time, the voltage $V_C$ that is applied to the electron injection layer 2 is set to 0 V.

In case where the logical value "0" is stored in the nonvolatile semiconductor memory device at that point, the channel region under the gate electrode 9 is turned off since the threshold value of the reading out is equal to or larger than 0.2 V. Consequently, the source layer 11a becomes unconductive with the drain layer 11b. On the other hand, in case where the logical value "1" is stored in the nonvolatile semiconductor memory device at that point, the channel region under the gate electrode 9 is turned on since the threshold value of the reading is equal to or smaller than −1.2 V. Consequently, the source layer 11a becomes conductive with the drain layer 11b.

In the above-described way, it is possible to change the threshold value from the back side of the channel region by moving the electric charge accumulated in the trap film 205 and the information can be read out according to a variation in the electric potential (threshold value) of the gate electrode 9 at the time of on/off of the channel region. Therefore, there is no need to place the trap film 205 above the channel region where the gate electrode 9 is formed and it is possible to make the thinner gate insulating film 8 which is formed on the channel region and under the gate electrode 9. Accordingly, it is possible to lower the threshold value of the reading out in the nonvolatile semiconductor memory device. Consequently, the operation capacity of the nonvolatile semiconductor memory device can be improved and the nonvolatile semiconductor memory device can perform a high-speed data reading at a low voltage. Furthermore, it is also possible to lower the driving voltage of a sense amplifier. This means that it is possible to lower the driving voltage of the integrated circuit in which the nonvolatile semiconductor memory device is embedded.

Moreover, electric charge can be injected into or drawn out from the trap film 205 through the tunnel effect or hot carriers by controlling the voltage applied to the electron injection layer 2. Furthermore, according to the embodiment, it is possible to prevent that a high voltage is applied to the gate insulating film 8 when the data writing or erasing is performed because there is no need to place the electron injection layer 2 on the channel region. Therefore, the gate insulating film 8 can be made thinner. This makes it possible to lower the threshold voltage value of the data reading and to perform the electric writing and erasing at the lowered voltage level.

According to the embodiment, the trap film 205 is placed under the channel region that is formed in the semiconductor layer 7 under the gate electrode 9. Therefore, even when the amount of the electric charge that is injected into the trap film 205 is increased, the threshold value at the time of the reading is saturated so that it hardly changes. For example, if the gate length of the gate electrode 9 is 0.2 μm, the film thickness of the gate insulating film 8 is 6 nm in $SiO_2$ equivalent, the film thickness of the semiconductor layer 7 is 30 nm and the film thickness of the insulating layer 6 is 20 nm in SiO$_2$ equivalent, the threshold value at the time of the reading out can be saturated around 0.5 V or smaller than 0.5 even when the amount of the electric charge injected into the trap film 205 is increased. Consequently, it is possible to realize a nonvolatile semiconductor memory device that can operate at a low driving voltage of 1.5 V or smaller than 1.5 V at the time of reading out.

Meanwhile, even though the amount of the electric charge accumulated in the trap film 205 is same, the variation in the threshold value at the gate electrode 9 changes depending on the gate length of the gate electrode 9, the film thickness of the gate insulating film 8, the film thickness of the semiconductor layer 7 and the film thickness of the insulating layer 6. In other words, the variation in the threshold value at the time when the electric charge is accumulated in the trap film 205 becomes larger as the gate length of the gate electrode 9 gets longer, the film thickness of the gate insulating film 8 gets thicker and the film thickness of the semiconductor layer 7 and the insulating layer 6 become thinner.

However, even in the device in which the gate electrode 9 is formed of the N-type polycrystalline silicon, the gate length is about 0.2 μm, the film thickness of the gate insulating film 8 is about 1 nm in SiO$_2$ equivalent, the film thickness of the semiconductor layer 7 is about 5 nm and the film thickness of the insulating layer 6 is about 10 nm in SiO$_2$ equivalent, the drain current Id will be about $1\times10^{-4}$ A/μm when no electric charge is accumulated in the trap film 205 as long as the impurity concentration in a body area of the semiconductor layer 7 is $1\times10^{17}$ cm$^{-3}$, and as long as the voltage between the source and the drain is 1 V even though the voltage V$_G$ that is applied to the gate electrode 9 is 0 V. When electric charge is accumulated in the trap film 205, the drain current Id will be about $1\times10^{-12}$ A/μm if the voltage V$_G$ that is applied to the gate electrode 9 is 0 V. This means that the leak current at the time of OFF decreases by eight digits. In this case, it is also possible to saturate the threshold value of the reading out around 0.2-0.4 V even when the amount of the electric charge injected into the trap film 205 is increased.

Consequently, it is possible to realize the nonvolatile semiconductor memory device that can operate at the low driving voltage of 1.5 V or smaller than 1.5 V at the time of the read out. Though the gate length is 0.2 μm in the above-described embodiment, the gate length can be shorter than 0.2 μm and the device having such shorter gate length can obtain the same advantageous effect.

For example, in a case where the gate electrode 9 is formed of the N-type polycrystalline silicon and the gate length is as short as 30 nm, in the device in which the film thickness of the gate insulating film 8 is about 1 nm in SiO$_2$ equivalent, the film thickness of the semiconductor layer 7 is about 5 nm, the film thickness of the insulating layer 6 is about 10 nm in SiO$_2$ equivalent and the impurity concentration in the body area of the semiconductor layer 7 is $1\times10^{17}$ cm$^{-3}$, the drain current Id will be about $1\times10^{-4}$ A/μm or more when no electric charge is accumulated in the trap film 205 as long as the voltage between the source and the drain is 1 V or above even though the voltage V$_G$ that is applied to the gate electrode 9 is 0 V. When electric charge is accumulated in the trap film 20a, the drain current Id will be about $1\times10^{-11}$ A/μm if the voltage V$_G$ that is applied to the gate electrode 9 is 0 V and the voltage between the source and the drain is 1 V. This means that the leak current at the time of OFF decreases by about seven digits.

Sixth Embodiment

Figure 29:
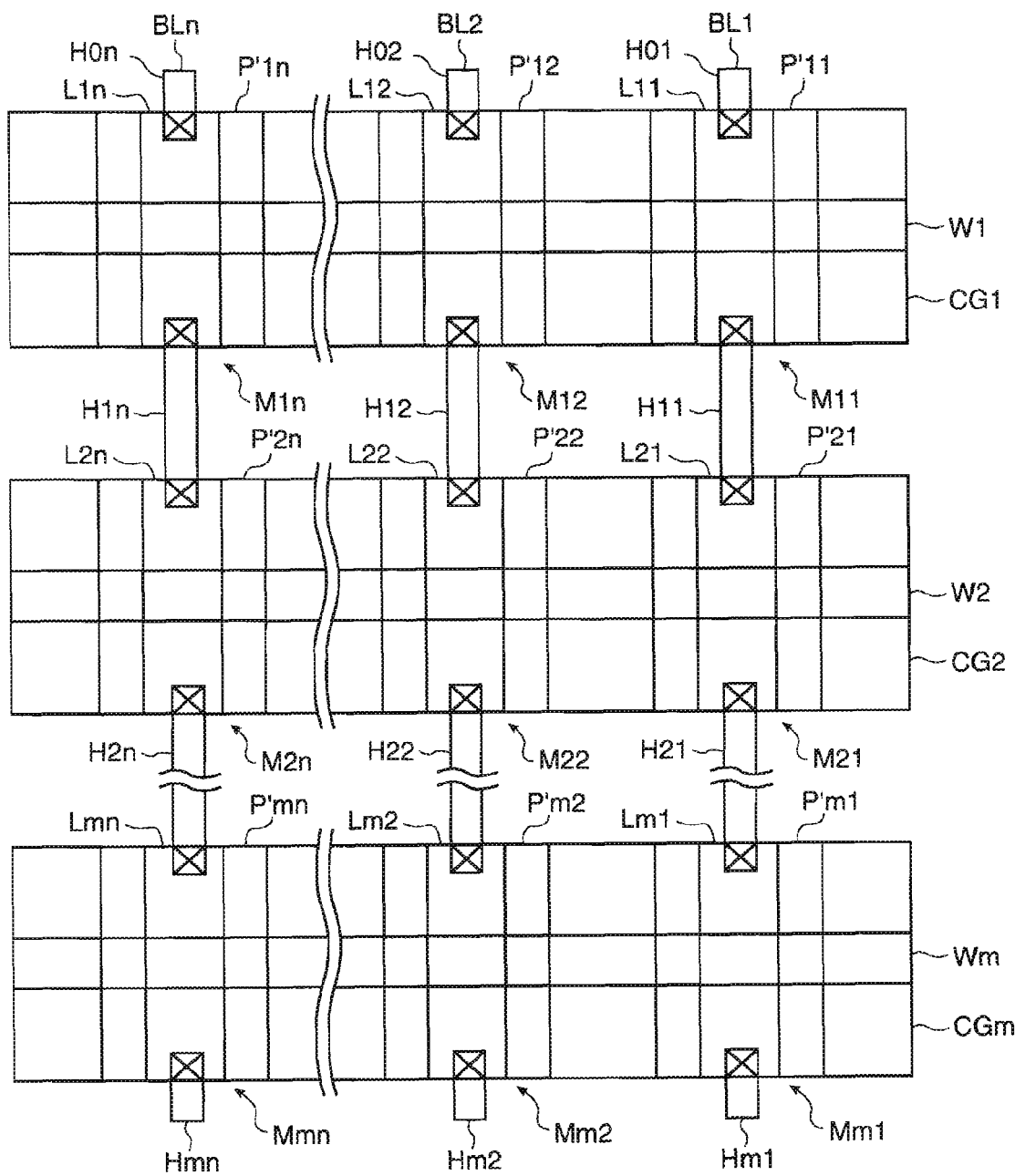
FIG. 29 is a plan view showing a layout of a nonvolatile semiconductor memory device according to a sixth embodiment of the invention.
Figure 30A:
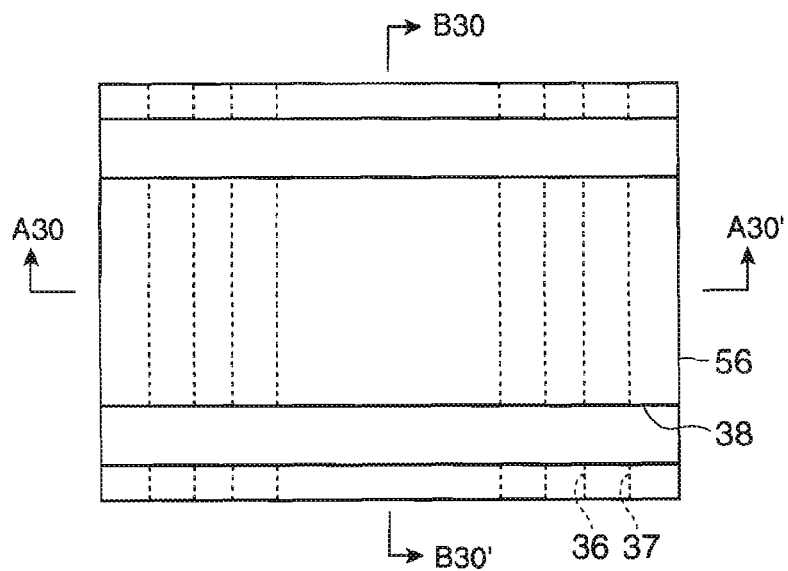
FIGS. 30A through 30C show a method of manufacturing a nonvolatile semiconductor memory device according to a seventh embodiment of the invention.
Figure 30B:
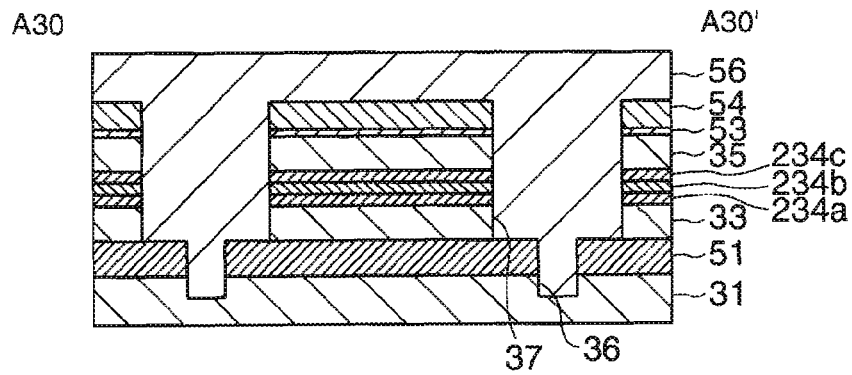
Figure 30C:
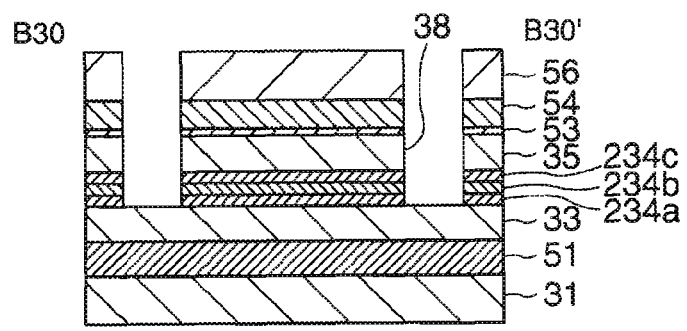

FIG. 29 is a plan view showing a layout example of the nonvolatile semiconductor memory device according to a sixth embodiment of the invention.

The memory cells M11-M1n, . . . , Mm1-Mmn are arrayed in matrix as shown in FIG. 29. Each of the memory cells M11-Mmn, . . . , Mm1-Mmn can have the structure shown in FIG. 28. The memory cells M11-M1n, . . . , Mm1-Mmn respectively have trap films P'11-P'1n, . . . , P'm1-P'mn and semiconductor layers L11-L1n, Lm1-Lmn that are correspondingly placed on the trap films P'11-P'1n, . . . , P'm1-P'mn. The word line W1 is formed so as to extend across the semiconductor layers L11, L12, . . . , L1n. The word line W2 is formed so as to extend across the semiconductor layers L21, L22, . . . , L2n and the word line Wm is formed so as to extend across the semiconductor layers Lm1, Lm2, . . . , Lmn.

The bit line BL1 is formed by coupling the semiconductor layers L11-Lm1 respectively through the wiring layers H01-Hm1. The bit line BL2 is formed by coupling the semiconductor layers L12-Lm2 respectively through the wiring layers H02-Hm2 and the bit line BLn is formed by coupling the semiconductor layers L1n-Lmn through the wiring layers H0n-Hmn.

The electron injection layer CG1 (hereinafter called the "control gate CG1") that serves as the control gate is formed so as to extend under the trap films P'11, P'12, . . . , P'1n. The electron injection layer CG2 (hereinafter called the "control gate CG2") that serves as the control gate is formed so as to extend under the trap films P'21, P'22, . . . , P'2n and the electron injection layer CGm (hereinafter called the "control gate CGm") that serves as the control gate is formed so as to extend under the trap films P'm1, P'm2, . . . , P'mn.

The circuit configuration of the nonvolatile semiconductor memory device shown in FIG. 29 is same as, for example, that of the nonvolatile semiconductor memory device shown in FIG. 3. As shown in FIG. 3, the memory cells M11-Mm1 are coupled each other on the bit line BL1, the selection transistor S11 is coupled in the front row and in the column of the memory cells M11-Mm1 and the selection transistor S21 is coupled in the last row and in the column of the memory cells M11-Mm1. The memory cells M12-Mm2 are coupled each other on the bit line BL2, the selection transistor S12 is coupled in the front row and in the column of the memory cells M12-Mm2 and the selection transistor S22 is coupled in the last row and in the column of the memory cells M12-Mm2. The memory cells M1n-Mmn are coupled each other on the bit line BLn, the selection transistor S1n is coupled in the front row and in the column of the memory cells M1n-Mmn and the selection transistor S2n is coupled in the last row and in the column of the memory cells M1n-Mmn. The sources of the selection transistors S21-S2n are commonly coupled to the source line SL. The selection gate SG1 is commonly provided on the selection transistors S11-S1n, and the selection gate SG2 is commonly provided on the selection transistors S21-S2n. The word line W1 and the control gate CG1 are commonly provided on the memory cells M11-M1n. The word line W2 and the control gate CG2 are commonly provided on the memory cells M21-M2n. The word line Wm and the control gate CGm are commonly provided on the memory cells Mm1-Mmn.

When data is written into selected memory cells M11-Mmn, for example, the high voltage V$_P$ is supplied to the word lines W1-Wm and the bit lines BL1-BLn that are coupled to the selected memory cells M11-Mmn, and 0 V is applied to the control gates CG1-CGm. At the same time, ½V$_P$ is supplied to the word lines W1-Wm, the bit lines BL1-BLn and the control gates CG1-CGm that are coupled to the unselected memory cells M1'-Mmn.

Consequently, a high electric field is formed between the control gates CG1-CGm of the selected memory cells M11-Mmn and the trap films P'11, P'12, P'mn of the selected memory cells M11-Mmn in the direction toward the trap films P'11, P'12, . . . , P'mn from the control gates CG1-CGm. The electrons released from the control gates CG1-CGm of the selected memory cells M11-Mmn are then injected into the trap films P'11, P'12, . . . , P'mn through the insulating layer 4. When the electrons are injected into the trap films P'11, P'12, . . . , P'mn of the selected memory cells M11-Mmn, the electrons are retained by the trap films P'11, P'12, . . . , P'mn. This sets the threshold value of the channel region that are formed in the semiconductor layer 7 under the word lines W1-Wm to the saturated threshold value (for example, 0.2 V) and it is possible to store the logical value "0" in the selected memory cells M11-Mmn.

On the other hand, the high electric field is not formed between the control gates CG1-CGm of the unselected memory cells M1'-Mmn and the trap films P'11, P'12, . . . , P'mn of the unselected memory cells M11-Mmn. Accordingly, electrons are not injected into the trap films P'11, P'12, . . . , P'mn of the unselected memory cells M11-Mmn and the amount of the electric charge accumulated in the trap films P'11, P'12, . . . , P'mn of the unselected memory cells M11-Mmn remains unchanged.

The voltage applied to the word lines W1-Wm coupled to the unselected memory cells M11-Mmn can be set according to the withstands voltage of the bit lines BL1-BLn coupled to the selected memory cells M11-Mmn with reference to the word lines W1-Wm. The value of such voltage can be adjusted within the range of, for example, $\frac{1}{2}V_p$-$\frac{4}{5}V_p$. The voltage applied to the word lines W1-Wm coupled to the selected memory cells M11-Mmn can be set according to the withstands voltage of the bit lines BL1-BLn coupled to the unselected memory cells M11-Mmn with reference to the word lines W1-Wm. The value of such voltage can be adjusted within the range of, for example, $\frac{1}{2}V_p$-$V_p$.

When erasing is performed, 0 V is applied to the all the word lines W1-Wm and the bit lines BL1-BLn of all the memory cells M11-Mmn, and the high voltage $V_E$ is applied to the control gates CG1-CGm.

Consequently, a high electric field is formed between all the control gates CG1-CGm of all the memory cells M11-Mmn and all the trap films P'11, P'12, P'mn of all the memory cells M11-Mmn in the direction toward the control gates CG1-CGm from the trap films P'11, P'12, . . . , P'mn. The electrons accumulated in the trap films P'11, P'12, . . . , P'mn are drawn into the control gates CG1-CGm. When the electrons have been drawn our from the trap films P'11, P'12, . . . , P'mn, the threshold value of the channel regions that are formed in the semiconductor layer 7 under all the word lines W1-Wmn of all the memory cells M11-Mmn is set to −1.2 V or smaller than −1.2 V. In this way, it is possible to store the logical value "1".

When data is read out from selected memory cells M11-Mmn, 0 V is applied to the word lines W1-Wm coupled to the selected memory cells M11-Mmn, 0 V is also applied to the control gates CG1-CGm, and 1 V is applied to the bit lines BL1-BLn coupled to the selected memory cells M11-Mmn. At the same time, 1.5 V is applied to the word lines W1-Wm that are coupled to the unselected memory cells M11-Mmn, and 0 V is applied to the control gates CG1-CGm and the bit lines BL1-BLn coupled to the unselected memory cells M11-Mmn.

In case where the logical value "0" is stored in the selected memory cells M11-Mmn, the channel regions under the word lines W1-Wm are turned off because the threshold value of the reading is 0.2 V. Accordingly, the selected memory cells M11-Mmn become unconductive. On the other hand, the channel regions in the unselected memory cells M11-Mmn are ON-state irrespective of the values stored in the unselected memory cells M11-Mmn because 1.5 V is applied to the word lines W1-Wm coupled to the unselected memory cells M11-Mmn. Consequently, the unconductive states of the selected memory cells M11-Mmn can be read out through the bit lines BL1-BLn.

In case where the logical value "1" is stored in the nonvolatile semiconductor memory device, the channel region under the word lines W1-Wm are turned on because the threshold value of the read out is −1.2 V or smaller than −1.2 V. Accordingly, the selected memory cells M11-Mmn become conductive. On the other hand, the channel regions in the unselected memory cells M11-Mmn are ON-state irrespective of the values stored in the unselected memory cells M11-Mmn because 1.5 V is applied to the word lines W1-Wm coupled to the unselected memory cells M11-Mmn. Consequently, the conductive states of the selected memory cells M11-Mmn can be read out through the bit lines BL1-BLn.

In this way, it is possible to form the NAND type flash memory in which the trap films P'11, P'12, . . . , P'mn are placed respectively under channel regions. In such flash memory, data is read out by setting the voltage of the bit lines BL1-BLn of the selected memory cells M11-Mmn to 1.0 V, setting the voltage of the word lines W1-Wm of the selected memory cells to 0 V, setting the voltage of the bit lines BL1-BLn of the unselected memory cells M11-Mmn to 0 V and setting the voltage of the word lines W1-Wm of the unselected memory cells to 1.5 V. Therefore, it is possible to lower the driving voltage and the threshold value at the time of the read out in the nonvolatile semiconductor memory device.

Seventh Embodiment

FIGS. 30A through 35A are plan views showing a method of manufacturing a nonvolatile semiconductor memory device according to a seventh embodiment of the invention. FIGS. 30B through 35B are sectional views along the line A30-A30' through A35-A35' correspondingly shown in FIGS. 30A through 35A. FIGS. 30C through 35C are sectional views along the line B30-B30' through B35-B35' correspondingly shown in FIGS. 30A through 35A. In the seventh embodiment, the manufacturing processes before the cavity 57 is formed between the electron acceleration layer 33 and the semiconductor layer 52 are same, for example, as those of the above-described third embodiment.

The electron injection layer 51 that is a high-concentration N-type impurity diffusion layer is formed in the semiconductor substrate 31 by performing the ion implantation which implants an N-type impurity such as P and As into the semiconductor substrate 31 as shown in FIG. 4. The electron acceleration layer 33 that is a low-concentration P-type impurity diffusion layer is formed on the electron injection layer 51 by performing the ion implantation which implants a P-type impurity such as B and $BF_2$ into the semiconductor substrate 31. Alternatively, the electron injection layer 51 may be formed by epitaxial growth of the semiconductor layer in which the N-type impurity is doped on the semiconductor substrate 31. The electron acceleration layer 33 may be formed by epitaxial growth of a semiconductor layer in which the P-type impurity is doped on the electron injection layer 51.

The semiconductor layer 52 and the semiconductor layer 35 are then sequentially grown on the electron acceleration layer 33 by epitaxy. The semiconductor layer 52 can be made of a material that has a larger etching rate than those of the semiconductor substrate 31 and the semiconductor layer 35. Particularly, in case where the semiconductor substrate 31 is made of Si, it is preferable that the semiconductor layer 52 be made of SiGe and the semiconductor layer 35 be made of Si. In this way, the lattice matching between the semiconductor layer 52 and the semiconductor layer 35 is possible and it is also possible to secure the selectivity between the semiconductor layer 52 and the semiconductor layer 35. Film thickness of the semiconductor layers 52, 35 can be, for example, about 1-100 nm.

Next, the base oxide film 53 is formed on the surface of the semiconductor layer 35 by oxidation of the semiconductor layer 35 or a CVD method. Subsequently, the antioxidant film 54 is formed on the whole face of the base oxide film 53 by the CVD method and the like. For example, a silicon nitride film can be used as the antioxidant film 54.

Next, as shown in FIG. 5, the groove 36 that exposes the semiconductor substrate 31 is formed in a predetermined direction by patterning the antioxidant film 54, the base oxide film 53, the semiconductor layers 35, 52, the electron acceleration layer 33, the electron injection layer 51 and the semiconductor substrate 31 with a photolithography technique or an etching technique. When the semiconductor substrate 31 is to be exposed, a concave portion is preferably formed in the semiconductor substrate 31 by over-etching the semiconductor substrate 31. The position of the groove 36 may correspond to a part of the isolation area of the semiconductor layer 33.

Furthermore, the groove 37 that exposes the electron injection layer 51 and has a larger width than that of the groove 36 is formed so as to overlap the groove 36 by patterning the antioxidant film 54, the base oxide film 53, the semiconductor layers 35a, 52 and the electron acceleration layer 33 by a photolithography technique or an etching technique. The position of the groove 37 may correspond to a part of the isolation area of the semiconductor layer 35.

The support member 56 that is buried in the grooves 36, 37 and supports the semiconductor layer 35 on the semiconductor substrate 31 is formed on the whole surface of the semiconductor substrate 31 as shown in FIG. 6. A silicon oxide film can be used for the support member 56.

Subsequently, as shown in FIG. 7, the groove 38 that exposes the electron acceleration layer 33 is formed in the direction orthogonal to the groove 36 by patterning the antioxidant film 54, the base oxide film 53 and the semiconductor layers 35, 52 by a photolithography technique or an etching technique. The position of the groove 38 may correspond to a part of the isolation area of the semiconductor layer 35.

Next, as shown in FIG. 8, the semiconductor layer 52 is removed so as to form the cavity 57 between the electron acceleration layer 33 and the semiconductor layer 52 by making an etching solution or an etching gas contact with the semiconductor layer 52 through the groove 38.

By providing the support member 56 in the grooves 36, 37 as described above, it is possible to support the semiconductor layer 35 on the semiconductor substrate 31 even after the semiconductor layer 52 is removed. Furthermore, by providing the groove 38 in addition to the grooves 36, 37, it is possible to make the etching solution contact with the semiconductor layer 52 formed under the semiconductor layer 35. Therefore, the insulation between the semiconductor layer 35 and the electron acceleration layer 33 can be made without impairing the crystal quality of the semiconductor layer 35.

In case where the semiconductor substrate 31 and the semiconductor layer 35 are made of Si and the semiconductor layer 52 is made of SiGe, fluoro-nitric acid is preferably used as the etching solution to etch the semiconductor layer 52. In this way, a selectivity ratio Si to SiGe will be 1:100-1000 and it makes it possible to remove the semiconductor layer 52 as well as preventing the semiconductor substrate 31 and the semiconductor layer 35 from being over-etched.

Next, as shown in FIG. 30, a surface oxide film 234c and a surface oxide film 234a are formed respectively on the top and bottom inner faces of the cavity 57 placed between the semiconductor substrate 31 and the semiconductor layer 33 by performing the thermal oxidation of the semiconductor layer 35 and the electron acceleration layer 33. When the surface oxide films 234c, 234a are formed by the thermal oxidation of the semiconductor layer 35 and the electron acceleration layer 33, the semiconductor layer 35 in the groove 38 is oxidized and the oxide film 39 is formed on the inner side wall of the groove 38.

Subsequently, a trap film 234b is formed in the cavity 57 by forming the trap film 234b in the cavity 57 in which the surface oxide films 234c, 234a are formed by the ALD method, the CVD method and the like. The trap film 234b can be made of, for example, a silicon nitride film, a silicon oxide nitride film and the like.

In this way, the trap film 234b can be placed under the channel region formed in the semiconductor layer 35. Furthermore, by forming the electron injection layer 51 on the semiconductor substrate 31, it is possible to make the electron injection layer 51 serve as the control gate that injects electric charge into the trap film 234b and draws out electric charge from the trap film 234b. Accordingly, the control gate can be placed under the trap film 234b. Therefore, it is possible to control the amount of the electric charge accumulated in the f trap film 234b even though the trap film 234b is not placed on the channel region formed in the semiconductor layer 35. Consequently, it is possible to realize the nonvolatile semiconductor memory device that can perform the electric writing and erasing and in which the threshold voltage of the reading is lowered.

In the above-described method with reference to FIG. 30, the surface oxide films 234c, 234a that are respectively placed on the top and bottom inner faces of the cavity 57 are formed by the thermal oxidation of the semiconductor layer 35 and the electron acceleration layer 33. However, they may be formed by forming insulating films on the top and bottom inner faces of the cavity 57 by the ALD method or the CVD method. In the forming step shown in FIG. 30, the surface oxide films 234c, 234a and the trap film 234b are also formed on the side wall and the bottom of the groove 38. These surface oxide films 234c, 234a and the trap film 234b formed in the groove 38 are removed by performing an isotropic etching and an anisotropic etching in which the support member 56 is used as a mask.

Figure 31A:
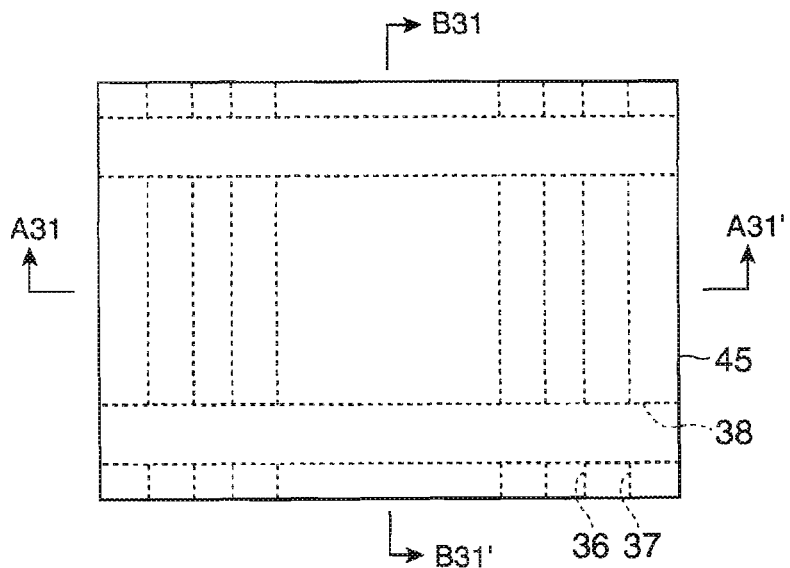
FIGS. 31A through 31C show the method of manufacturing a nonvolatile semiconductor memory device according to the seventh embodiment.
Figure 31B:
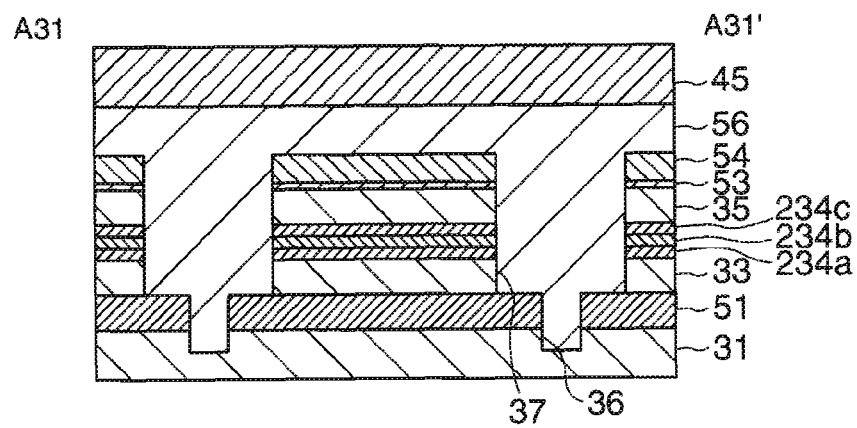
Figure 31C:
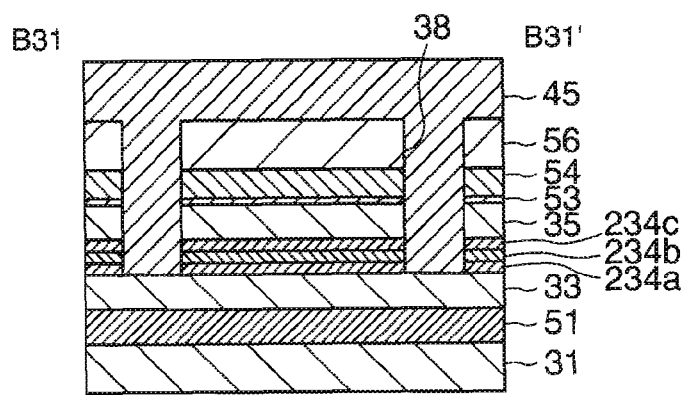

Next, the buried insulating member 45 is deposited on the support member 56 so as to fill in the groove 38 by the CVD method and the like as shown in FIG. 31. A silicon oxide film can be used as the buried insulating member 45.

Figure 32A:
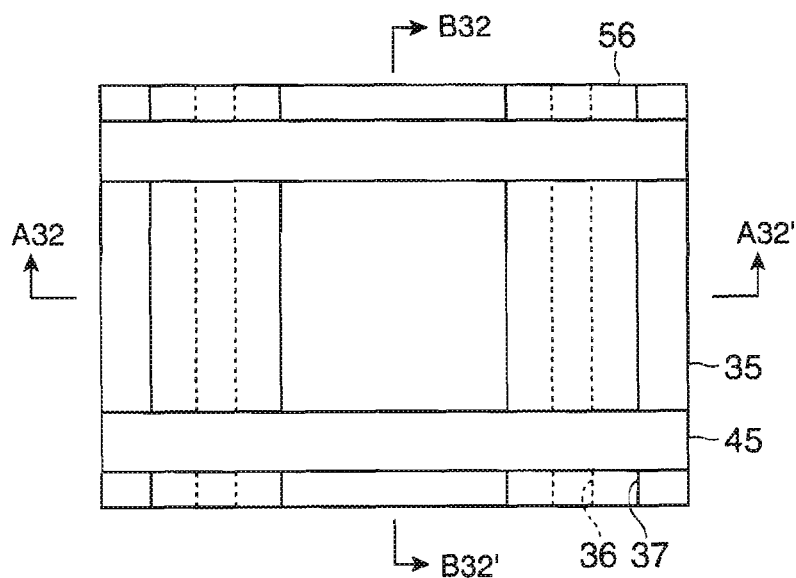
FIGS. 32A through 32C show the method of manufacturing a nonvolatile semiconductor memory device according to the seventh embodiment.
Figure 32B:
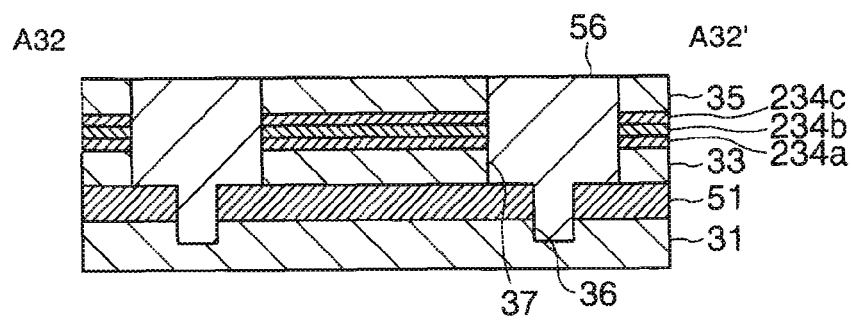
Figure 32C:
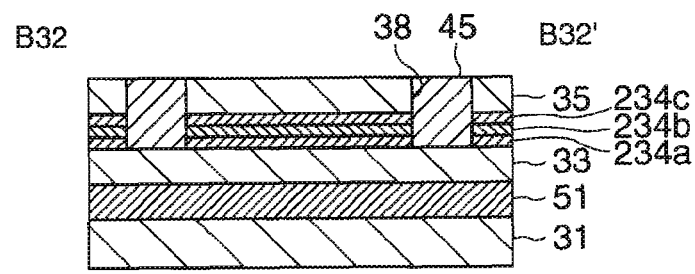

The buried insulating member 45 and the support member 56 are then made thinner by performing CMP and the like, and the surface of the semiconductor layer 35 is exposed by removing the antioxidant film 54 and the base oxide film 53 as shown in FIG. 32.

Figure 33A:
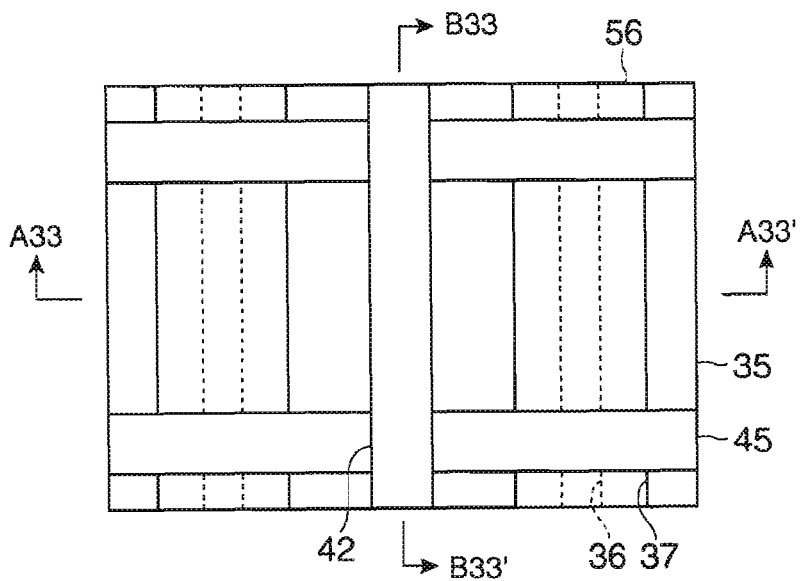
FIGS. 33A through 33C show the method of manufacturing a nonvolatile semiconductor memory device according to the seventh embodiment.
Figure 33B:
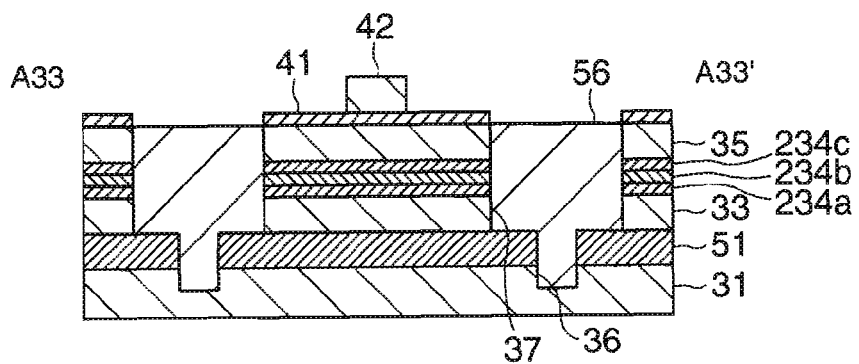
Figure 33C:
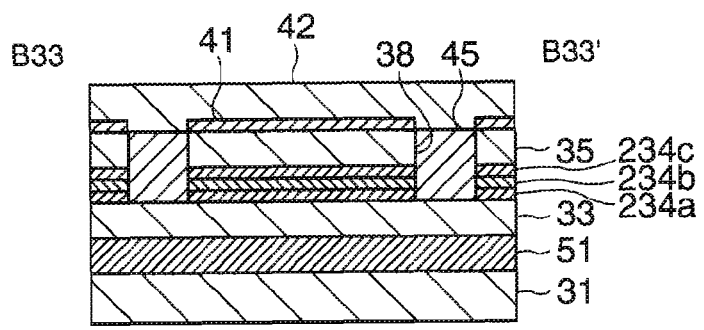

Next, the gate insulating film 41 is formed on the surface of the semiconductor layer 35 by performing thermally oxidization, the ALD or the CVD of the surface of the semiconductor layer 35 as shown in FIG. 33. Subsequently, a polycrystalline silicon layer, a silicide layer or a metal layer is formed on the semiconductor layer 35 on which the gate insulating film 41 is formed by a CVD method and the like. The gate electrode 42 is then formed on the semiconductor layer 35 by patterning the polycrystalline silicon layer, the silicide layer or the metal layer with a photolithography technique or an etching technique.

Figure 34A:
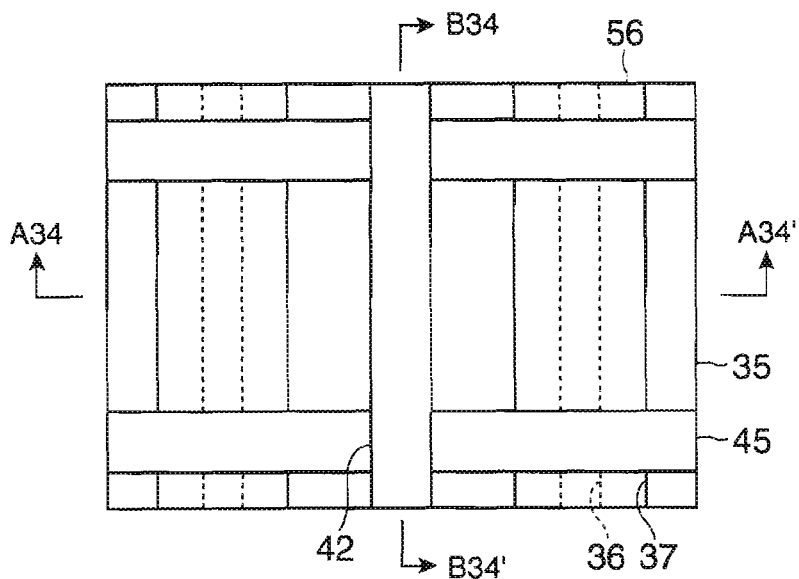
FIGS. 34A through 34C show the method of manufacturing a nonvolatile semiconductor memory device according to the seventh embodiment.
Figure 34B:
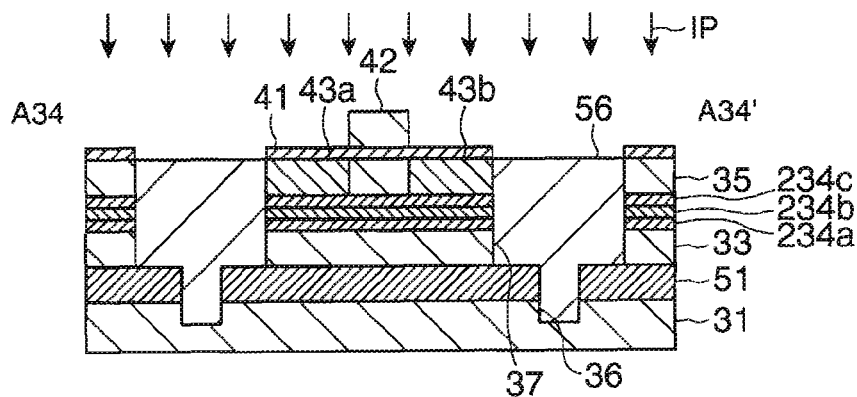
Figure 34C:
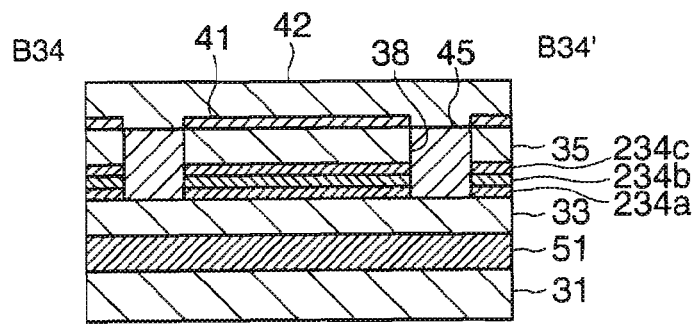
Figure 35A:
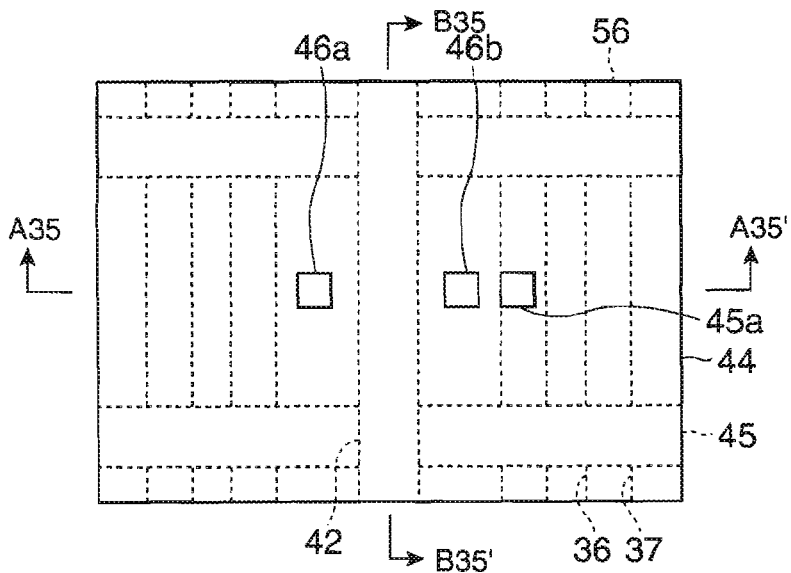
FIGS. 35A through 35C show the method of manufacturing a nonvolatile semiconductor memory device according to the seventh embodiment.
Figure 35B:
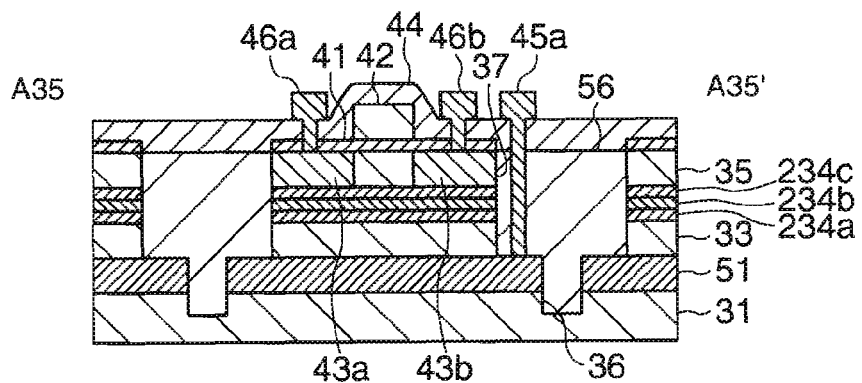
Figure 35C:
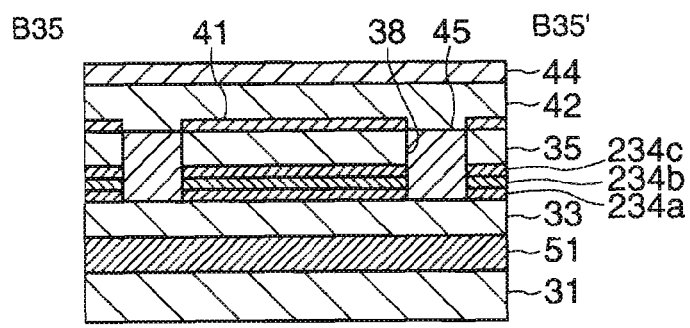
Figure 36A:
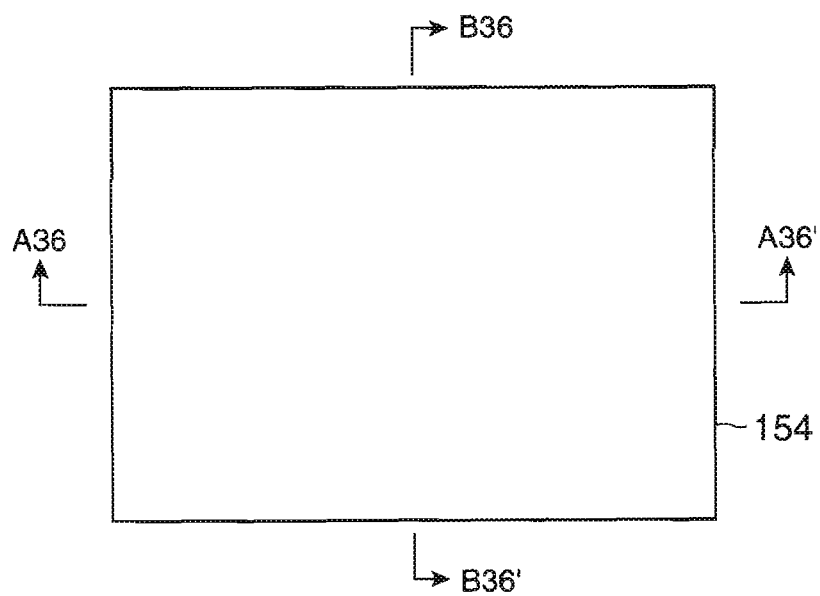
FIGS. 36A through 36C show a method of manufacturing a nonvolatile semiconductor memory device according to an eighth embodiment of the invention.
Figure 36B:
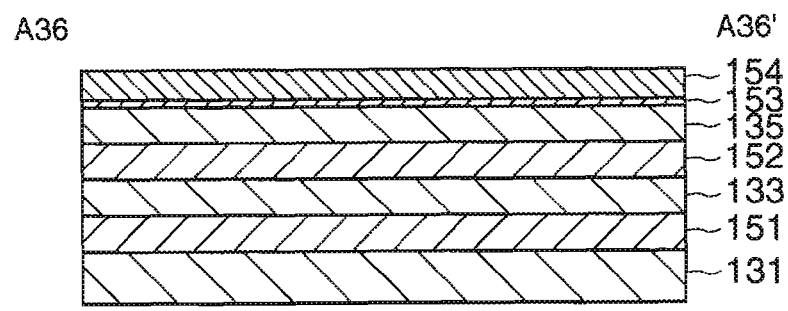
Figure 36C:
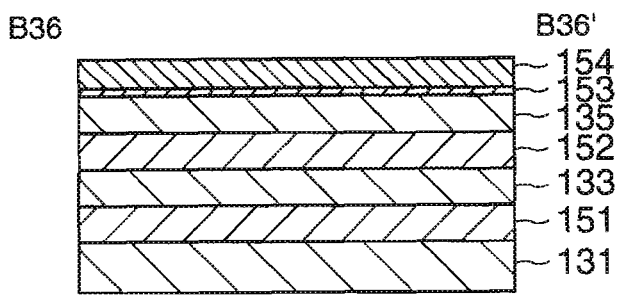

Next, the ion injection IP which injects an impurity such as As, P, B and $BF_2$ into the semiconductor layer 35 is performed by using the gate electrode 42 as a mask, and the source layer 43$a$ and the drain layer 43$b$ that are placed so as to interpose the gate electrode 42 therebetween is formed in the semiconductor layer 35 as shown in FIG. 34.

The interlayer insulating layer 44 is then deposited on the gate electrode 42 by a CVD method and the like, as shown in FIG. 35. Subsequently, the control gate contact electrode 45$a$ is formed on the interlayer insulating layer 44. The control gate contact electrode 45$a$ is formed so as to be buried in the interlayer insulating layer 44 and the support member 56 and coupled to the electron injection layer 51. At the same time, the source contact electrode 46$a$ and the drain contact electrode 46$b$ are formed so as to be buried in the interlayer insulating layer 44 and on the interlayer insulating layer 44. The source contact electrode 46$a$ is coupled to the source layer 43$a$ and the drain contact electrode 46$b$ is coupled to the drain layer 43$b$.

In this way, it is possible to form the SOI transistor on the semiconductor layer 35 without using a SOI substrate. Furthermore., it is possible to place the trap film 234$b$ under the channel region formed in the semiconductor layer 35 and to control the amount of the electric charge accumulated in the trap film 234$b$ by the electron injection layer 51. Accordingly, there is no need to place the trap film 234$b$ on the channel region where the gate electrode 42 is formed. This makes it possible to form the thinner gate insulating film 41 on the channel region and under the gate electrode 42. As a result, it is possible to lower the threshold value of the reading out in the nonvolatile semiconductor memory device. Consequently, the operation capacity of the nonvolatile semiconductor memory device can be improved and the nonvolatile semiconductor memory device can perform a high-speed data reading at a low voltage.

Eighth Embodiment

FIGS. 36A through 47A are plan views showing a method of manufacturing a nonvolatile semiconductor memory device according to a eighth embodiment of the invention. FIGS. 36B through 47B are sectional views along the line A36-A36' through A47-A47' correspondingly shown in FIGS. 36A through 47A. FIGS. 36C through 47C are sectional views along the line B36-B36' through B47-B47' correspondingly shown in FIGS. 36A through 47A.

As shown in FIG. 36, the semiconductor layers 151, 133, 152, 135 are sequentially formed on the semiconductor substrate 131 so as to stack in layers by epitaxial growth. The semiconductor layers 151, 152 can be made of a material that has a larger etching rate than that of the material for the semiconductor substrate 131 and the semiconductor layers 133, 135. Particularly when the semiconductor substrate 131 is made of Si, it is preferable that the semiconductor layers 151, 152 be made of SiGe and the semiconductor layers 133, 135 be made of Si.

Next, the base oxide film 153 is formed on the surface of the semiconductor layer 135 by oxidation of the semiconductor layer 135 or a CVD method. Subsequently, the antioxidant film 154 is formed on the whole face of the base oxide film 153 by a CVD method and the like.

Figure 37A:
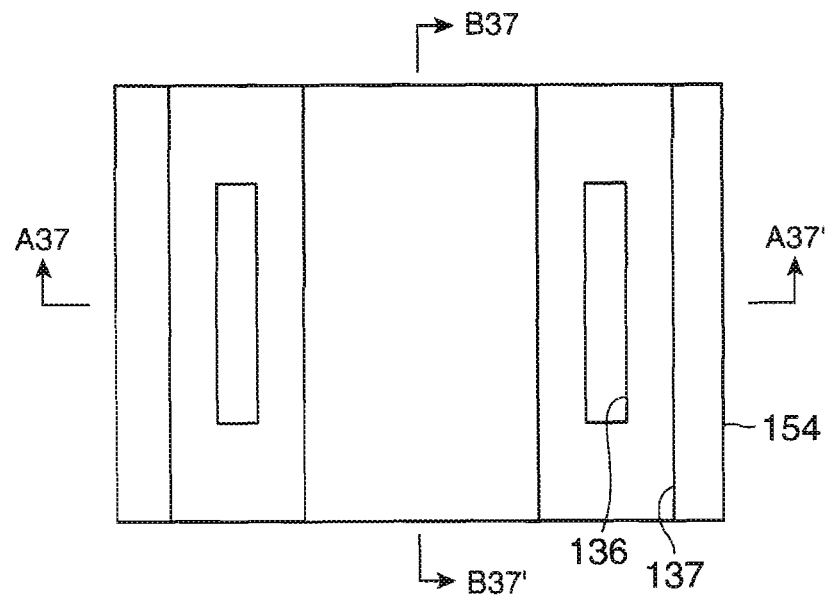
FIGS. 37A through 37C show the method of manufacturing a nonvolatile semiconductor memory device according to the eighth embodiment.
Figure 37B:
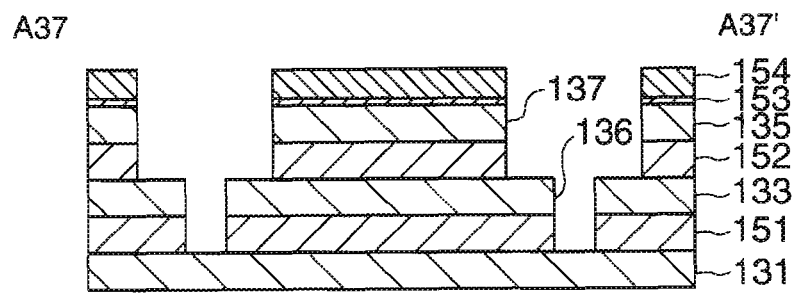
Figure 37C:
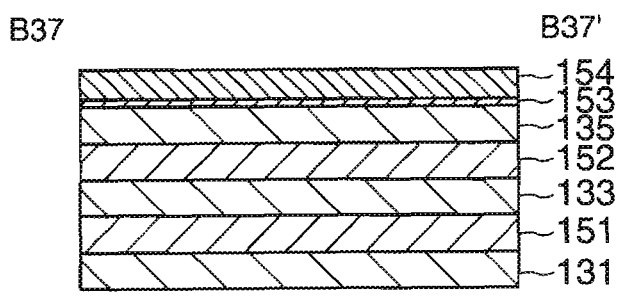

Next, as shown in FIG. 37, the groove 136 that exposes the semiconductor substrate 131 is formed so as to extend in a predetermined direction by patterning the antioxidant film 154, the base oxide film 153 and the semiconductor layers 135, 152, 133, 151 with a photolithography technique or an etching technique.

Furthermore, the groove 137 that has a larger width than that of the groove 136 and exposes the semiconductor layer 133 is formed so as to overlap the groove 136 by patterning the antioxidant film 154, the base oxide film 153 and the semiconductor layers 135, 152 by a photolithography technique or an etching technique.

Figure 38A:
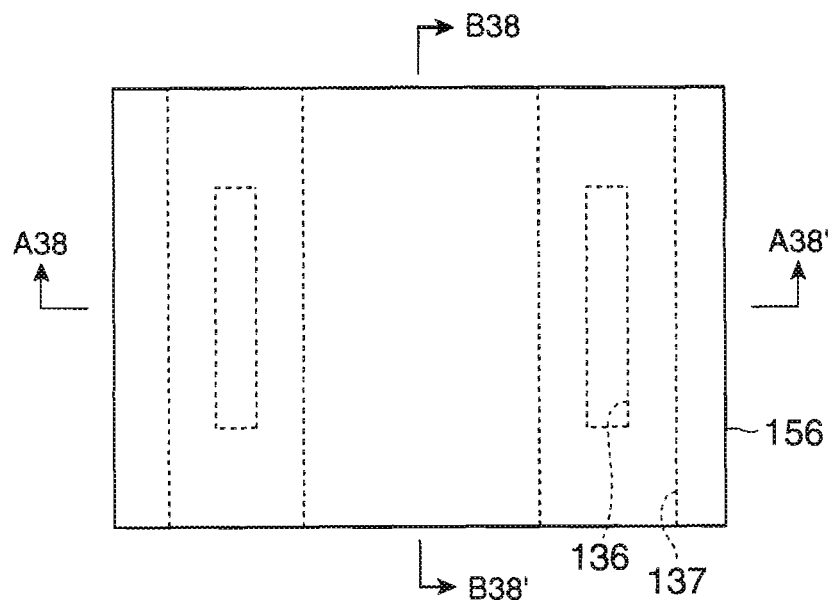
FIGS. 38A through 38C show the method of manufacturing a nonvolatile semiconductor memory device according to the eighth embodiment.
Figure 38B:
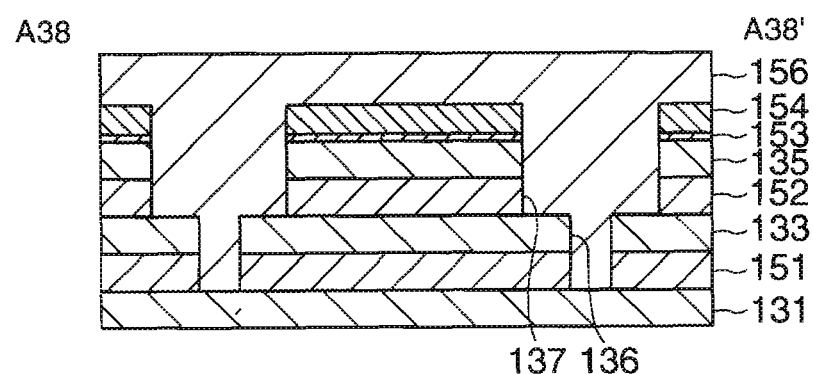
Figure 38C:
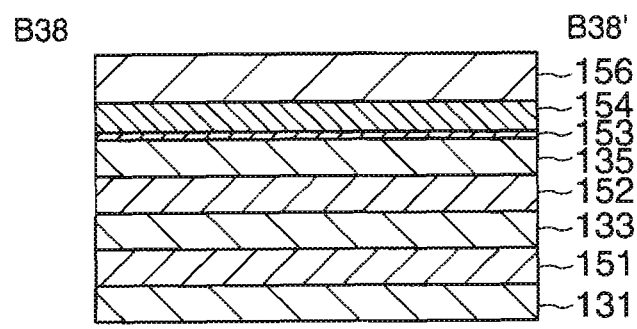

The support member 156 that is buried in the grooves 136, 137 and supports the semiconductor layers 133, 135 on the semiconductor substrate 131 is then formed on the whole surface of the semiconductor substrate 131 as shown in FIG. 38.

Figure 39A:
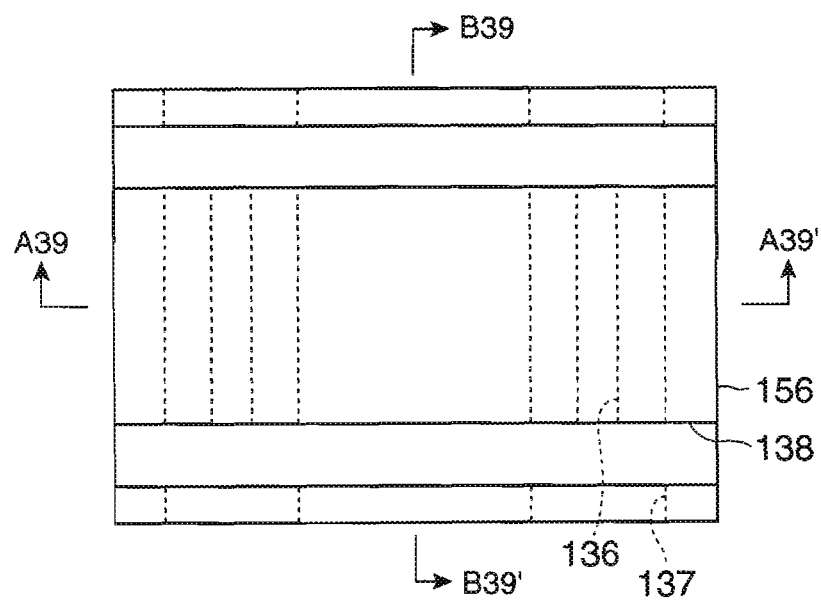
FIGS. 39A through 39C show the method of manufacturing a nonvolatile semiconductor memory device according to the eighth embodiment.
Figure 39B:
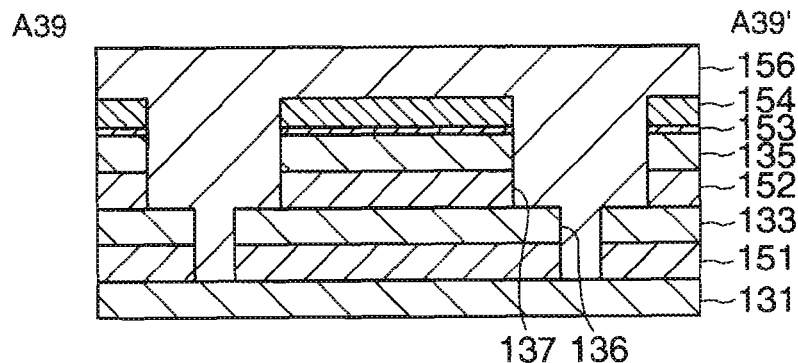
Figure 39C:
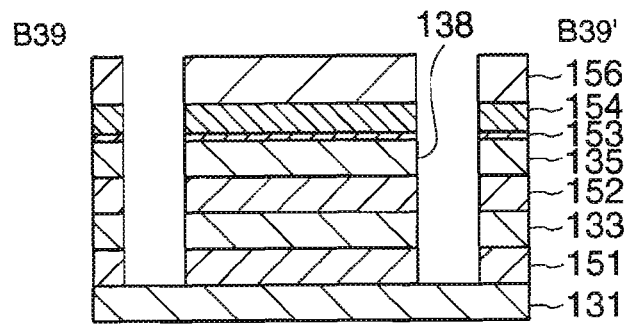

Subsequently, as shown in FIG. 39, the groove 138 that exposes the semiconductor substrate 131 is formed in the direction orthogonal to the groove 136 by patterning the antioxidant film 154, the base oxide film 153 and the semiconductor layers 135, 152, 133, 151 by a photolithography technique or an etching technique.

Figure 40A:
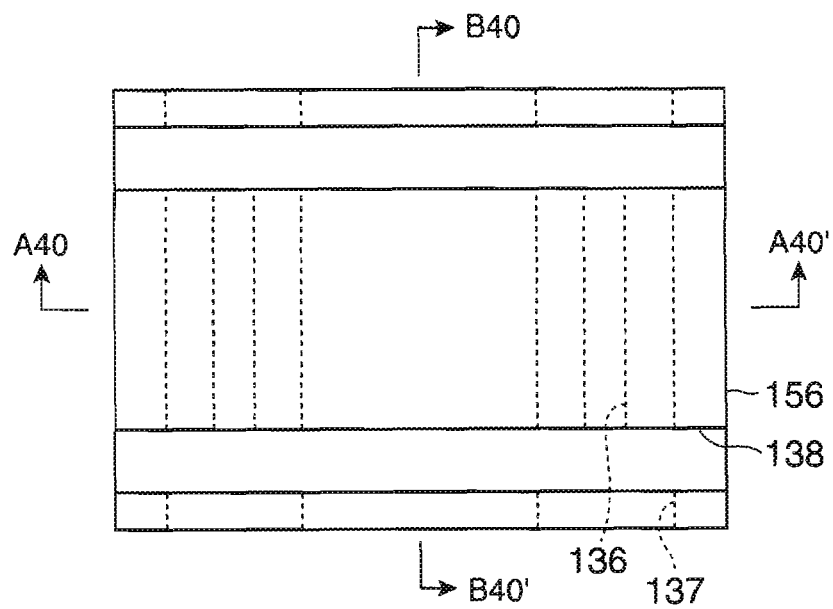
FIGS. 40A through 40C show the method of manufacturing a nonvolatile semiconductor memory device according to the eighth embodiment.
Figure 40B:
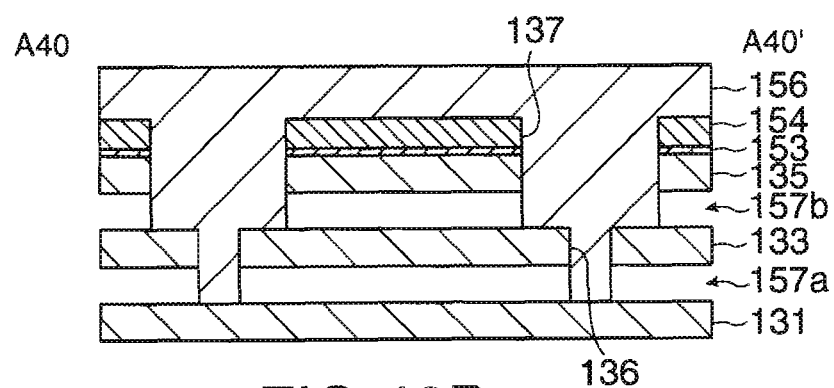
Figure 40C:
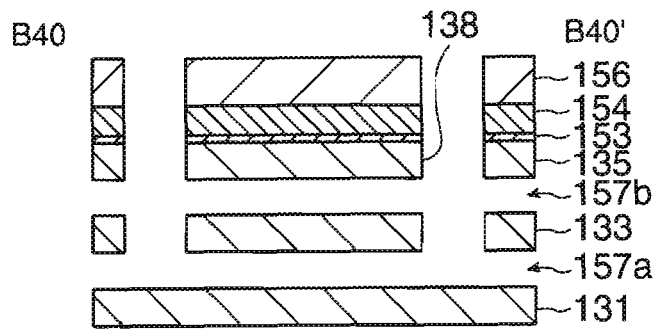

Next, as shown in FIG. 40, the semiconductor layers 151, 152 are removed by an etching process in which an etching solution or an etching gas contacts with the semiconductor layers 151, 152 through the groove 138. Consequently, the cavity 157$a$ is formed between the semiconductor substrate 131 and the semiconductor layer 133 and the cavity 157$b$ is formed between the semiconductor layer 133 and the semiconductor layer 135.

Figure 41A:
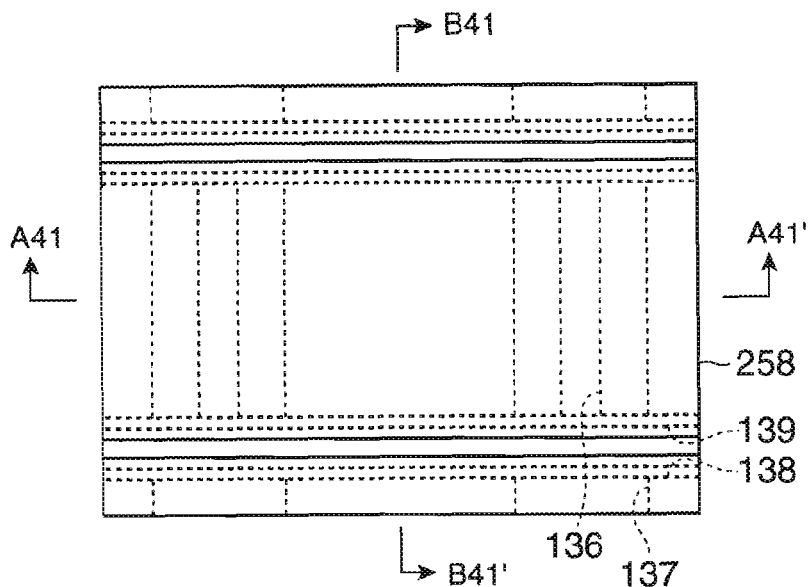
FIGS. 41A through 41C show the method of manufacturing a nonvolatile semiconductor memory device according to the eighth embodiment.
Figure 41B:
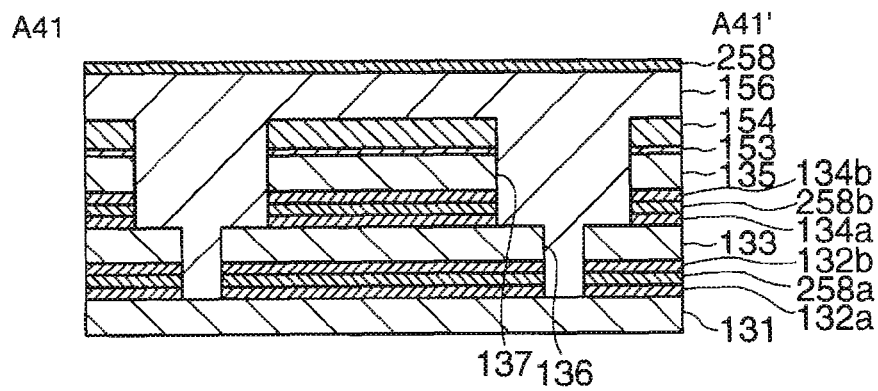
Figure 41C:
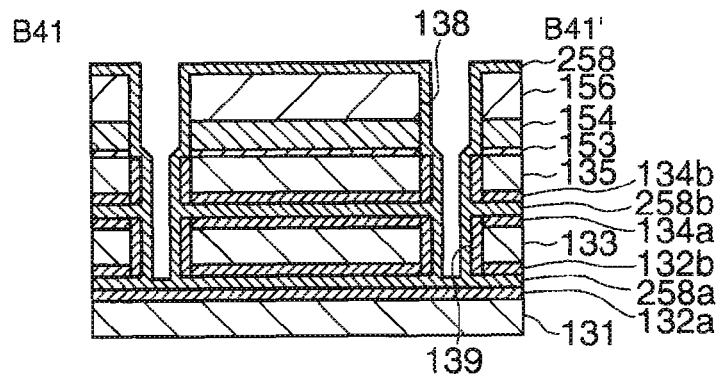

Next, as shown in FIG. 41, surface oxide films 132$b$, 132$a$, 134$b$, 134$a$ are formed by performing thermal oxidation of the semiconductor substrate 131 and the semiconductor layers 133, 135. The surface oxide film 132$b$ and the surface oxide film 132$a$ are formed respectively on the top and bottom inner faces of the cavity 157$a$ placed between the semiconductor layer 131 and the semiconductor layer 133. The surface oxide film 134$b$ and the surface oxide film 134$a$ are formed respectively on the top and bottom inner faces of the cavity 157$b$ placed between the semiconductor layer 133 and the semiconductor layer 135. Furthermore, when the surface oxide films 132$b$, 132$a$, 134$b$, 134$a$ are formed by performing the thermal oxidation of the semiconductor substrate 131 and the semiconductor layers 133, 135, the semiconductor substrate 131 and the semiconductor layers 133, 135 in the groove 138 are oxidized and the oxide film 139 is formed on the inner side wall of the groove 138.

Subsequently, trap films 258$a$, 258$b$ are respectively formed so as to fill the cavities 157$a$, 157$b$ by forming the trap films 258$a$, 258$b$ in the cavities 157$a$, 157$b$ by an ALD method, a CVD method and the like. When the trap films 258$a$, 258$b$ are formed in the cavities 157$a$, 157$b$, a trap film 258 is simultaneously formed on the support member 156 and on the side walls of the semiconductor layers 133, 135.

Figure 42A:
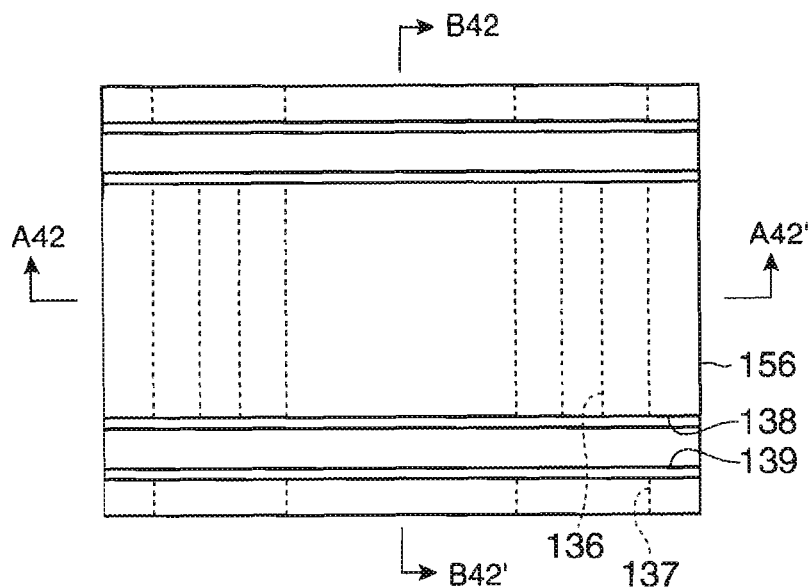
FIGS. 42A through 42C show the method of manufacturing a nonvolatile semiconductor memory device according to the eighth embodiment.
Figure 42B:
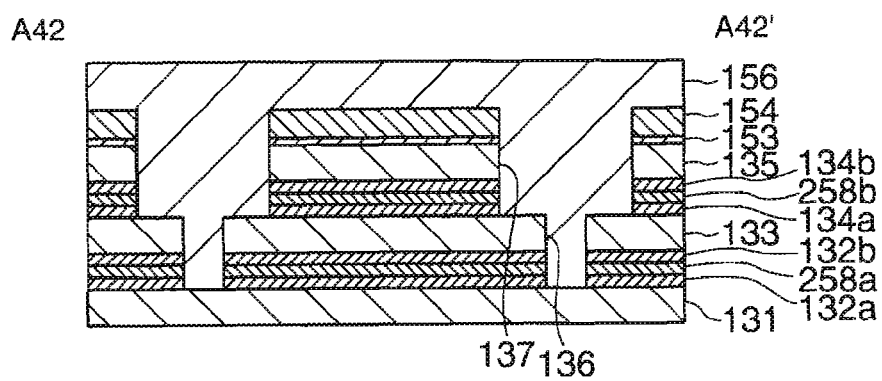
Figure 42C:
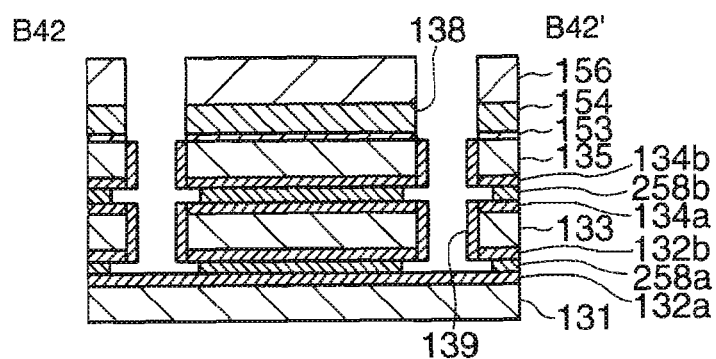

Next, the trap film 258 is etched by an isotropic etching method such as wet etching and plasma etching. The trap film 258 that exists on the surface of the support member 156 and on the side walls of the semiconductor layers 133, 135 is removed by the etching while leaving the trap films 258$a$, 258$b$ that exist in the cavities 157$a$, 157$b$ as they are as shown in FIG. 42. As a result of the etching, the support member 156 and the oxide film 139 are exposed.

In this way, the trap film 258b can be placed under the channel region formed in the semiconductor layer 135. Furthermore, it is possible to make the semiconductor layer 133 serve as the control gate that injects electric charge into the trap film 258b and draws out electric charge from the trap film 258b. Accordingly, the control gate can be placed under the trap film 258b. Therefore, it is possible to control the amount of the electric charge accumulated in the trap film 258b even though the trap film 258b is not placed on the channel region formed in the semiconductor layer 135. Consequently, it is possible to realize the nonvolatile semiconductor memory device that can perform the electric writing and erasing and in which the threshold voltage of the reading is lowered.

Figure 43A:
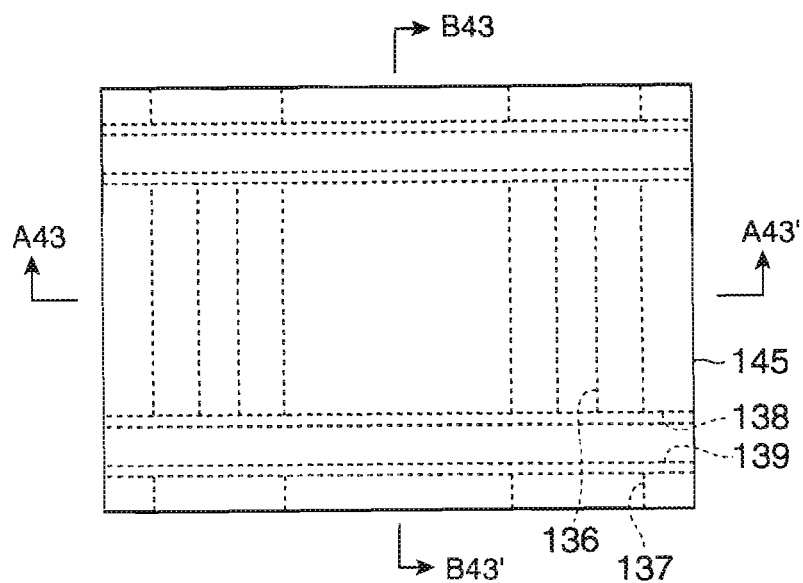
FIGS. 43A through 43C show the method of manufacturing a nonvolatile semiconductor memory device according to the eighth embodiment.
Figure 43B:
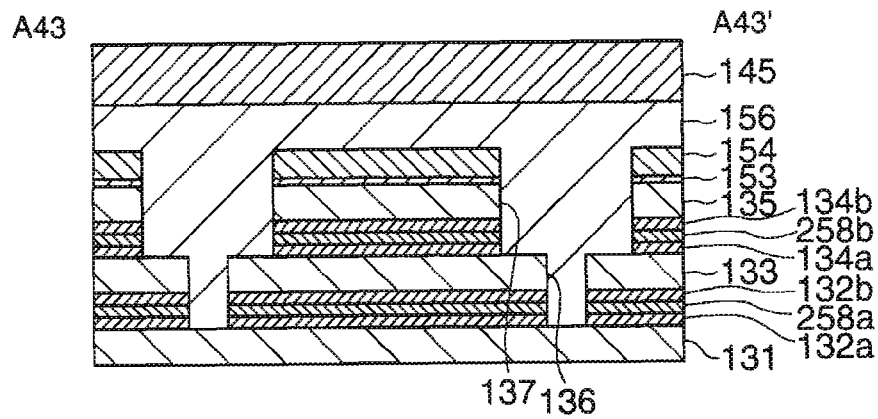
Figure 43C:
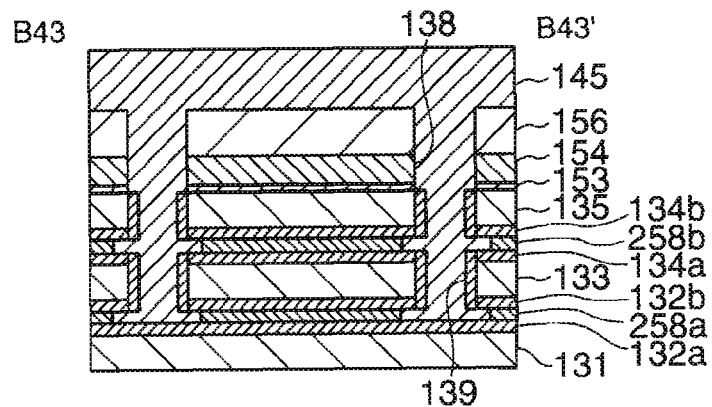

Next, the buried insulating member 145 is deposited on the support member 156 so as to fill the groove 138 by a CVD method and the like as shown in FIG. 43. A silicon oxide film can be used as the buried insulating member 145.

Figure 44A:
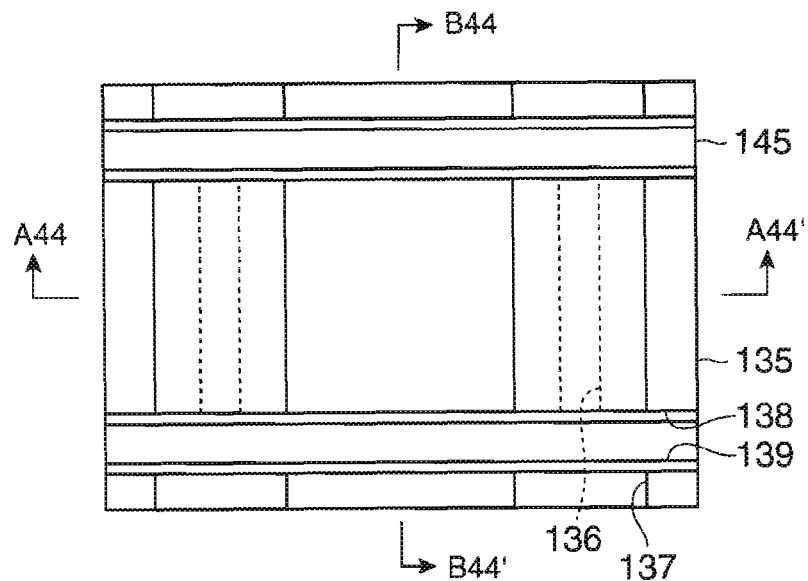
FIGS. 44A through 44C show the method of manufacturing a nonvolatile semiconductor memory device according to the eighth embodiment.
Figure 44B:
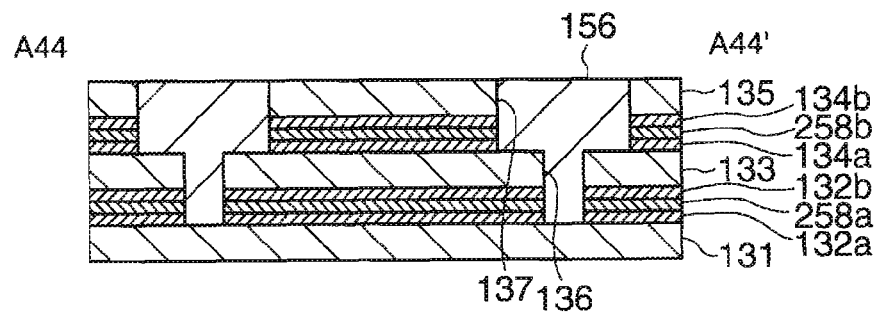
Figure 44C:
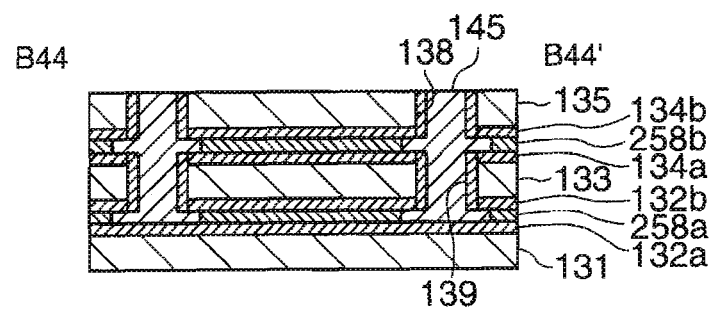

The buried insulating member 145 and the support member 156 are then made thinner by adopting CMP and the like, and the surface of the semiconductor layer 135 is exposed by removing the antioxidant film 154 and the base oxide film 153 as shown in FIG. 44.

Figure 45A:
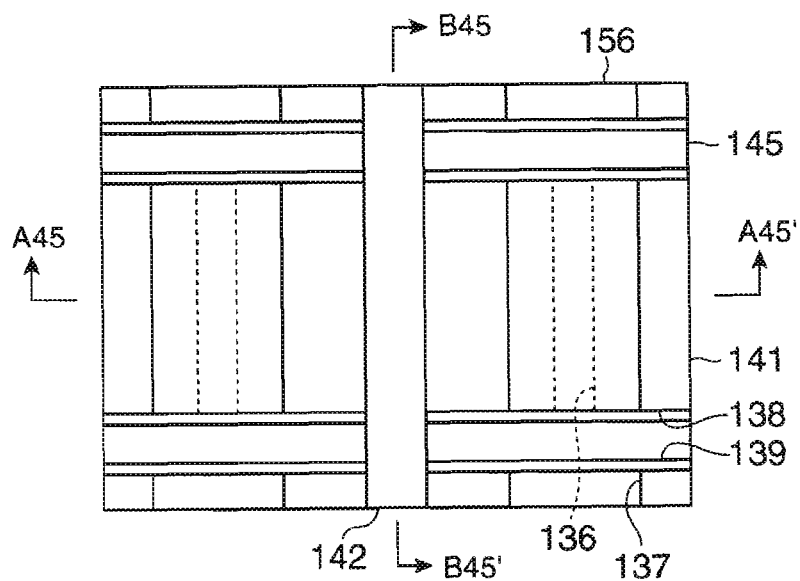
FIGS. 45A through 45C show the method of manufacturing a nonvolatile semiconductor memory device according to the eighth embodiment.
Figure 45B:
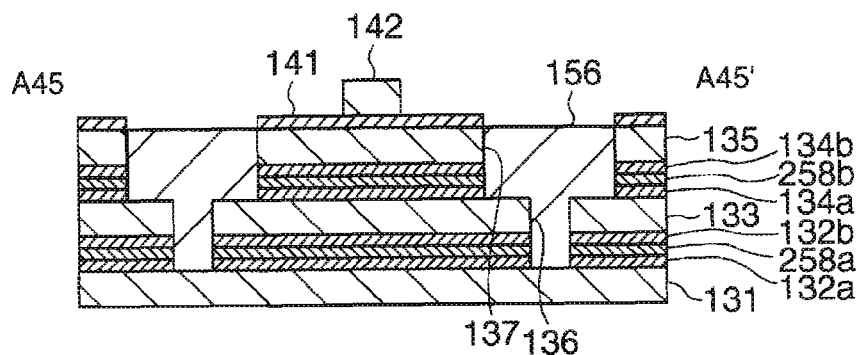
Figure 45C:
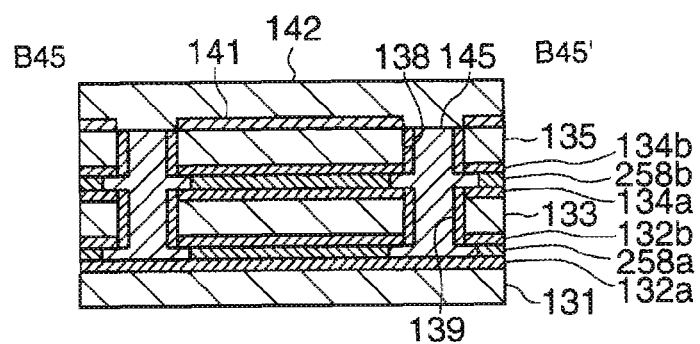

Next, the gate insulating film 141 is formed on the surface of the semiconductor layer 135 by performing thermal oxidization, ALD or CVD of the surface of the semiconductor layer 135 as shown in FIG. 45. Subsequently, a polycrystalline silicon layer, a silicide layer or a metal layer is formed on the semiconductor layer 135 on which the gate insulating film 141 is formed by a CVD method and the like. The gate electrode 142 is then formed on the semiconductor layer 135 by patterning the polycrystalline silicon layer, the silicide layer or the metal layer with a photolithography technique or an etching technique.

Figure 46A:
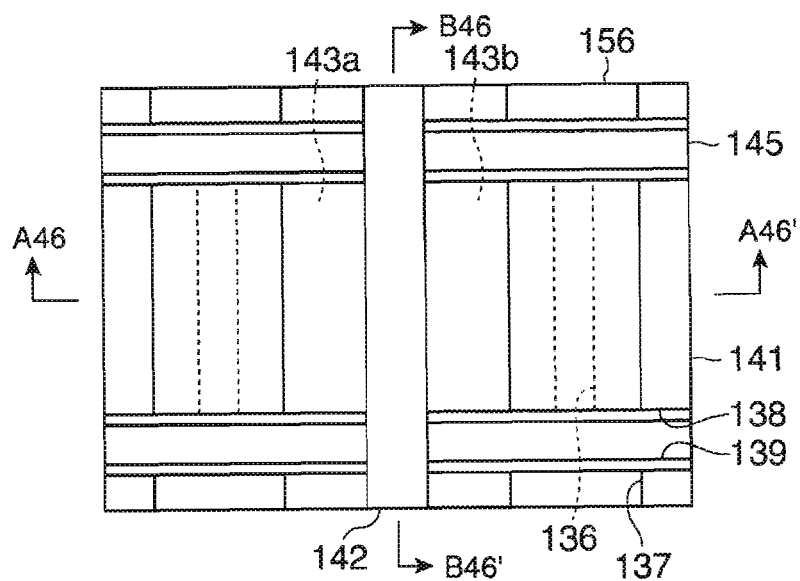
FIGS. 46A through 46C show the method of manufacturing a nonvolatile semiconductor memory device according to the eighth embodiment.
Figure 46B:
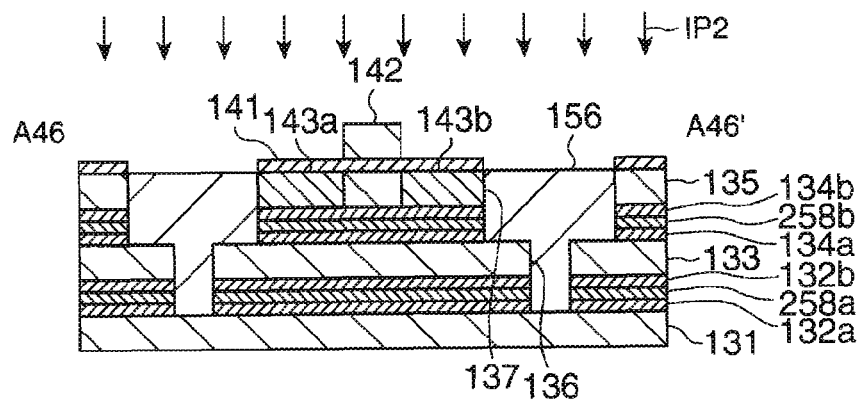
Figure 46C:
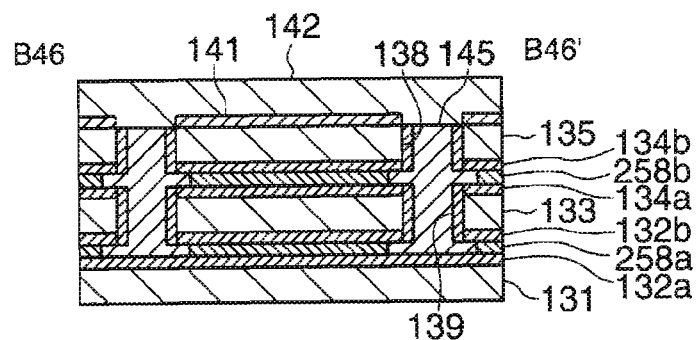
Figure 47A:
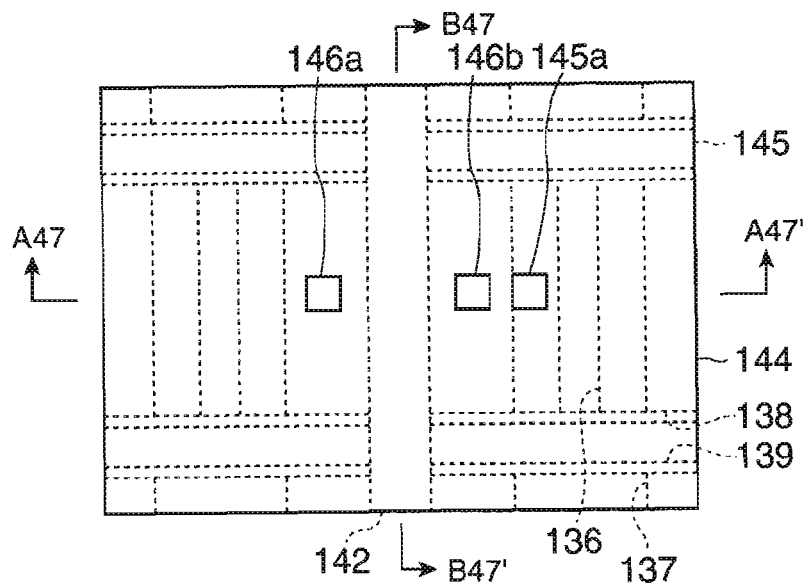
FIGS. 47A through 47C show the method of manufacturing a nonvolatile semiconductor memory device according to the eighth embodiment.
Figure 47B:
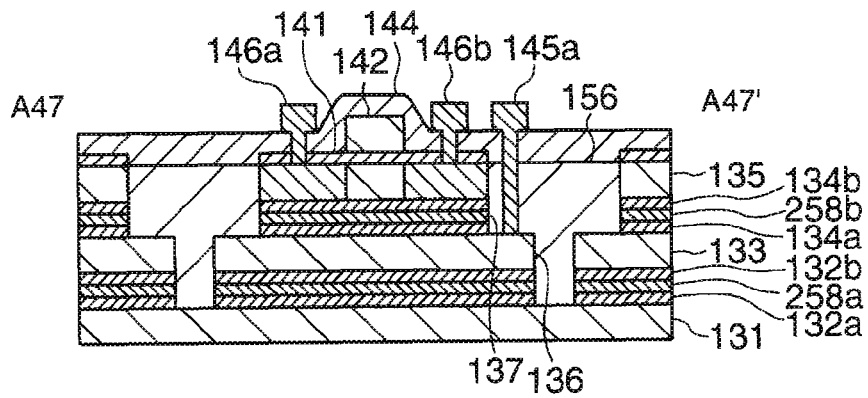
Figure 47C:
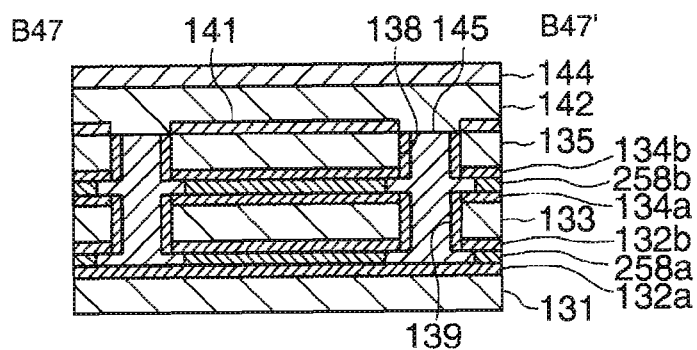

Next, the ion injection IP2 which injects an impurity such as As, P, B and $BF_2$ into the semiconductor layer 135 is performed by using the gate electrode 142 as a mask, and the source layer 143a and the drain layer 143b that are placed so as to interpose the gate electrode 142 therebetween is formed in the semiconductor layer 135 as shown in FIG. 46.

The interlayer insulating layer 144 is then deposited on the gate electrode 142 by a CVD method and the like, as shown in FIG. 47. Subsequently, the control gate contact electrode 145a is formed on the interlayer insulating layer 144. The control gate contact electrode 145a is formed so as to be buried in the interlayer insulating layer 144 and the support member 156 and coupled to the semiconductor layer 133. At the same time, the source contact electrode 146a and the drain contact electrode 146b are formed so as to be buried in the interlayer insulating layer 144 and on the interlayer insulating layer 144. The source contact electrode 146a is coupled to the source layer 143a and the drain contact electrode 146b is coupled to the drain layer 143b.

In this way, it is possible to form the control gate and the SOI transistor on the semiconductor layers 133, 135 without using a SOI substrate. Furthermore, it is possible to control the amount of the electric charge accumulated in the trap film 258b without placing the trap film 258b on the channel region on which the gate electrode 142 is formed. This makes it possible to change the voltage of the gate electrode 142 at the time when the channel region is turned on/off. As a result, it is possible to realize the nonvolatile semiconductor memory device that can perform the electric writing and erasing and in which the threshold voltage of the reading is lowered.

What is claimed is:

1. A nonvolatile semiconductor memory device, comprising:
    a gate electrode provided on a channel region of a semiconductor layer;
    a floating gate or a trap film provided on a back side of the semiconductor layer with a first insulating layer interposed therebetween;
    a control gate provided under the floating gate or the trap film with a second insulating layer interposed therebetween; and
    an electron acceleration layer provided between the control gate and the second insulating layer.

2. The nonvolatile semiconductor memory device according to claim 1, wherein the semiconductor layer is made of a single crystal semiconductor and the floating gate is made of a single crystal semiconductor or a polycrystalline semiconductor.

3. The nonvolatile semiconductor memory device according to claim 1, wherein the control gate is made of a single crystal semiconductor.

4. The nonvolatile semiconductor memory device according to claim 1, wherein the control gate includes an electron injection layer that is made of an N-type impurity diffusion layer formed on a semiconductor substrate.

5. The nonvolatile semiconductor memory device according to claim 1, wherein a word line coupled to the gate electrode is provided so as to extend in parallel with the control gate through more than one memory cell.

6. The nonvolatile semiconductor memory device according to claim 1, further comprising:
    source/drain layers formed in the semiconductor layer so as to sandwich the channel; and
    a bit line coupled to the source/drain layers and provided so as to orthogonally cross a word line that is coupled to the gate electrode.

7. The nonvolatile semiconductor memory device according to claim 1, wherein a driving voltage at the time when information stored in the floating gate is read out is equal to or smaller than 1.5 V.

8. The nonvolatile semiconductor memory device according to claim 1,
    the semiconductor layer including the channel region, a source region, and a drain region,
    the floating gate or the trap film entirely covering a back side of the channel region, the source region, and the drain region.

9. A nonvolatile semiconductor memory device, comprising:
    a gate electrode provided on a channel region of a semiconductor layer;
    a floating gate or a trap film provided on a back side of the semiconductor layer with a first insulating layer interposed therebetween; and
    a control gate provided under the floating gate or the trap film with a second insulating layer therebetween,
    the semiconductor layer including the channel region, a source region, and a drain region,
    the floating gate or the trap film entirely covering a back side of the channel region, the source region, and the drain region.

* * * * *